United States Patent
Kodera et al.

[11] Patent Number: 5,948,205
[45] Date of Patent: Sep. 7, 1999

[54] POLISHING APPARATUS AND METHOD FOR PLANARIZING LAYER ON A SEMICONDUCTOR WAFER

[75] Inventors: Masako Kodera, Kawasaki, Japan; Hiroyuki Yano, Wappingers Falls, N.Y.; Atsushi Shigeta, Yamato, Japan; Riichirou Aoki, Tokyo, Japan; Hiromi Yajima, Yokohama, Japan; Haruo Okano, Tokyo, Japan

[73] Assignee: Kabushiki Kaisha Toshiba, Kawasaki, Japan

[21] Appl. No.: 08/897,570

[22] Filed: Jul. 21, 1997

Related U.S. Application Data

[63] Continuation of application No. 08/402,879, Mar. 13, 1995, abandoned, which is a continuation of application No. 08/066,375, May 25, 1993, Pat. No. 5,445,996.

[30] Foreign Application Priority Data

| Sep. 25, 1992 | [JP] | Japan | 4-256889 |
| Oct. 20, 1992 | [JP] | Japan | 4-281194 |
| Nov. 30, 1992 | [JP] | Japan | 4-319175 |
| Dec. 11, 1992 | [JP] | Japan | 4-331945 |
| May 26, 1993 | [JP] | Japan | 4-132978 |

[51] Int. Cl.$^6$ ............................................. B24B 49/00
[52] U.S. Cl. ............................................ 156/345; 451/287
[58] Field of Search ............................. 216/88, 89, 84, 216/85, 86; 438/692, 693; 156/345; 451/287, 285

[56] References Cited

U.S. PATENT DOCUMENTS

| 3,715,842 | 2/1973 | Tredinnick et al. . |
| 4,545,153 | 10/1985 | Miller et al. ............................... 451/11 |
| 4,671,851 | 6/1987 | Beyer et al. . |
| 4,711,587 | 12/1987 | Cocito . |
| 4,735,679 | 4/1988 | Laske . |
| 4,879,258 | 11/1989 | Fisher . |
| 4,910,155 | 3/1990 | Cote et al. . |
| 4,940,507 | 7/1990 | Harbarger et al. . |
| 4,962,616 | 10/1990 | Wittstock . |
| 5,036,015 | 7/1991 | Sandhu et al. ......................... 156/626.1 |
| 5,054,244 | 10/1991 | Takamatsu et al. ................... 451/11 X |
| 5,064,683 | 11/1991 | Poon et al. . |
| 5,069,002 | 12/1991 | Sandhu et al. ......................... 156/626.1 |
| 5,078,801 | 1/1992 | Malik . |
| 5,084,071 | 1/1992 | Nenadic et al. . |
| 5,104,828 | 4/1992 | Morimoto et al. . |
| 5,110,428 | 5/1992 | Prigge et al. . |
| 5,154,021 | 10/1992 | Bombardier et al. .................... 451/444 |
| 5,166,096 | 11/1992 | Cote et al. . |
| 5,196,353 | 3/1993 | Sandhu et al. .................... 156/636.1 X |
| 5,213,655 | 5/1993 | Leach et al. ........................... 216/84 X |
| 5,236,861 | 8/1993 | Otsu . |
| 5,246,884 | 9/1993 | Jaso et al. . |
| 5,262,346 | 11/1993 | Bindal et al. . |
| 5,272,117 | 12/1993 | Roth et al. . |
| 5,308,438 | 5/1994 | Cote et al. ................................ 216/86 |
| 5,320,706 | 6/1994 | Blackwell ............................. 156/636.1 |
| 5,421,769 | 6/1995 | Schultz et al. . |
| 5,445,996 | 8/1995 | Kodera et al. . |
| 5,499,733 | 3/1996 | Litvak .................................... 216/88 X |

FOREIGN PATENT DOCUMENTS

| 0 272 531 | 6/1988 | European Pat. Off. . |
| 0 403 287 | 12/1990 | European Pat. Off. . |
| 0 540 444 | 5/1993 | European Pat. Off. . |
| 63-266830 | 1/1992 | Japan . |

*Primary Examiner*—Thi Dang
*Attorney, Agent, or Firm*—Finnegan, Henderson, Farabow, Garrett & Dunner, L.L.P.

[57] ABSTRACT

To planarize an insulating film formed on a semiconductor substrate, a polishing slurry containing cerium oxide is used to polish the surface of the insulating film. Using the cerium oxide included slurry as a polishing agent, the insulating film is not contaminated by alkali metals during the polishing process. Furthermore, the insulating film is polished at an enhanced polishing rate.

17 Claims, 41 Drawing Sheets

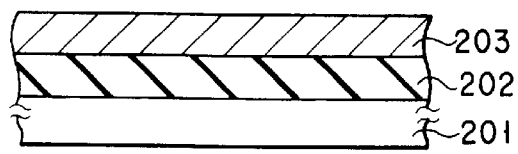
F I G. 19A
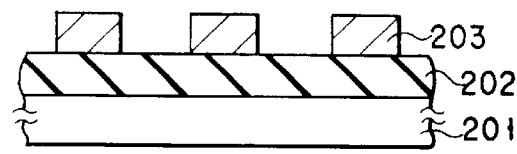
F I G. 19D
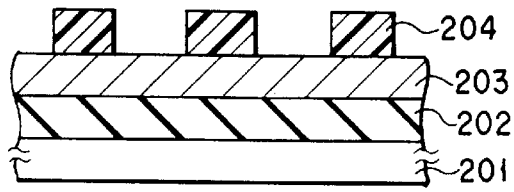
F I G. 19B
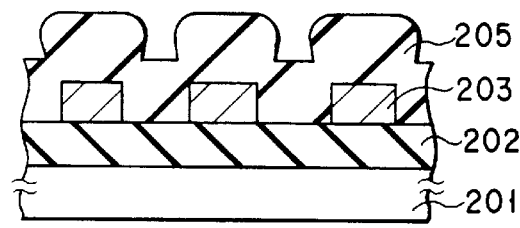
F I G. 19E
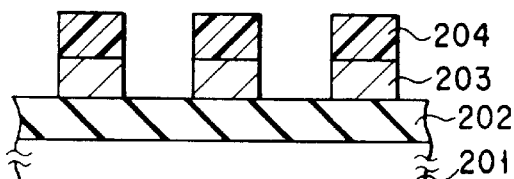
F I G. 19C
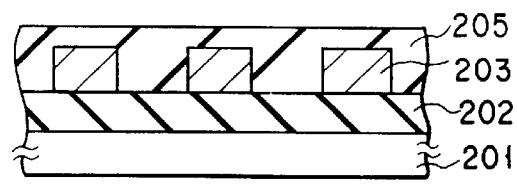
F I G. 19F

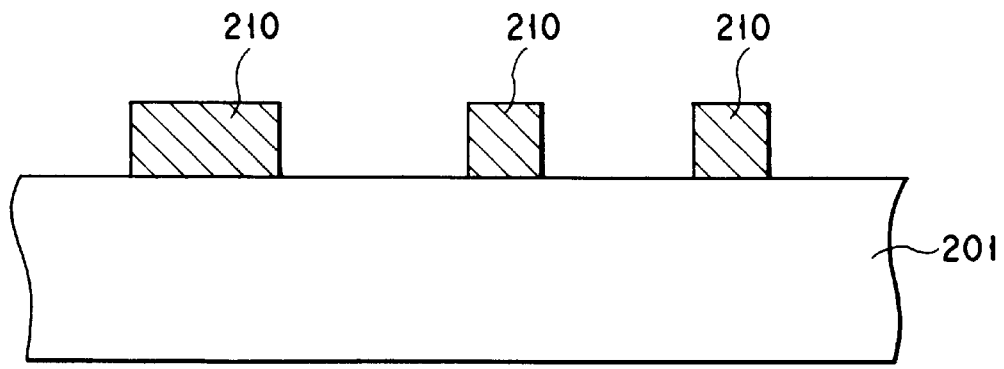
F I G. 20A
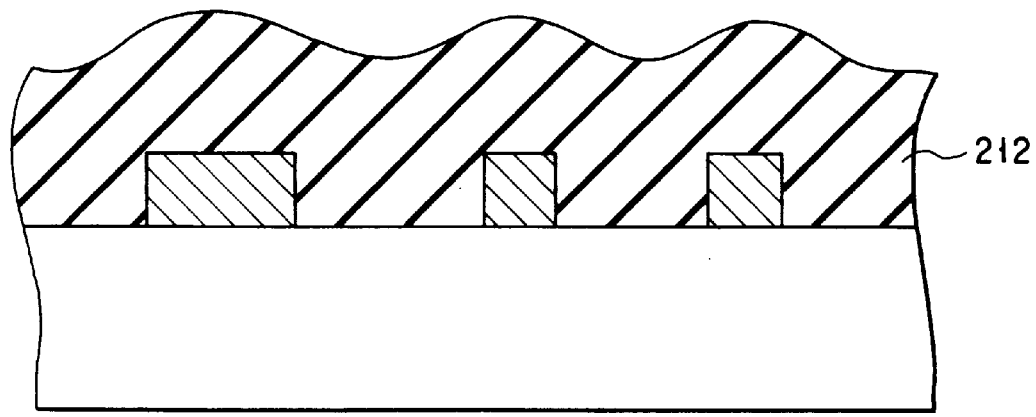
F I G. 20B
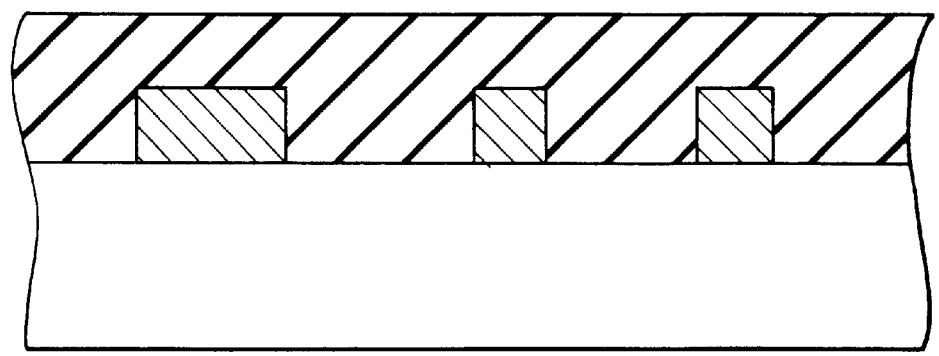
F I G. 20C

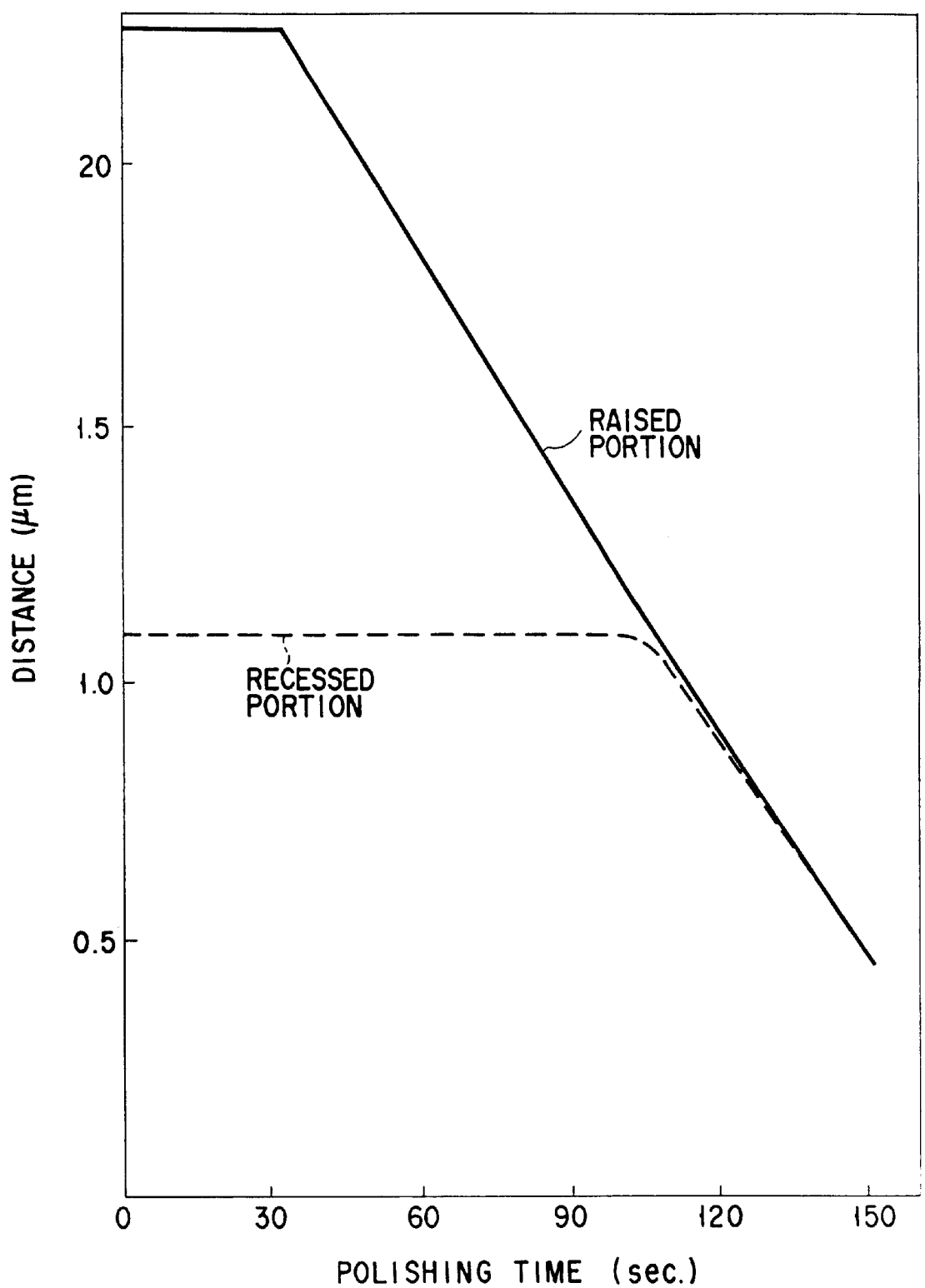
F I G. 22

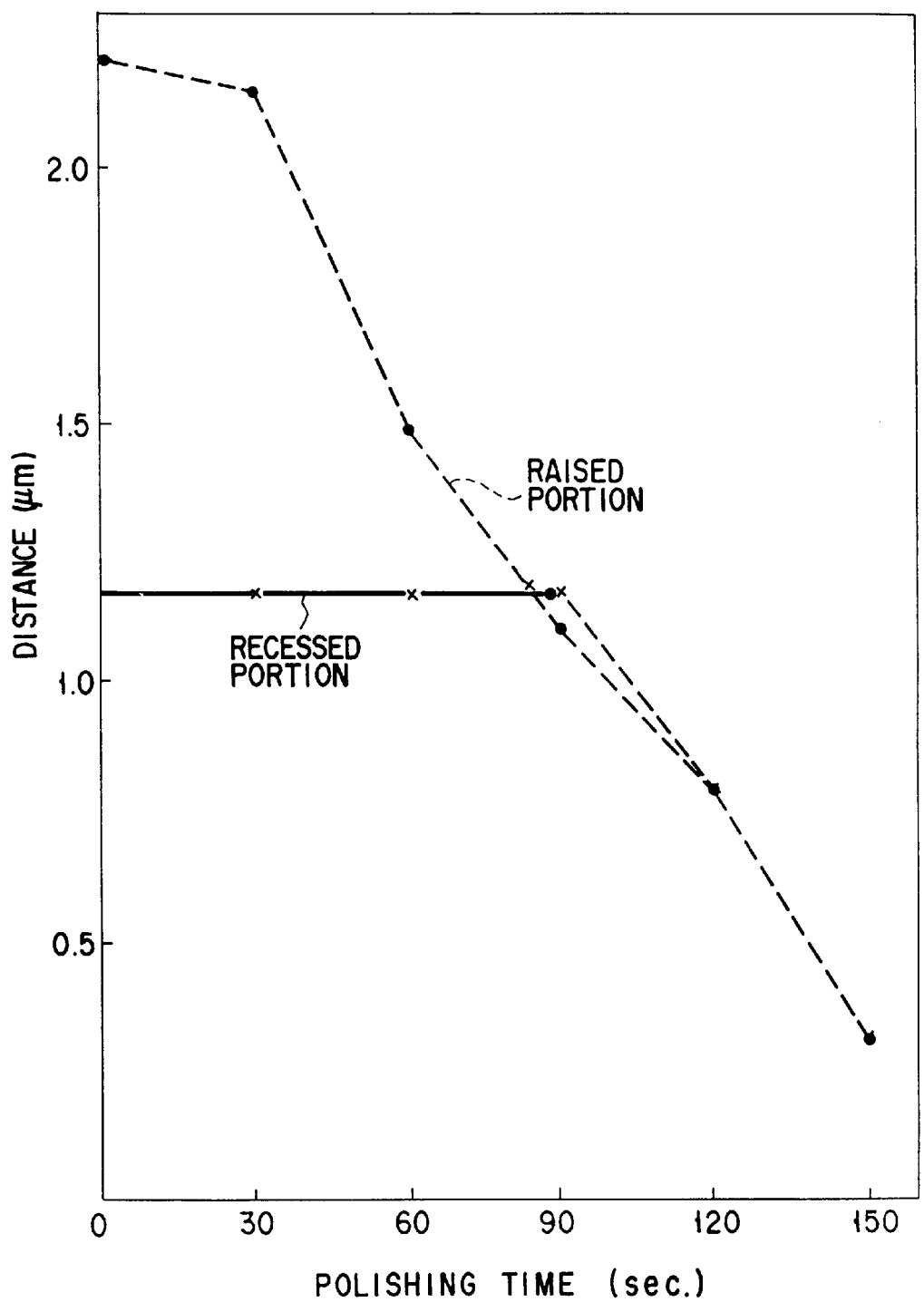
F I G. 24

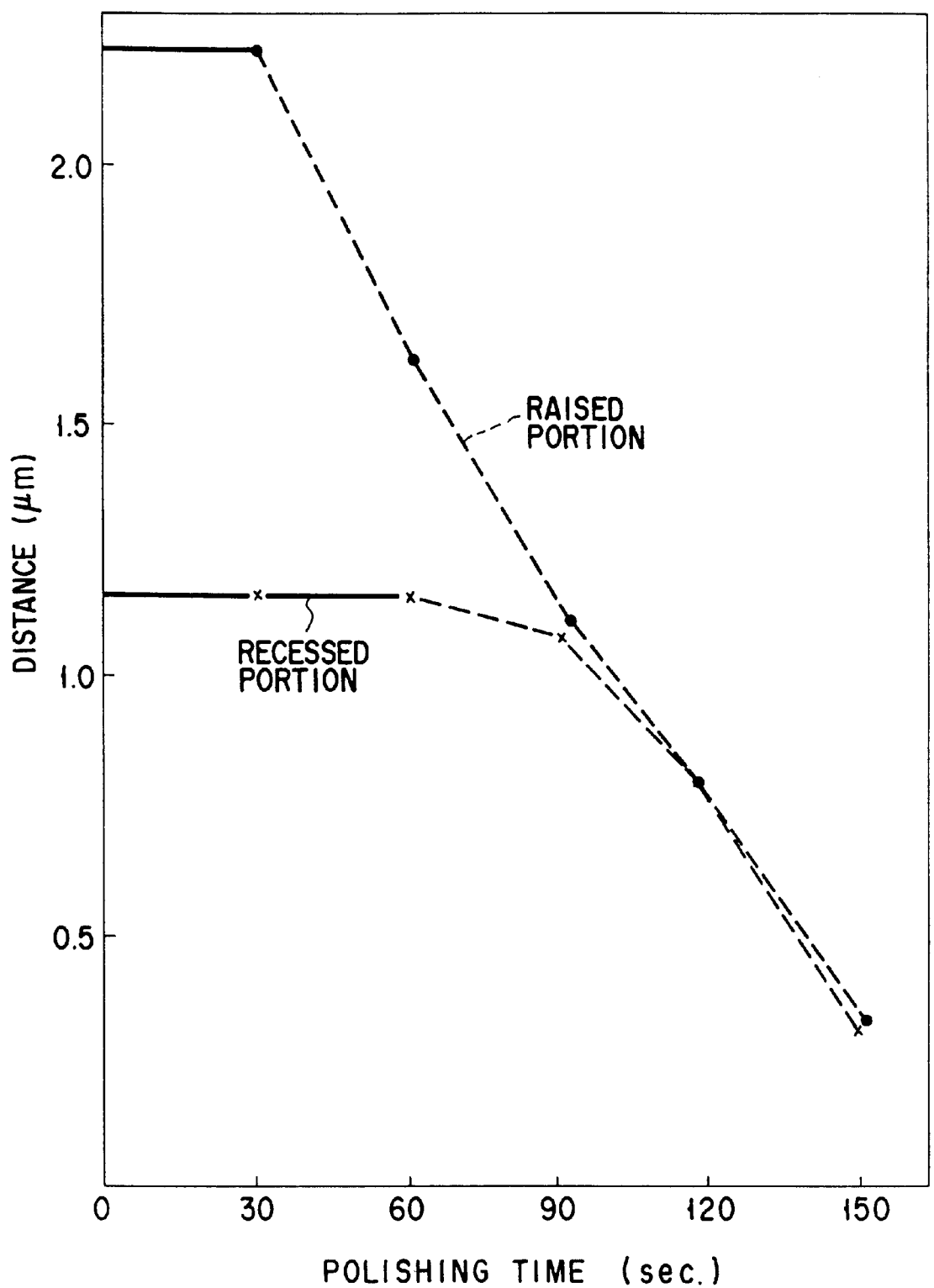
F I G. 25

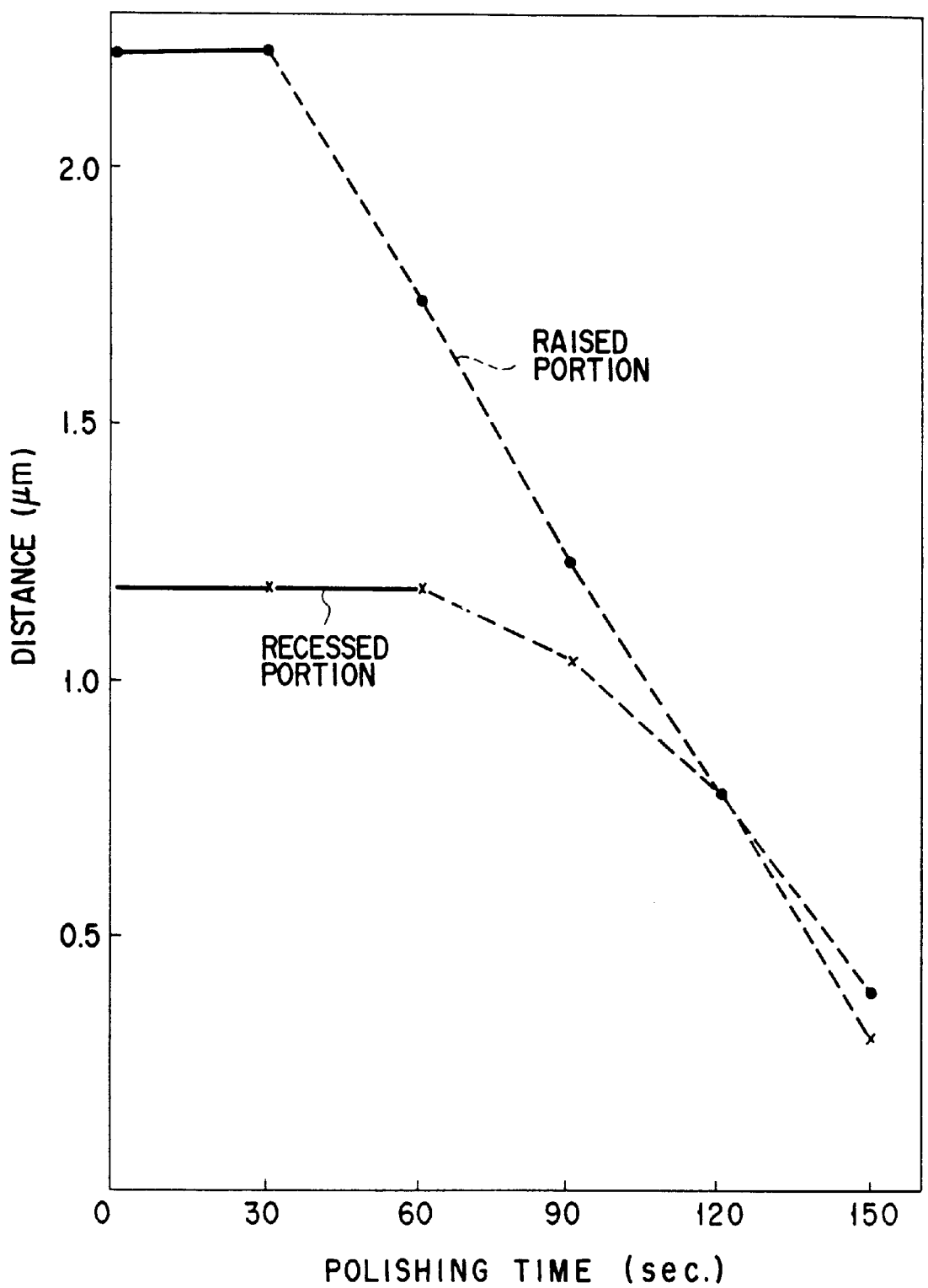
F I G. 26

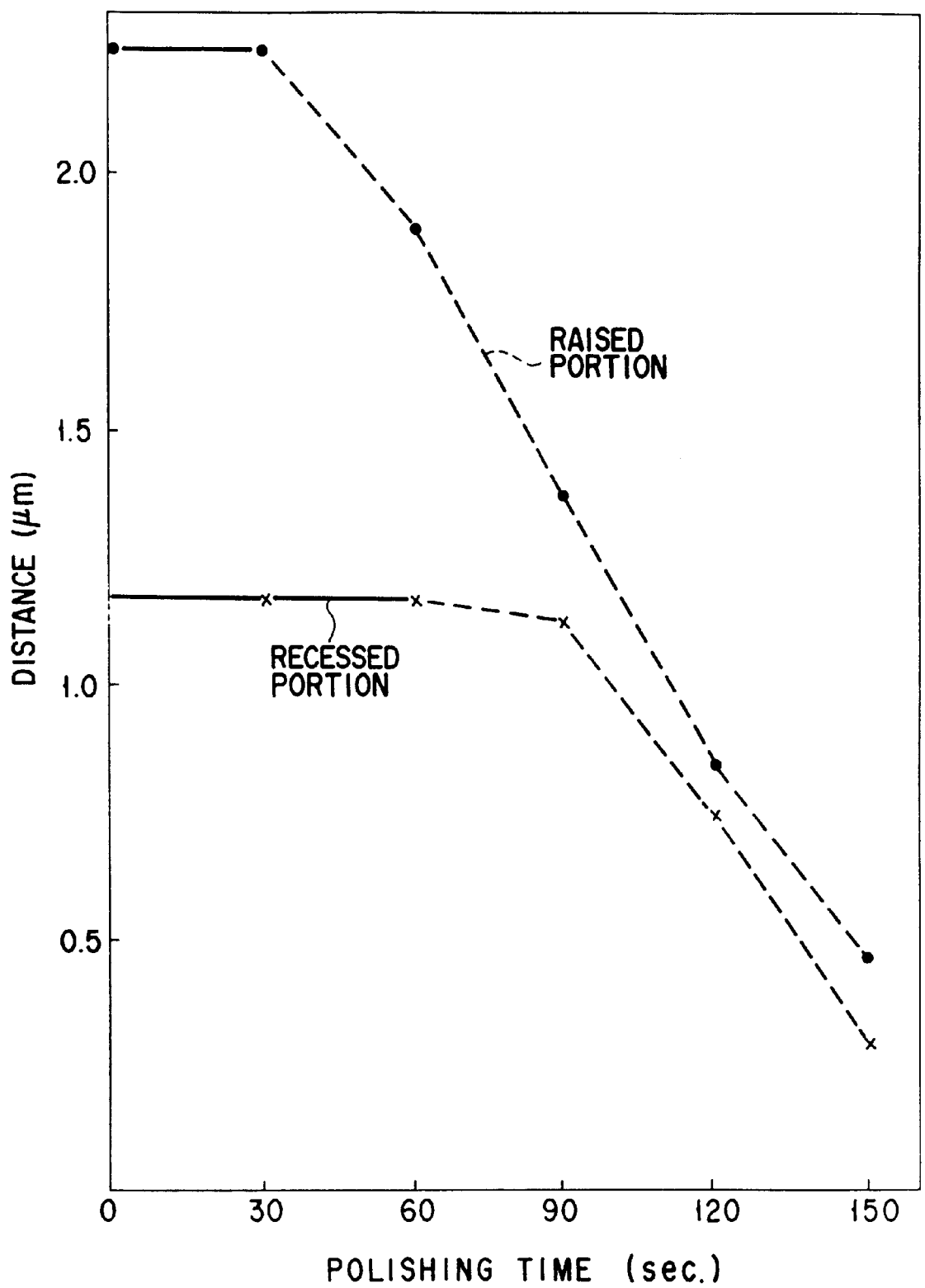
F I G. 27

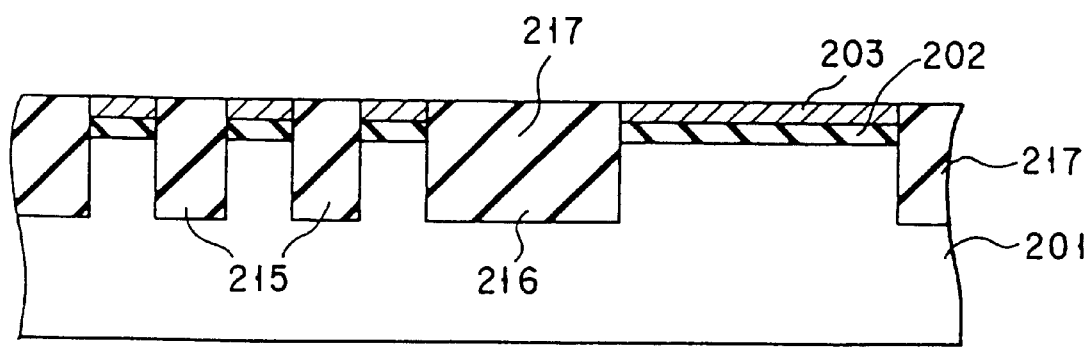
F I G. 28

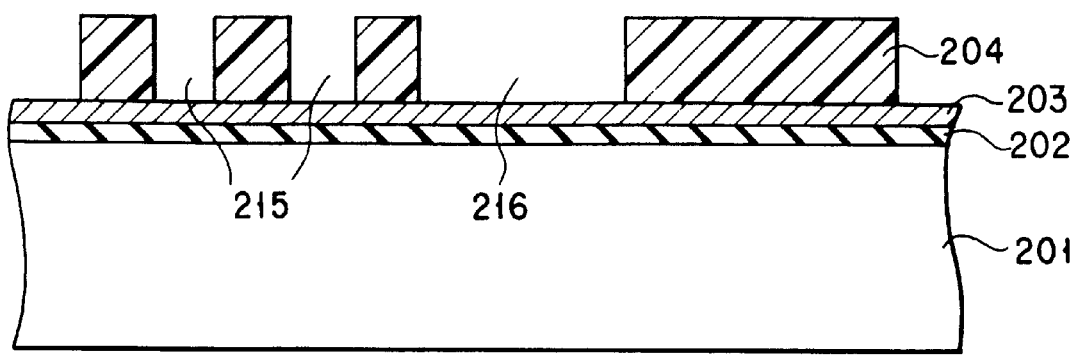
F I G. 29A
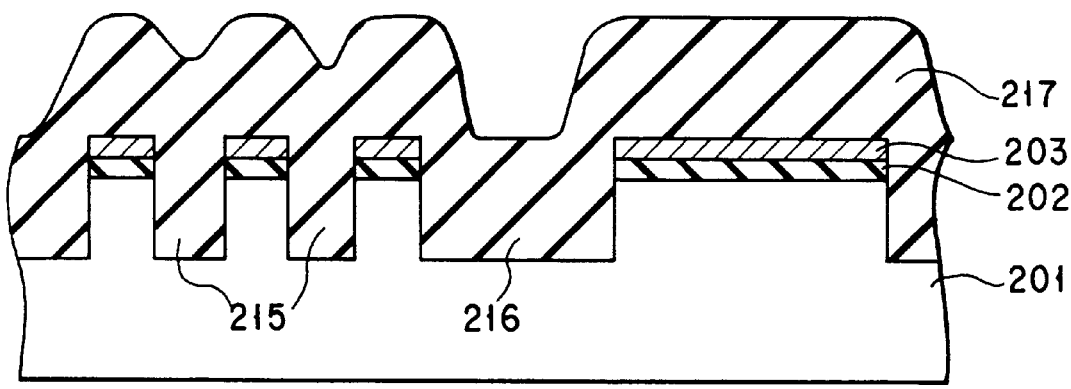
F I G. 29B
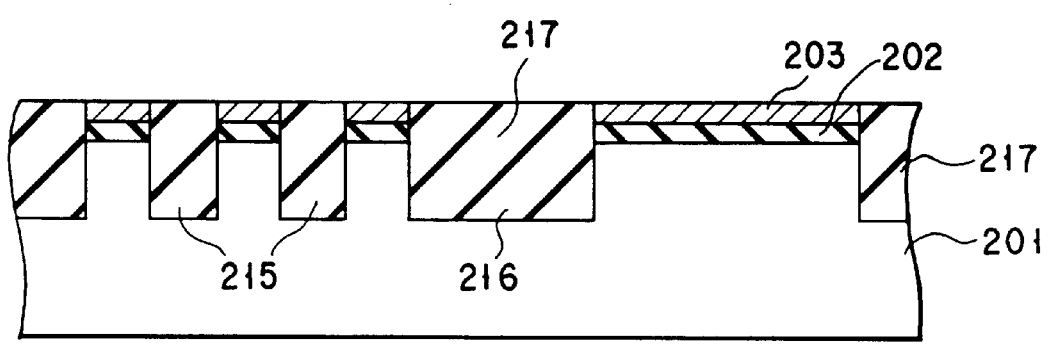
F I G. 29C

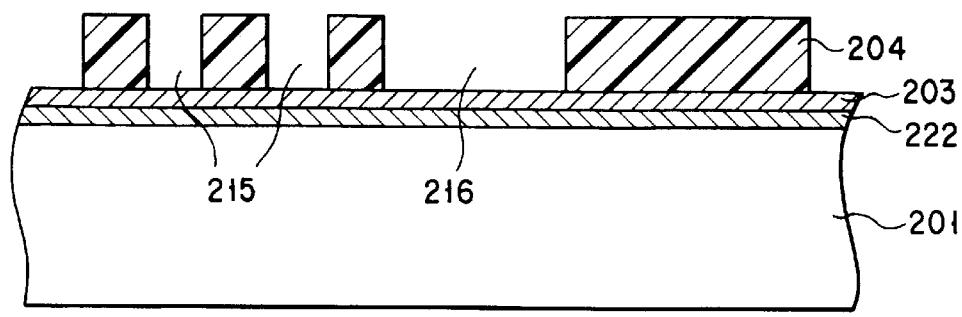
F I G. 30 A
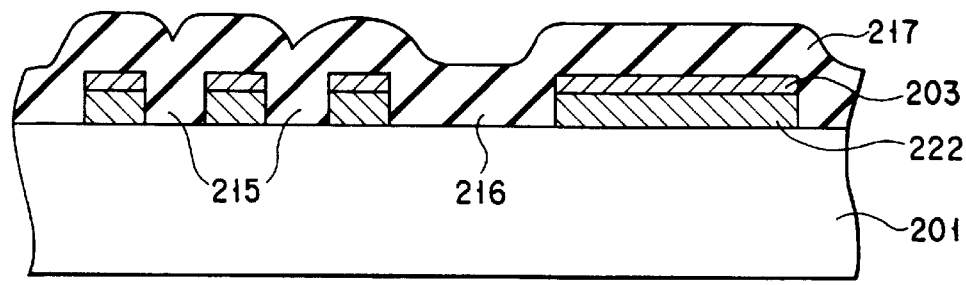
F I G. 30 B
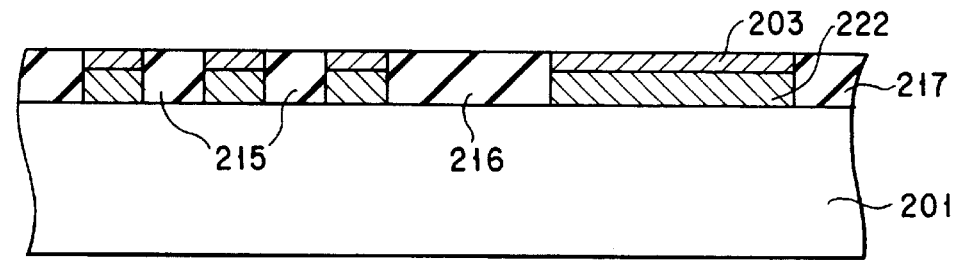
F I G. 30 C
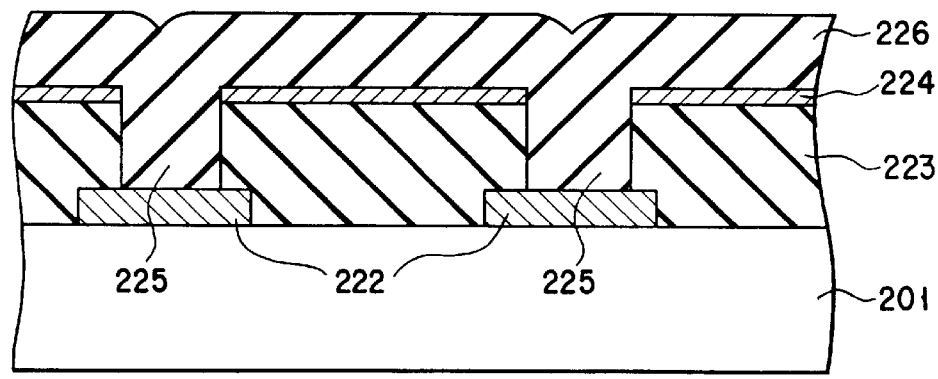
F I G. 31 A

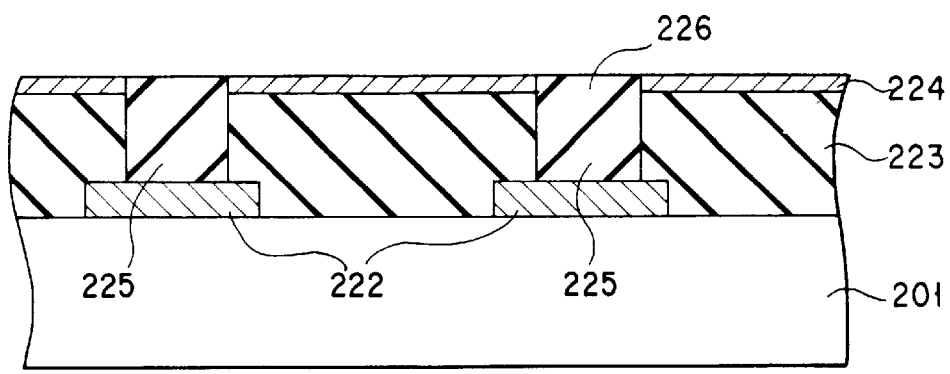
F I G. 31B
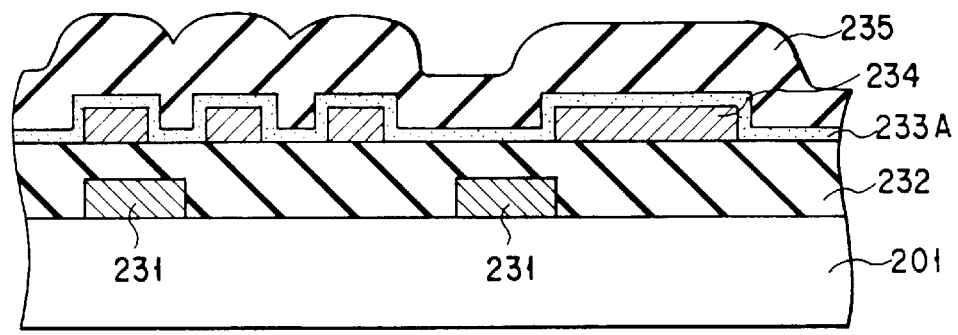
F I G. 32A
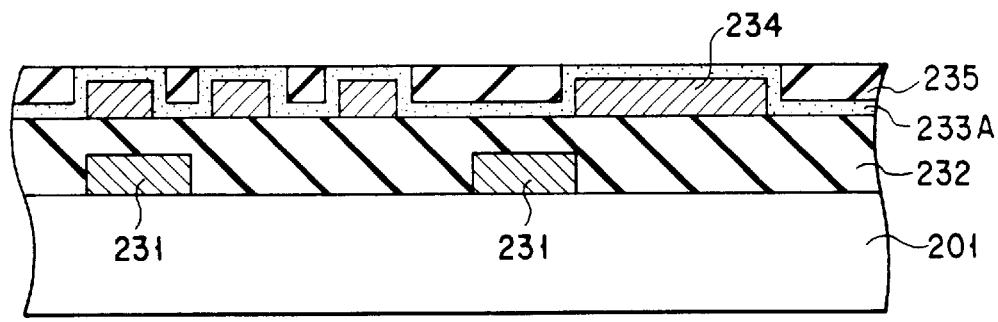
F I G. 32B
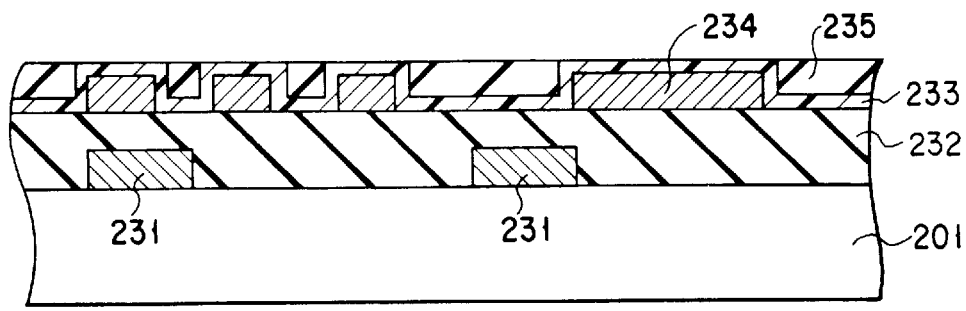
F I G. 32C

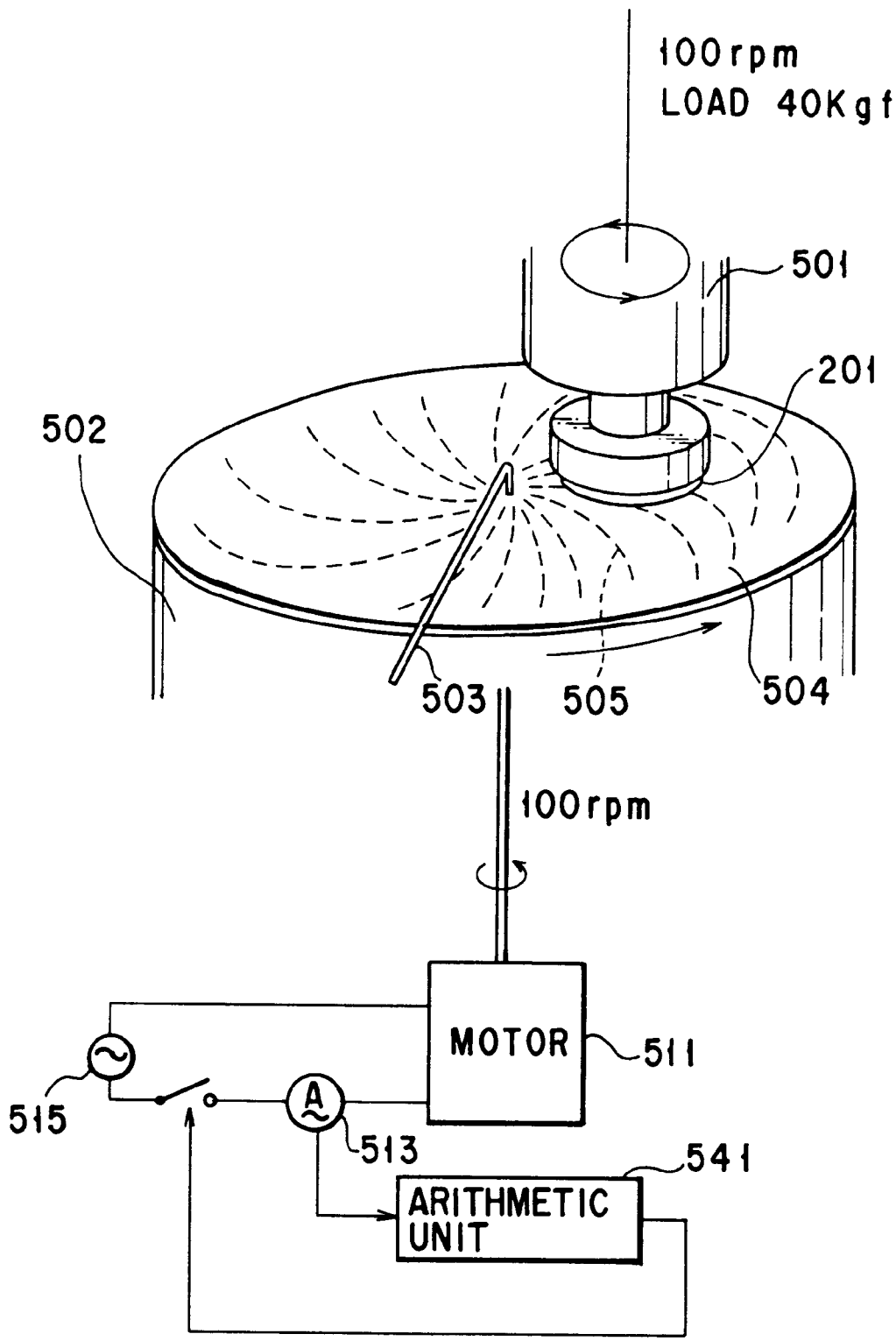
F I G. 35

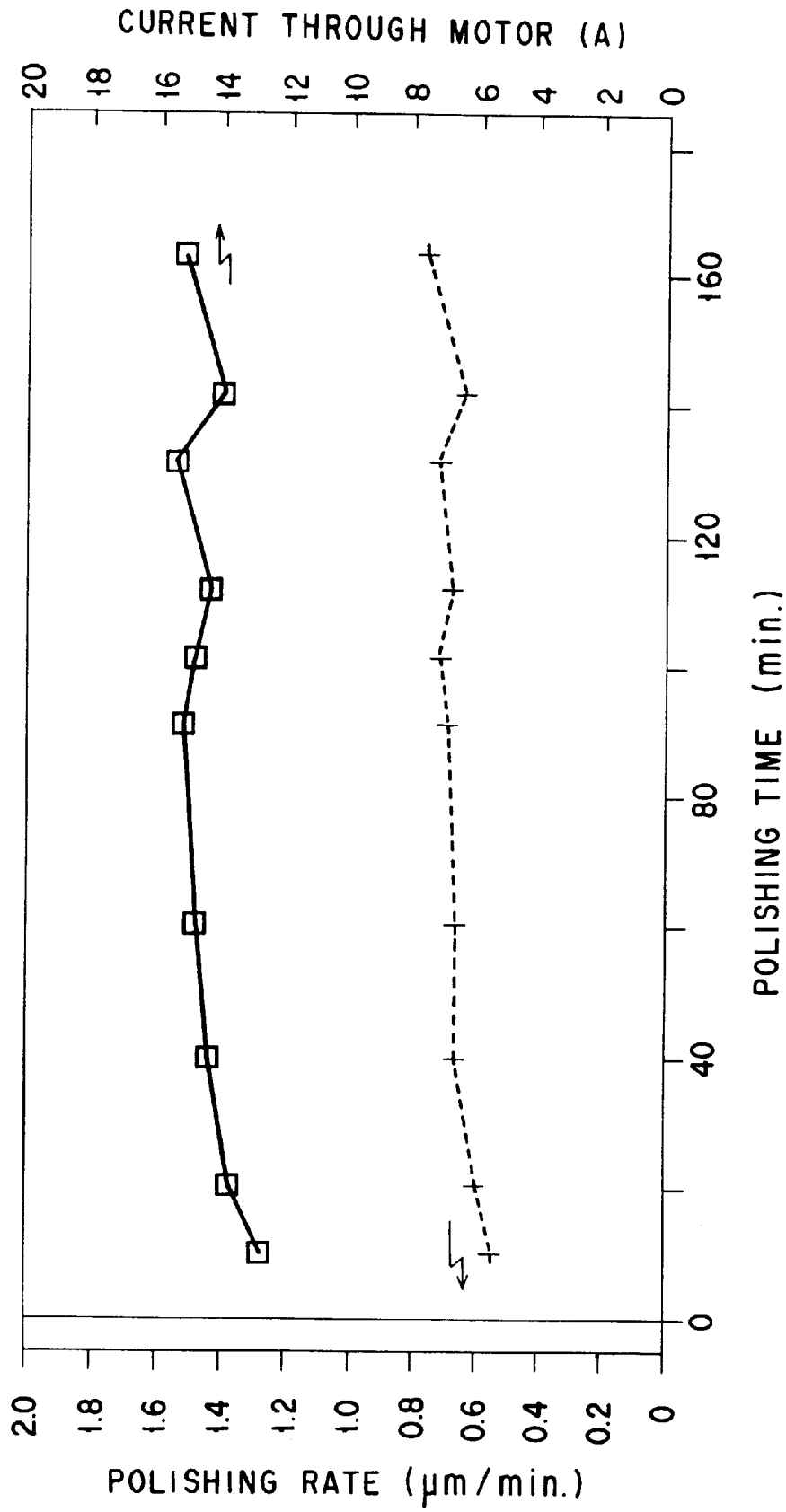
F I G. 36

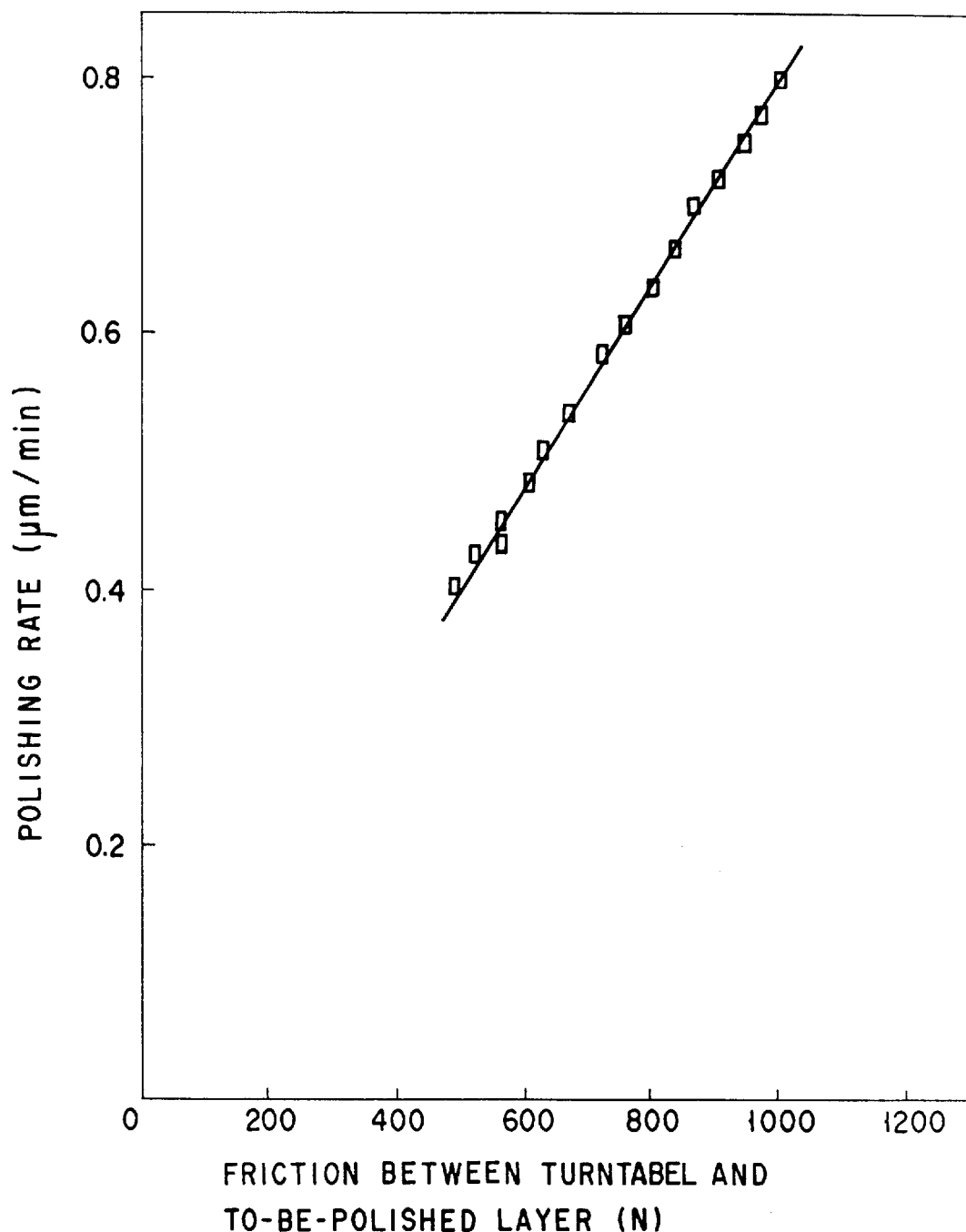
F I G. 38

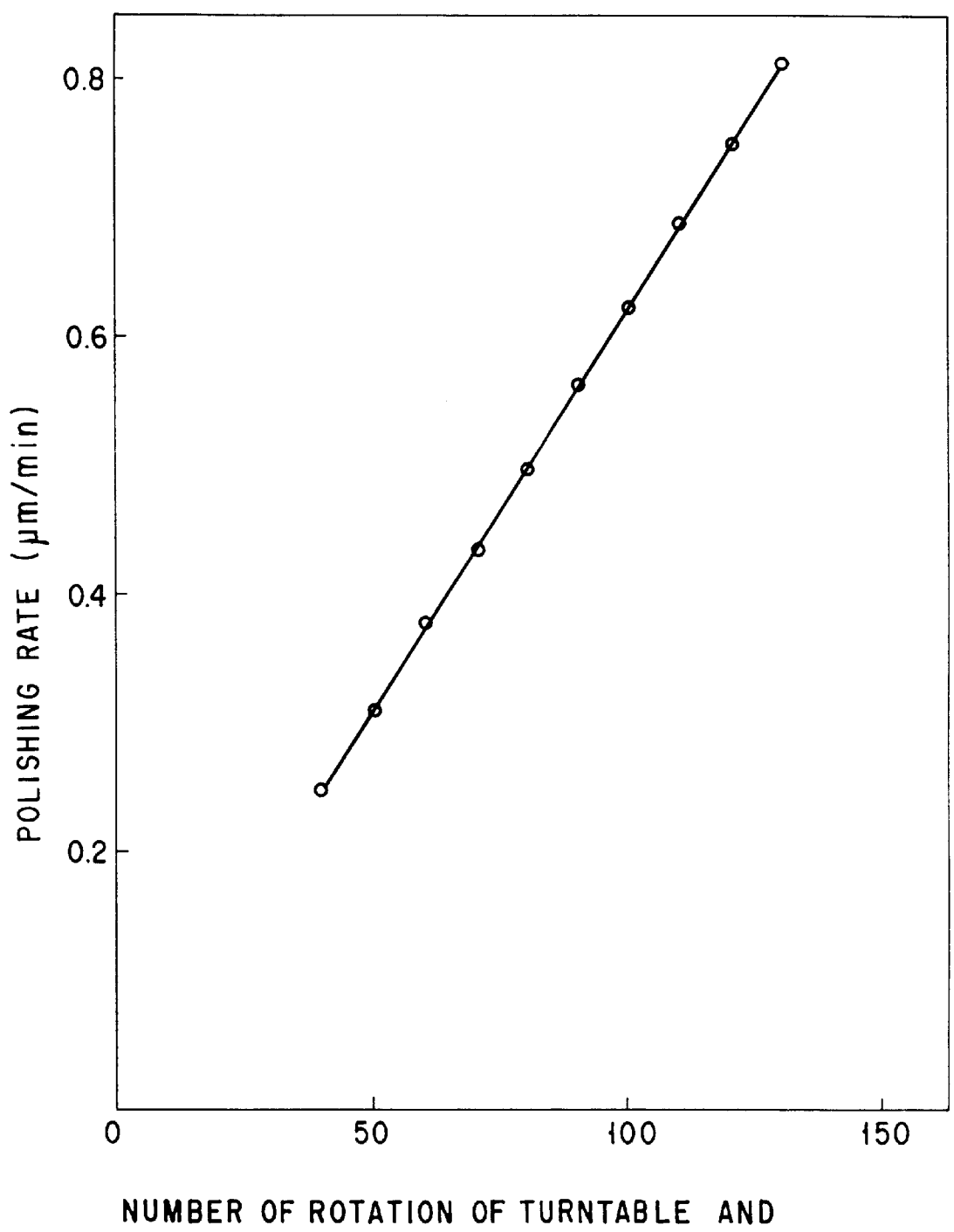
F I G. 39

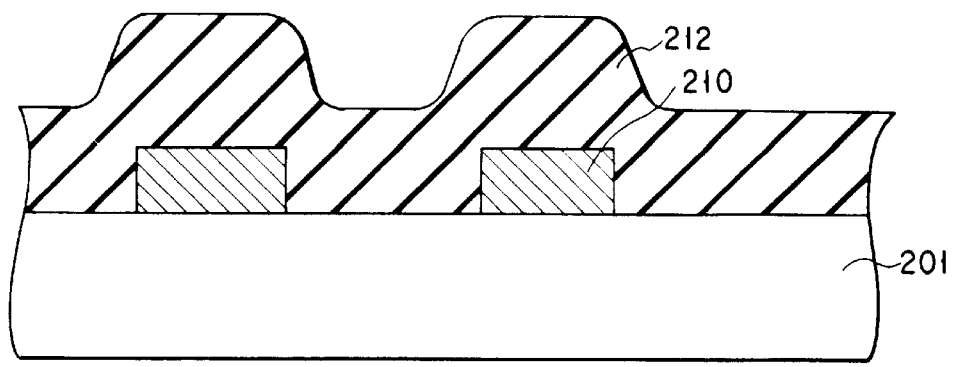
F I G. 42
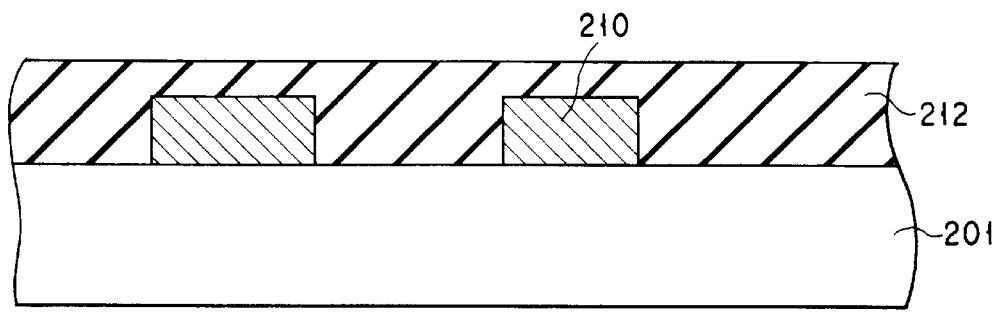
F I G. 43
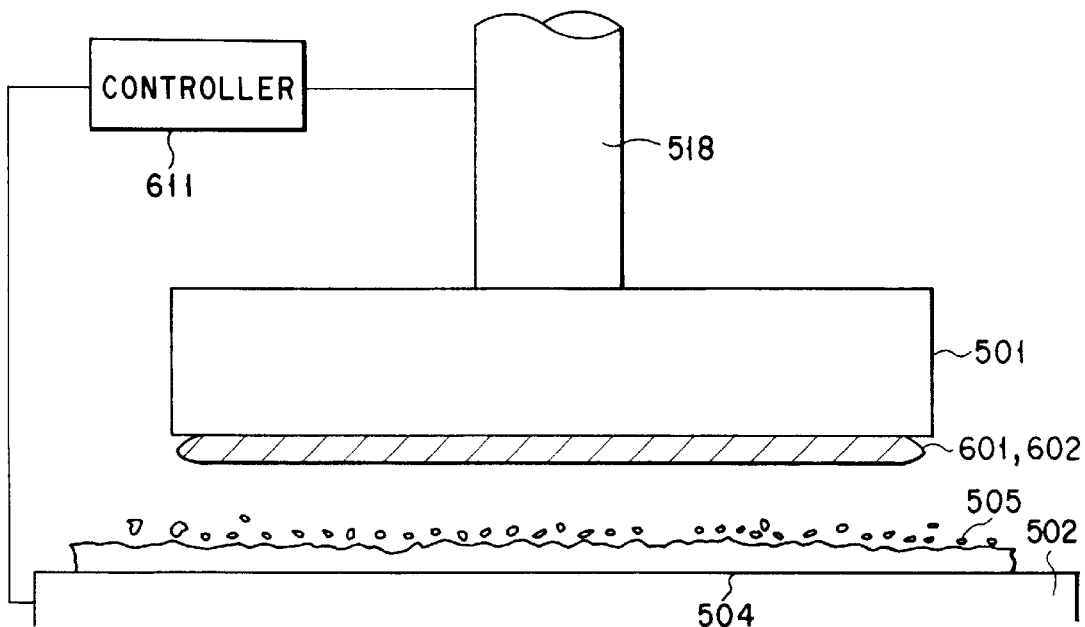
F I G. 44

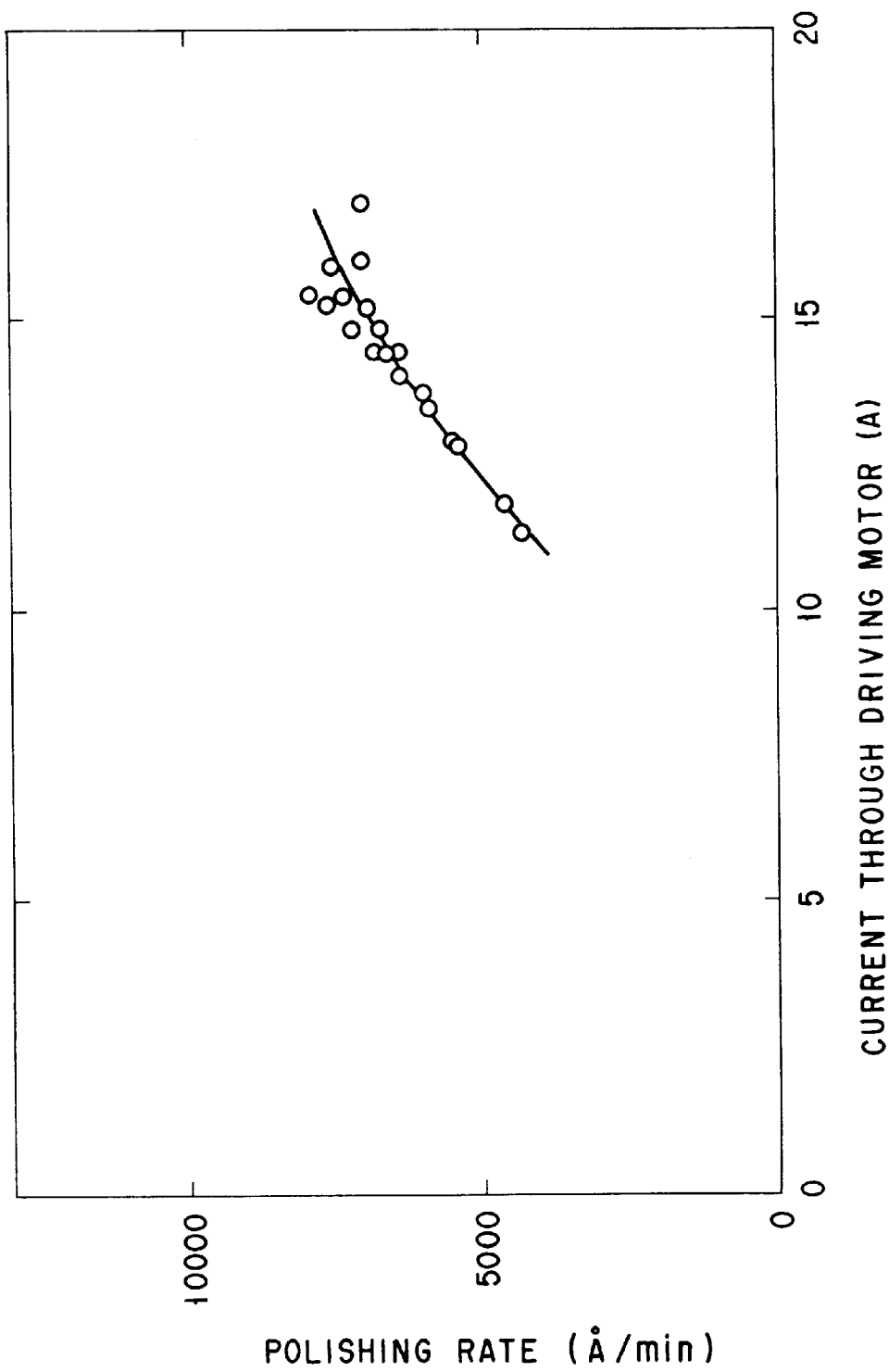
F I G. 46

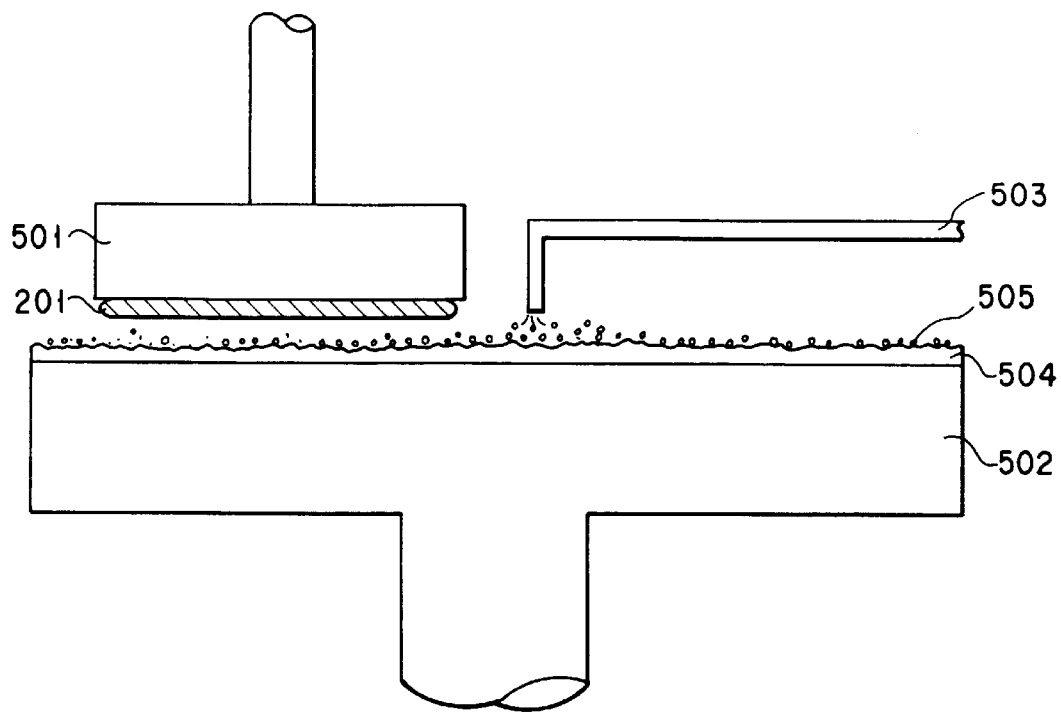
F I G. 49
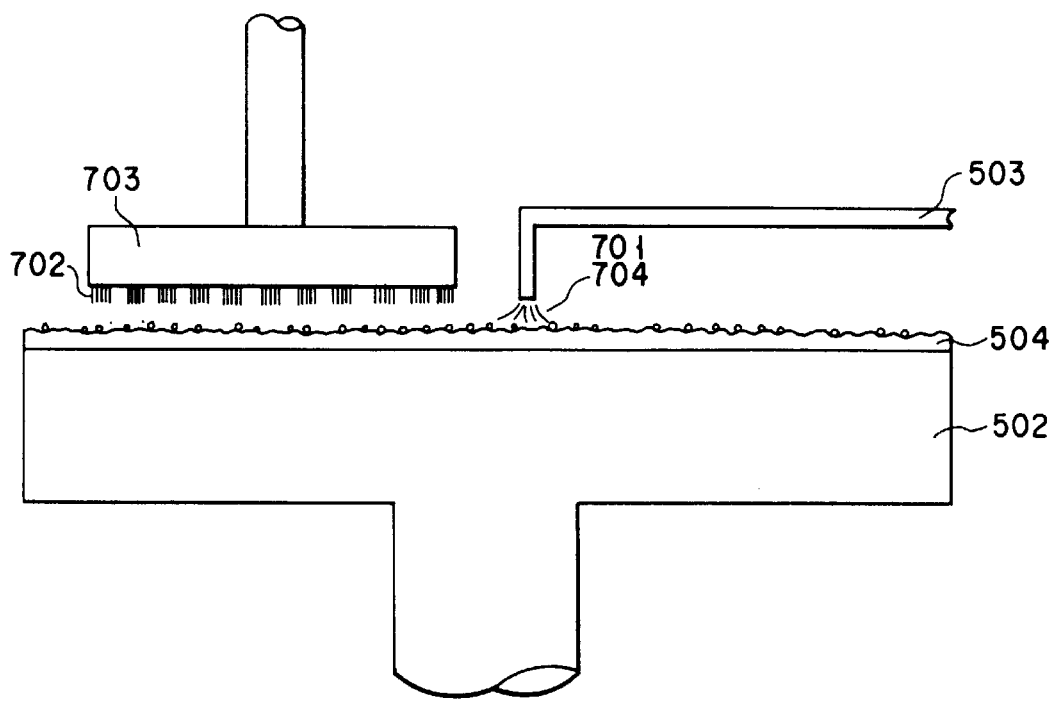
F I G. 50

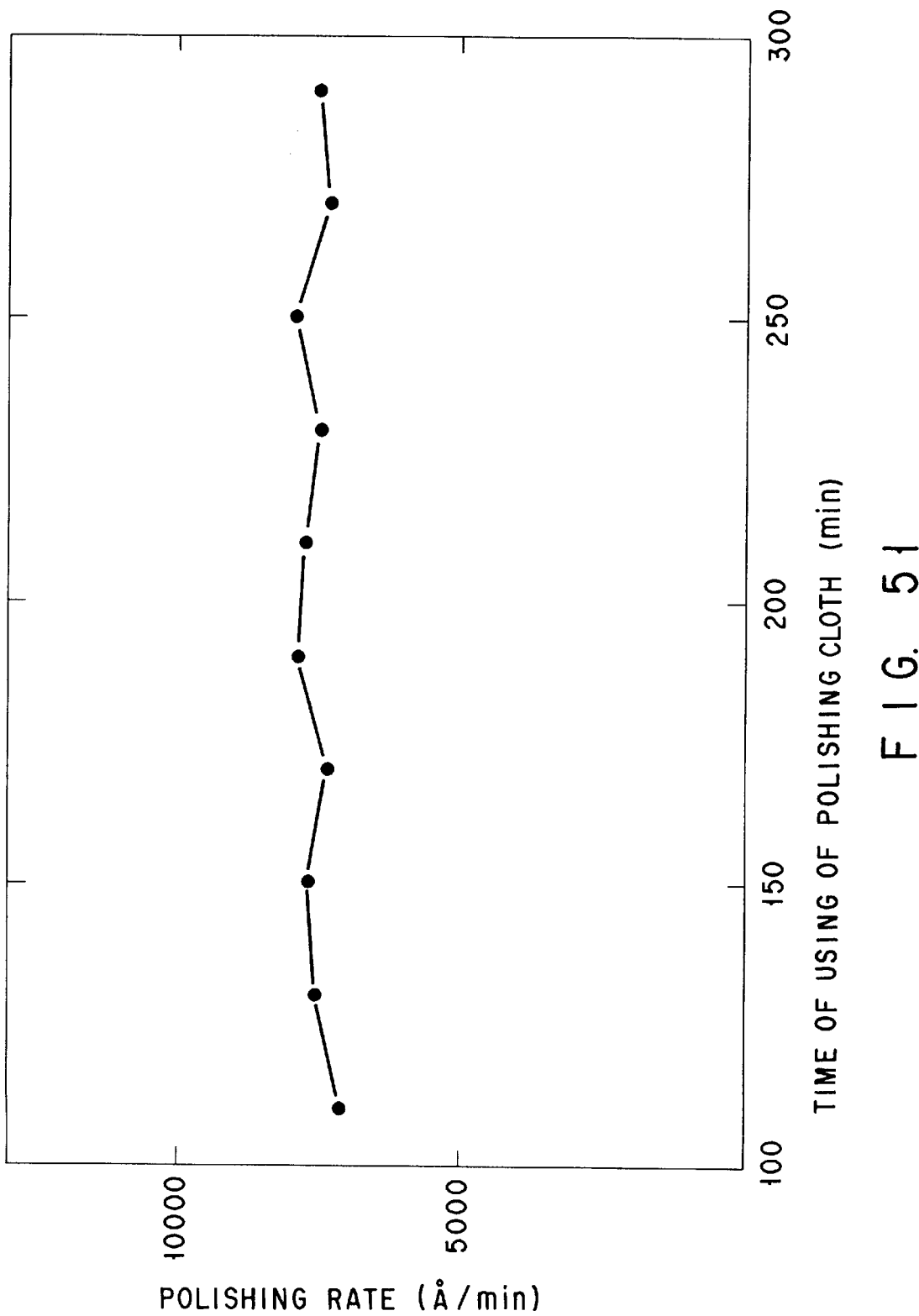
F I G. 51

POLISHING APPARATUS AND METHOD FOR PLANARIZING LAYER ON A SEMICONDUCTOR WAFER

This application is a continuation of application Ser. No. 08/402,879 filed Mar. 13, 1995, now abandoned; which was a continuation of application Ser. No. 08/066,375 filed May 25, 1993, now U.S. Pat. No. 5,445,996, issued Aug. 29, 1995.

BACKGROUND OF THE INVENTION

1. Field of the Invention

This invention relates to a polishing apparatus and a method for planarizing a layer on a semiconductor wafer.

2. Description of the Related Art

Conventionally, colloidal silica is popularly used as a polishing slurry for polishing and planarizing the surface of insulating films or the like in the process of manufacturing semiconductor devices.

There are used colloidal silica granules of a diameter as large as tens of several nanometers. The granules are normally obtained by growing sodium silicate in water. Obtained granulous silica is then mixed with water to form a suspension or colloidal silica, to which KOH or NaOH is added to regulate the hydrogen ion concentration of the suspension and at the same time achieve an enhanced polishing efficiency for the slurry.

Compol-80 marketed by Fujimi Corporation is one of commercially available polishing slurries of the above described type containing an alkali metal. When a silicon oxide film is polished or scraped by using the slurry, the alkali metal contained in the slurry is at least partly dispersed into the silicon oxide film or the semiconductor device. When the device is a MOS device, the dispersed metal fluctuates the threshold voltage level of the device to significantly reduce the reliability of the semiconductor device.

In order to avoid this problem, some preventive measures need to be taken such as additionally forming a protective film layer under the silicon oxide film to block dispersion of alkali metal, making the overall process of manufacturing semiconductor devices rather cumbersome and complicated.

Now, how a prior art semiconductor device is produced will be briefly described by referring to illustrations showing its sectional views in various stages of preparation. FIG. 1A of the accompanying drawings illustrates a conventional semiconductor device comprising a semiconductor substrate 1 and electrode or wire patterns designated by reference numeral 2. To protect the patterns, a protective film 3 is firstly formed on the entire surface area of the semiconductor structure, and subsequently a resist 4 is applied onto the film 3 and then the resist 4 is subjected to a patterning operation by using a lithographic technique, as illustrated in FIG. 1B. Thereafter, the protective film 3 is selectively removed as the resist 4 is used as masks. Thereafter, the resist 4 is removed to produce a patterned protective film as shown in FIG. 1C. Thereafter, as illustrated in FIG. 1D, a silicon oxide film 5 is formed on the semiconductor structure, and then its surface is planarized using a polishing method to produce a planar surface, as shown in FIG. 1E. However, the above conventional method additionally requires the steps of FIGS. 1A through 1C, thus complicating the entire manufacturing process.

There is also used another polishing slurry of the colloidal silica series containing no alkali metal. The slurry is obtained by performing pyrolysis of silicic acid tetrachloride or hydrolysis of organic silane to grow silica particles, and regulating the hydrogen ion concentration of the produced silica by means of ammonia or an amine. This type of polishing slurry is, however, accompanied by a problem of an unpractically low polishing speed if used for silicon oxide films.

On the other hand, a well known method of polishing the surface of glass photo-masks comprises steps of primary polishing using a suspension of aluminum oxide and finish polishing using another suspension containing cerium oxide particles having an average particle size of several micrometers. However, such a two-step polishing operation involved in the process of manufacturing semiconductor devices is not recommendable by any means, considering the fact that an insulating film needs to be polished to reduce its thickness by only several micrometers. Furthermore, in the process of manufacturing semiconductor devices, an insulating film layer is often formed on the surface of a semiconductor substrate that carries raised portions (conductive layers) having a height of several hundreds to thousands nanometers. Such differences in height of the surface of a semiconductor device will be clearly reflected onto the profile of the insulating film formed thereon. The step configuration of the surface of the insulating film need to be planarized by polishing. However, it has not at all been known for sure if cerium oxide particles having an average size of several micrometers can successfully polish and planarize the surface that has a configuration of different heights of several hundreds to thousands nanometers and if the insulating film will be contaminated by the alkali metal as in the case where colloidal silica is used. All in all, the above described method of polishing the surface of a glass layer operating as a photo-mask has been developed without taking into consideration if it can be applied to the operation of polishing semiconductor devices during the manufacturing process.

The above conventional methods of polishing semiconductor devices, using colloidal silica or the like as a polishing slurry, are accompanied by the problem of contamination by alkali metal and that of a slow polishing rate.

While a method of using a suspension that does not contain cerium oxide particles is also known in the technology of polishing the surface of glass photo-masks, it is not certain at all if such a method can polish and planarize a surface having a profile of steps of several hundreds to thousands nanometers high and if it is not accompanied by a problem of metal contamination. Again, it is a method that has been developed without taking into consideration if it can be applied to the operation of polishing semiconductor devices during the manufacturing process.

Now, a typical known polishing and planarizing technique of the category under consideration will be described by referring to FIGS. 2A through 2C of the accompanying drawings. As illustrated in FIG. 2A, a semiconductor device is prepared by forming an $SiO_2$ film 12 on an Si semiconductor device 1 and then a metal wires 13 having a thickness of 1.1 $\mu$m are appropriately formed on the $SiO_2$ film 12 to produce a given pattern of metal wires.

Thereafter, another $SiO_2$ film 14 is formed on the entire surface of the above intermediate product. Consequently, the surface of the second $SiO_2$ layer shows raised portions and recessed portions, reflecting the pattern of metal wires. Then, the surface of the second $SiO_2$ layer 14 is polished to remove the raised and recessed portions. The operation of polishing or scraping the surface of the second $SiO_2$ layer 14 will be carried out by using a polishing apparatus as illustrated in FIG. 3.

More specifically, an Si substrate 1 having a configuration as described above is set in position on the turntable the apparatus under a holder 501. A polishing slurry feed pipe 503 is disposed above the turntable 502 to feed a polishing slurry onto the truntable during the operation of polishing the substrate. A polishing cloth 504 is disposed between the surface to be polished of the Si substrate 1 and the turntable 502 so that the raised and recessed portions on the surface of the semiconductor substrate are removed by particles of the polishing slurry and the polishing cloth 504 to provide a planarized surface of the semiconductor substrate.

The holder 501 is subjected to a load of 40 kfg and rotated at a rate of 100 rpm. The turntable is rotated at the same rotation speed.

While the above described polishing method using a polishing apparatus can significantly reduce the raised portions on the surface of the second $SiO_2$ film 14, it also dishes the portions of the second $SiO_2$ film 14 that are located between adjacent metal wires 13. This is a phenomenon normally referred to as "dishing".

FIG. 4 is a graph showing the result of an analysis of the "dishing" phenomenon observed in a case where each of the metal wires 13 is 500 $\mu$m wide and separated from any adjacent wires by 1,000 $\mu$m. In the graph of FIG. 4, the abscissa represents the polishing time expressed in seconds, and the coordinate represents the distance between the surface of the first $SiO_2$ film 12 and the that of the second $SiO_2$ film 14.

Before starting the polishing operation, the distance (solid line in FIG. 4) between the areas (raised portions) of the surface of the $SiO_2$ film 12 carrying a metal wire 13 and the surface of the $SiO_2$ film 14 and the distance (broken line in FIG. 4) between the areas (recessed portions) of the surface of the $SiO_2$ 12 film carrying no metal wire and the surface of the $SiO_2$ film 14 show a difference of 1.1 $\mu$m which is equal to the height of the metal wires 43.

As the polishing operation proceeds, the difference between the distance separating the surface of the $SiO_2$ film 12 and that of the $SiO_2$ film 14 at the raised portions and the corresponding distance at the recessed portions is reduced because the speed at which the $SiO_2$ film 14 is polished off for the raised portions is greater than the speed at which it is polished off for the recessed portions. The reason for the difference in speed is that the $SiO_2$ film 14 is subjected to a greater load at the raised portions.

However, the rate at which the difference between the distance separating the surface of the $SiO_2$ film 12 and that of the $SiO_2$ film 14 at the raised portion and the corresponding distance at the recessed portions is reduced is actually very low. If the polishing operation is conducted for 70 seconds and the $SiO_2$ film 14 is polished off by approximately 1.0 $\mu$m at the raised portions, the thickness of the $SiO_2$ film 14 will be reduced by approximately 0.65 $\mu$m by polishing so that consequently there will remain a difference of approximately 0.35 $\mu$m between the distance separating the surface of the $SiO_2$ film 12 and that of the $SiO_2$ film 14 at the raised portions and the corresponding distance at the recessed portions.

The surface of the $SiO_2$ film 14 can be almost completely and satisfactorily planarized by forming a rather thick $SiO_2$ film and polishing the film to a large extent.

Such a method of forming a thick film and polishing off the film is, however, very time consuming and hence increases the manufacturing cost. Moreover, the more the film is polished, the greater becomes the fluctuations in the polishing speed on the film, a phenomenon by no means favorable for the polishing operation.

The above described dishing phenomenon for the recessed portions can be prevented by forming, for instance, a silicon nitride film as a "polish stopper" for the recessed portions in order to suppress the rate of polishing the $SiO_2$ film 14 at the recessed portions and increase the rate at which the difference in the thickness of the $SiO_2$ film 14 at the raised and recessed portions is reduced.

This technique is schematically illustrated in FIGS. 5A through 5D, which show a semiconductor structure in cross section. Referring firstly to FIG. 5A, an $SiO_2$ film 12 is formed on an Si substrate and (1.1 $\mu$m thick) metal wires 13 are formed thereon in a manner as described before.

Thereafter, another $SiO_2$ film 14 is formed on the entire surface of the intermediate product as shown in FIG. 5B.

Then, a silicon nitride film 15 is formed on the $SiO_2$ film 14 and subsequently is subjected to a patterning operation, in which, as shown in FIG. 5C, the silicon nitride film 15 is removed except at the recessed portions where no metal wires are formed under the $SiO_2$ film 14.

Finally, the surface of the $SiO_2$ film 14 is polished by using a polishing apparatus as illustrated in FIG. 3 in a manner same as the one described above.

With this technique, the hight difference significantly disappears from the surface of the $SiO_2$ film 14 as shown in FIG. 5D, and the dishing of the $SiO_2$ film 14 is also reduced. However, the $SiO_2$ film 14 shows slight upward bulges in areas of the metal wires 13 to provide small increased and recessed portions that are reversals of those of the $SiO_2$ film 14 before the $SiO_2$ film 14 is polished.

The result of an analysis looking into this phenomenon is summarized in FIG. 6. The object of the analysis is a device comprising metal wires 13 have a width of 500 $\mu$m and arranged with a distance of 1,000 $\mu$m separating adjacent wires. The abscissa of the graph of FIG. 6 represents the polishing time (seconds) in the processing step of FIG. 5D, while the coordinate represents the distance between the surface of the first $SiO_2$ film 12 and the that of the second $SiO_2$ film 14.

Before the start of the operation of polishing the device, the distance (solid line in FIG. 6) between the areas (raised portions) of the surface of the $SiO_2$ film 12 carrying a metal wire 13 and the surface of the $SiO_2$ film 14 and the distance (broken line in FIG. 6) between the areas (recessed portions) of the surface of the $SiO_2$ 12 film carrying no metal wire and the surface of the $SiO_2$ film 14 show a difference of 1.1 $\mu$m which is equal to the height of the metal wires 13.

As the polishing operation proceeds, the difference between the distance separating the surface of the $SiO_2$ film 12 and that of the $SiO_2$ film 14 at the raised portions and the corresponding distance at the recessed portions is reduced because the speed at which the $SiO_2$ film 14 is polished off for the raised portions is greater than the speed at which it is polished off for the recessed portions. The reason for the difference in speed is that the $SiO_2$ film 14 is subjected to a greater load at the raised portions. Additionally with this technique, the speed at which the $SiO_2$ film 14 is polished is very low at the recessed portions when compared with the speed at which it is polished at the raised portions because of the silicon nitride films 15 formed on the recessed portions and consequently the difference between the distance separating the surface of the $SiO_2$ film 12 and that of the $SiO_2$ film 14 at the raised portions and the corresponding distance at the recessed portions is further reduced because the higher speed at which the $SiO_2$ film 14 is polished off for the raised portions.

Approximately 70 seconds after the start of the polishing operation, the difference between the distance separating the surface of the SiO$_2$ film 12 and that of the SiO$_2$ film 14 at the raised portions and the corresponding distance at the recessed portions is reduced to almost nil to make the surface of the SiO$_2$ film 14 flat. However, since the polishing operation is continued after the surface of the SiO$_2$ film 14 has become flat, the areas of the surface of the SiO$_2$ film 14 not covered by a silicon nitride film 15, or the original raised portions, are further polished to make the film even thinner.

Thus, the difference between the distance separating the surface of the SiO$_2$ film 12 and that of the SiO$_2$ film 14 at the raised portions becomes smaller than the corresponding distance at the recessed portions to provide small raised and recessed portions that are reversals of those of the SiO$_2$ film 14 before the SiO$_2$ film 14 is polished.

Such reversals of raised and recessed portions on the surface of the SiO$_2$ film 14 can be prevented from occurring by optimizing the thickness of the silicon nitride film 15 in such a manner that it may disappear when the surface of the SiO$_2$ film 14 is made completely flat. However, such a method of optimization of the silicon nitride film thickness will not be feasible for industrial applications, because of the narrow range of the optimum thickness. Furthermore, the formation of a stopper film, a silicon nitride film in particular, and the operation of patterning the film which are indispensable for the technique under consideration are rather complicated and involve a high additional cost.

Therefore, the known technique of using an insulating film as an aid to the operation of polishing and planarizing the surface of a semiconductor device is also accompanied by the phenomenon of "dishing" that appears on the recessed portions to make the operation quite unsatisfactory.

There has been proposed a technique to suppress the occurrence of "dishing" by selectively forming a stopper film, a silicon nitride film in particular, only on the recessed portions.

With this technique, however, "dishing" appears on the raised portions that carry no stopper film immediately after the insulating film is planarized so that again it is practically impossible to achieve a satisfactorily planar surface for the semiconductor device.

FIGS. 7A and 7B of the accompanying drawings illustrate the process of polishing and planarizing the surface of a semiconductor device by using still another known technique.

FIG. 7A shows a conventional semiconductor device comprising a semiconductor substrate 1 and a finely designed patterns 32 of various elements including multilayered wires, semiconductor polycrystalline layers, capacitors and electrodes realized in the form of a combination of fine projections selectively formed on the substrate 1. The patterns 32 are separated from one another by spaces, or recessed areas 33, 34, of which each of the recesses 33 represents a space separating two adjacent elements that are located close to each other whereas each of the recesses 34 separates two adjacent elements with a large distance. The semiconductor device further comprises an insulating film 35 formed to cover the pattern 32 and a resist layer 36 formed on the insulating film 35 by applying a resist material. Thus, the resist layer 36 has a varying thickness which is greater on the relatively wide recesses 34 than on the narrower recesses 33. Subsequently, this resist 36 is etched back to expose the insulating film 35 by, for instance, reactive ion etching (RIE) as illustrated in FIG. 7B, where 36a denotes those areas of the insulating film 35 located on the recesses 33 whereas 36b denotes the areas found on the recesses 34. As seen from FIG. 7B, the surface of the insulating film 35 is undulated because, as the etch back operation proceeds on the resist 36, the insulating film 35 comes to be quickly exposed and etched at locations above the recesses 33 where the resist 36 is relatively thin.

FIGS. 8A and 8B of the accompanying drawings illustrate the process of polishing and planarizing the surface of a semiconductor device by using still another known technique. This process is normally carried out before a multilayer structure is produced in the device.

Referring to FIG. 8A, the semiconductor device comprises a semiconductor substrate 1 and a polysilicon high melting point metal silicide layer 42 selectively formed as capacitors or electrodes on the semiconductor substrate 1 to provide a number of elements of the layer. Spaces defined by adjacent elements of the polysilicon high melting point metal silicide layer 42 provides so many recesses, of which those having a relatively small width are denoted by reference numeral 43, whereas reference numeral 44 denotes those recesses having a relatively layer width. The semiconductor device further comprises an insulating film 45 formed to cover the entire surface of the device, said insulating film 45 being typically made of boron phosphorous silicon glass (BPSG). When the BPSG film is caused to reflow by using a phosphor dispersion melt technique as illustrated in FIG. 8B, the BPSG film 45 comes to show a remarkably undulated surface which is higher at locations above the wider recesses 42 separating elements of the polysilicon high melting point metal silicide layer 42 than at locations above the narrower recessed 43 that also separates elements of the layer 42.

As may be understood from the above description, known techniques for polishing and planarizing the surface of a semiconductor device are, in most cases, required to deal with surface layers having a number of projections formed typically by electrodes, capacitors and wires and also with surface layers having a number of recesses produced normally by trenches and contact holes. The surface of a semiconductor device having such an uneven surface layer is then planarized by forming an insulating film thereon and etching the film back or causing the film to reflow.

However, the operation of etch back or reflow cannot satisfactorily planarize the surface of an insulating film because the recesses on the surface of a semiconductor device of the type under consideration have widely different widths. That is, the undulated surface of such an insulating film cannot be completely planarized.

Obviously, the undulations remaining on the insulation film of a semiconductor device can have disadvantages on the following steps in the manufacturing process.

Assume, for example, that a wiring material is laid on the surface of a semiconductor device having remaining undulations thereon and then subjected to a patterning operation. Then, rays of light emitted on the layer of the material for the patterning operation may not be accurately focused on the layer and the produced wiring may exhibit a disturbed pattern. In view of the recent trend of producing highly integrated devices requiring a precision level of submicrons and having a relatively large difference in the height between central and peripheral areas and a very narrowed space between any adjacent wires of the chip, such undulations on the surface can adversely affect not only the make of the patterned wiring but also the electric characteristics of the device.

Additionally, while the technique of RIE is popularly used for the etching back operation, it can give rise to a loading effect which is specific to anisotropic etching and attributable to the difference in the size of the openings and the pattern to space ratio of the device so that the rate and shape of etching may be adversely affected by that effect to degrade the controllability of the technique.

Thus, there have been observed problems of broken wires and sort circuits on semiconductor devices of the type under consideration that can significantly reduce the yield of manufacturing devices and reduces the reliability of produced devices.

FIGS. 9A through 9C of the accompanying drawings illustrate in cross section a known semiconductor device in three different steps of polishing and planarizing the insulating film.

Referring firstly to FIG. 9A, an $SiO_2$ film 52 is formed in an Si semiconductor substrate 1 and thereafter a lower wiring layer 53 is formed on the $SiO_2$ film 52.

Then, as shown in FIG. 9B, another $SiO_2$ film 54 is formed by deposition to cover the entire surface of the semiconductor substrate 1 including the areas occupied by the lower wiring layer 53. Thereafter, the $SiO_2$ film 54 is partly removed by polishing as shown in FIG. 9C.

The polishing operation is carried out to remove the undulations on the surface of the $SiO_2$ film 54 as shown in FIG. 9B and make the surface flat.

However, as FIG. 9C suggests, while it is relatively easy to partly flatten the surface of the $SiO_2$ film 54, the entire surface of the film 54 cannot be made completely planar without difficulty because the extent to which the $SiO_2$ film 54 is polished off varies depending on the position on the Si substrate 1. It is also not an easy task to control the extent of polishing the film 54.

A conceivable method of controlling the extent of polishing the $SiO_2$ film 54 is to form an additional layer of silicon nitride film and use the layer as a stopper. FIGS. 10A through 10D of the accompanying drawings illustrate how this method is put to actual use.

Referring firstly to FIG. 10A, an $SiO_2$ film 62 is formed in an Si semiconductor substrate 1 and thereafter a lower wiring layer 63 is formed on the $SiO_2$ film 62.

Then, as shown in FIG. 10B, a silicon nitride film 64 is formed as a stopper layer on the lower wiring layer 63 by deposition and subsequently another $SiO_2$ film 65 is formed on the silicon nitride film 64 also by deposition as shown in FIG. 10C. Thereafter, the $SiO_2$ film 65 is partly removed by polishing as shown in FIG. 10D.

However, as FIG. 10D suggests, the effect of the polishing operation varies depending on the position on the surface of the Si substrate 51. While there are areas where the silicon nitride film 64 operate effectively as a stopper layer against the polishing operation, it is totally removed and the lower wiring layer 63 is polished to a certain extent in some other areas on the Si substrate 1.

FIGS. 11A through 11C and FIGS. 12A through 12E of the accompanying drawings respectively illustrates two different known processes for preparing a thin film semiconductor device, where a silicon substrate is thinned by polishing.

Referring firstly to FIG. 11A, an $SiO_2$ film 72 is formed in an Si substrate 71.

Then, as shown in FIG. 11B, another Si substrate 73 is applied to the Si substrate 71 with the $SiO_2$ film 72 interposed therebetween and subsequently the Si substrate 73 is thinned by polishing as illustrated in FIG. 1C.

Consequently, as FIG. 11C clearly shows, the thickness of the silicon thin film 73 varies greatly depending on the position of the Si substrate and is totally removed in some areas.

A conceivable method of controlling the extent of polishing the silicon thin film 73 is to form an additional layer of $SiO_2$ film, for instance, and use the layer as a stopper. FIGS. 12A through 12E of the accompanying drawings illustrate how this method is put to actual use.

Referring firstly to FIG. 12A, an $SiO_2$ film 82 is formed in an Si substrate 81.

Then, as shown in FIG. 12B, another Si substrate 83 is applied to the Si substrate 81 with the $SiO_2$ film 82 interposed therebetween. Subsequently, openings are formed in the Si substrate 83 until the openings reach the surface of the $SiO_2$ film 82 as illustrated in FIG. 12C. Thereafter, as shown in FIG. 12D, another $SiO_2$ film 84 is selectively formed in those openings to a desired thickness by deposition and then the Si substrate 83 is partly removed by polishing.

Here again, the effect of the polishing operation varies depending on the position on the Si substrate. While the polishing operation proceeds as far as somewhere in the middle of the $SiO_2$ film 84 in some areas on the Si substrate, it is totally removed and along with the silicon thin film 83 in other areas.

Any known methods of manufacturing semiconductor devices involving steps of polishing the devices are accompanied by the above identified problems, which can be summarized as follows.

One of the most significant problems is that, with any known methods, the extent of polishing the device can hardly be controlled. Here, control of the extent of polishing the device means absolute control of the polishing rate and that of the evenness of the device surface. Any technology of manufacturing semiconductor devices will not and cannot be feasible for practical applications unless it is capable of controlling these two aspects. One known technique of controlling the extent of polishing is, as already described, to use a silicon nitride or $SiO_2$ film as a stopper layer.

However, the use of a silicon nitride or $SiO_2$ film as a stopper layer is not practical because they do not offer a sufficiently wide range of selectable ratios of the rate of polishing the proper object to that of polishing the stopper. Moreover, the range of selectable ratios of the rate of polishing the proper object to that of polishing the stopper varies greatly depending on the polishing slurry used in the polishing operation. For instance, the rate of polishing a $SiO_2$ film will be very high if polishing slurry used for the polishing operation contains sodium hydroxide to a relatively large concentration. In other words, the material to be used for the stopper layer should be selected by considering the type of polishing slurry involved.

Thus, any conventional process of polishing semiconductor devices is accompanied by the problem of difficulty of controlling the extent of polishing the device and hence hardly feasible for practical applications.

It is also a common practice in any conventional process of polishing semiconductor devices that a test piece (specimen) of the product is polished to collect data for determining an optimum rate of polishing the device and then devices are polished at that determined optimum rate. However, the rate of polishing the device varies as a function of the time consumed for the polishing operation as typically illustrated in FIG. 13 and, therefore, the optimum polishing rate determined on the test piece does not necessarily reflect the actual polishing rate observed on the manufacturing line.

The manner in which the polishing rate changes with time is then greatly affected by the amount of polishing slurry held in the polishing cloth and the condition under which the polishing slurry is held in the polishing cloth. This influence of the amount of polishing slurry and the condition for the polishing of holding the slurry is so diverse that it is practically beyond control.

In an attempt to bring the rate of polishing the test piece closer to the actual rate of polishing devices on the manufacturing line, more than one and preferably a considerably large number of test pieces are used to determine an optimum polishing rate. Such a measure, however, entails an increase in the manufacturing cost due to a higher material cost for test pieces and a reduction in the operating hours of the manufacturing facilities, making it even more impractical.

Another proposed technique for accurately controlling the extent of polishing the device comprises preliminarily polishing the device to a relatively small extent, measuring the extent to which the device has been actually polished and then repeating the above procedures until the device is polished to a desired extent. While this method does not involve any increase in the material cost for the test piece, it is time consuming and significantly reduce the operating hours of the manufacturing facilities. Furthermore, in view of the fact that a semiconductor device is polished by merely 1 $\mu$m in the manufacturing process, this method is by no means recommendable.

Thus, it should be stressed again that any known process of manufacturing semiconductor devices involving steps of polishing the devices is accompanied by the problem of difficulty of controlling the extent of polishing the device.

While there have been proposed techniques to overcome this problem including the one that uses test pieces to determine the rate of polishing the device and the one with which the device is polished in a plurality of steps and the extent to which the device has been polished is determined at each step, any of these techniques are not recommendable because they can not satisfactorily control the extent of polishing and involve an increase in the manufacturing cost.

There is also known a method of polishing and planarizing semiconductor devices as disclosed in U.S. Pat. No. 5,036,015 "Method of Endpoint Detection during Chemical/Mechanical Planarization of Semiconductor Wafers". According to this method, the turntable of a planarizing apparatus is driven to rotate by an electric motor and changes in the friction between the wafer held by a wafer holding device on the turntable and the polishing cloth for polishing the wafer are detected as changes in the electric current flowing through the electric motor.

For planarizing a silicon oxide film, a layer made of a material harder than the silicon oxide film is arranged under the silicon oxide film in advance and the planarizing operation is terminated when the polishing plane of the polishing cloth reaches the hard layer to increase the friction of the plane after completely removing the silicon oxide film by polishing.

This known technique is also not without problems as described below by referring to FIGS. 14 through 16.

FIG. 14 schematically illustrates a polishing apparatus of the above described type, which detects changes in the friction between the wafer 1 and the polishing cloth 504 held on the turntable 502 for polishing the wafer as changes in the electric currents respectively flowing through the electric motors 511 and 512 and displayed on the corresponding ampere-meters 513 and 514.

Referring now to FIG. 15, each of the electric currents flowing through the respective electric motors 511 or 512 varies as a quadratic function of the voltage of the corresponding power supply 515 or 516 and the reading for the current is affected by changes in the voltage. As seen from FIG. 16, however, since no load current Io flows through each of the electric motors when no load is applied thereto, it is difficult to accurately detect the level of friction taking place on the turntable.

Referring back to FIG. 14, the shafts 517 and 518 of the turntable and holding device of the polishing apparatus are connected to the respective shafts of the corresponding motors 511 and 512 by respective belts 519 and 520 in order to eliminate any adverse effects of pulsation of the motors to which the polishing plane of the polishing cloth may be subjected to. However, the belts 519 and 520 can slip around the respective shafts 511 and 512 while they are driven to run to change the loads of the motors 511 and 512 SO that the ampere-meters 513 and 514 may not correctly reflect the level of friction taking place on the turn table.

Meanwhile, according to another known method of polishing and planarizing a semiconductor device, the rate of polishing the device is determined from the number of rotations of the turntable per unit period of time and the load applied the polishing apparatus by the object of polishing in order to establish an optimum polishing time on the basis of the determined polishing rate and the required extent of polishing.

In a polishing apparatus designed to practice this method, a polishing cloth is arranged on a turntable which is driven to rotate by a drive motor and a holding device for holding an object of polishing is disposed on the polishing cloth. The holding device is also driven to rotate by another drive motor.

Then, a semiconductor wafer to be polished by this apparatus is put on the holder opposite to the turntable. The wafer comprises a wiring layer arranged on a silicon substrate with a first insulating film disposed therebetween and a second insulating film disposed on the first insulating film. The holder device and the turntable are driven to rotate for predetermined respective rotations per unit period of time by the respective drive motors and the polishing cloth which is rotating with the turntable is fed with a polishing slurry. Then, the holder device is moved down until the wafer comes to contact with the polishing cloth. Under this condition, a predetermined load is applied to the wafer and the holder device is moved horizontally along the surface of the turntable to polish the wafer for a predetermined period of time to planarize the surface of the second insulating film of the wafer that carries undulations thereon.

After the operation of planarizing the wafer is over, it is replaced by a new one and the above described procedures are repeated for each untreated wafer. When the polishing apparatus has been used for a predetermined service time, the polishing cloth is redressed to recover its original condition by using a brush. After experiencing a number of cycles of polishing and redressing, the polishing cloth is replaced by a new one.

According to the above described known polishing method, the rate of polishing the wafer is calculated from given polishing conditions or the rotations per unit period of time of the wafer holder device, that of the turntable and the load applied to the wafer and an optimum polishing time is selected from the polishing rate and the required extent of polishing. In other words, the polishing rate is assumed to be constant unless either or both of the polishing rate and the load are altered. In reality, however, the polishing rate changes as the level of friction between the wafer and the polishing cloth varies as a function of the time consumed for polishing the wafer even if the rotations per unit time and the load are not altered.

FIG. 17 of the accompanying drawings illustrate the relationship between the total service time of the polishing cloth and the polishing rate. The first 50 minutes in the total service time of the polishing cloth are defined as an initial stage, which moves into a working stage when the first 50 minutes have passed.

FIG. 17 shows that the polishing rate varies also with time in the working stage. This may be attributable to the changes in the surface condition of the polishing cloth that take place as the cloth is choked by particles of the polishing slurry and the cloth is worn out and by turn reduce the efficiency of feeding particles of the polishing slurry to and discharging them from the surface of the polishing cloth and hence the efficiency of polishing the wafer. More specifically, the surface of the polishing cloth 504 has a huge number of tissues suspended therefrom and pores separating them as illustrated in FIG. 18 and particles of the polishing are retained in those pores. Then, as the polishing cloth is pressed against the wafer, the particles of the polishing slurry retained in the pores are discharged onto the wafer. The efficiency of this polishing slurry feeding and discharging mechanism is reduced with time as the polishing cloth is worn out to vary the polishing rate with time. As the surface condition of the polishing cloth is further aggravated, it can give rise to scars on the polished surface of the wafer and degrade the planar condition of the polished surface.

A polishing cloth choked with particles of the polishing slurry can be redressed by means of a brush at an appropriate time. While the operation of redressing is an effective way of deterring the wear of the polishing cloth, the cloth requires replacement if its surface condition is not recovered by redressing as such a situation suggests that the service life of the cloth is over.

With the above described known polishing method, the timing or redressing the polishing cloth is selected on the basis of the experience of the operator and that of replacing the polishing cloth is determined on the basis of the polishing rate calculated from the measured value of the extent of polishing the wafer per unit period of time. This means that in most cases the polishing cloth is not timely redressed nor replaced and consequently the rate of polishing the wafer is not kept to a constant level nor accurately controlled.

SUMMARY OF THE INVENTION

In view of the above circumstances, it is therefore an object of the present invention to provide a process of polishing semiconductor devices that keeps the device free from contamination by alkali metals, does not produce scars on the surface of the insulating film of the device, can effectively planarize the surface of the device having undulations that are several hundreds to thousand nanometers high and can be easily and appropriately incorporated into a process of manufacturing semiconductor devices.

According to the present invention, the above object is achieved by providing a method of manufacturing semiconductor devices comprising steps of forming an insulating film on a semiconductor substrate and polishing at least partly the insulating film by using a polishing slurry containing cerium oxide to partly remove the insulating film. According to the present invention, there is also provided a method of manufacturing semiconductor devices comprising steps of forming an insulating film on the surface of a semiconductor substrate carrying projections and recesses and polishing and planarizing the insulating film by using a polishing slurry containing cerium oxide.

With either of the above methods according to the invention, the insulating film can be polished at an enhanced rate as the insulating film which is a silicon oxide film or a silicon nitride film is polished by using a polishing slurry containing cerium oxide.

It has been proved that the inside of the insulating film is not contaminated by alkali metals when it is polished. Additionally, it has also been proved that an insulating film carrying undulations that are several hundreds to thousands high on the surface can be polished and at the same time planarized without producing scars on the surface of the film.

A polishing slurry that can be used in the step of polishing and planarizing the semiconductor device according to the present invention may contain elements other than the principal ingredients, or impurities, to a concentration of less than 100 ppm. Preferably, the principal ingredients are $SiO_2$ and $H_2$ or $CeO_2$ and $H_2$ and the impurities are selected from Na, K, other alkali metals and compounds of these metals.

By using a highly pure polishing slurry containing impurities only to a very low concentration, semiconductor devices can remain uncontaminated by the impurities contained in the polishing slurry if the slurry is brought to contact the wafer during the polishing operation and remain on the surface of the wafer.

It is another object of the present invention to provide a process of manufacturing semiconductor devices comprising steps capable of completely planarizing the surface layer of the device.

According to the invention, the above object is achieved by providing a method of manufacturing semiconductor devices comprising steps of forming a stopper film on the entire surface of a film to be polished, the surface of the film to be polished having undulations, the stopper film having a polishing rate lower than a polishing of rate said film to be polished, and polishing the surface of the substrate carrying the stopper film formed thereon to planarize the film to be polished.

According to a series of research activities conducted by the inventors of the present invention, the phenomenon of "dishing" can be avoided when a stopper film having a polishing rate lower than a polishing of rate the film to be polished is formed on the entire area of the undulated surface of the film to be polished and the stopper film and the film to be polished are subjected to polishing, and consequently the undulations of the film to be polished can be effectively removed to planarize the surface of the film. A possible explanation for the effect of providing a stopper film for planarization will be as follows.

Since projecting areas on an undulated surface are normally subjected to a load greater than the load applied to recessed areas of the surface, the former will be polished at a rate greater than the rate at which the latter are polished.

Therefore, in the initial stages of the polishing operation, the stopper film will be polished mainly at areas that are located on the projections. However, the undulations of the film to be polished are not reduced during these stages.

As the stopper film is further polished and eventually removed at the areas on the projections, the film which is the object of polishing begins to be polished at the projections to reduce the undulations of its surface.

Now, as the undulations of the film to be polished is further reduced, the stopper film will be polished at areas on the recesses until it is completely removed at a certain point of time. The film to he polished is considered to be completely planarized in this instance. Thereafter, the film will be polished further, keeping its planar surface without allowing "dishing" to appear.

The research carried out by the inventors of the present invention has also proved that the advantage of the above described polishing technique does not depend on and is remarkable regardless of the thickness of the stopper film.

It is still another object of the present invention to provide a process of planarizing the surface of semiconductor devices at a high yield regardless of the size of the undulations on the surface so that highly reliable semiconductor devices may be produced.

According to the invention, the above object is achieved by providing a method of polishing semiconductor devices comprising steps of forming a conductive film on a semiconductor substrates, producing recesses in the conductive film by selectively and partly removing the conductive film, forming an insulating film on the conductive film to a height at least greater than the depth of the recesses and polishing the insulating film with a polishing slurry containing cerium oxide, using the conductive film as a stopper, to planarize the surface of the conductive film and the insulating film.

According to the invention, there is also provided a method of polishing semiconductor devices comprising steps of forming a wiring pattern on a semiconductor substrate, forming an insulating film on the semiconductor substrate and the wiring pattern, forming a conductive film on the insulating film, producing recesses in the insulating film and the conductive film to expose the wiring pattern by selectively removing the films, laying a wiring material on the conductive film having recesses to a height at least greater than the depth of the recesses and polishing the wiring material with a polishing slurry containing cerium oxide, using the conductive film as a stopper, to planarize the surface of the insulating film and the wiring material.

According to the invention, there is also provided a method of polishing semiconductor devices comprising steps of forming first insulating film on a semiconductor substrate, forming a wiring pattern on the first insulating film, forming an amorphous silicon film to make a second insulating film on the wiring pattern and the first insulating film, forming a third insulating film on the amorphous silicon film to a height at least greater than that of the wiring pattern, polishing and removing the third insulating film with a polishing slurry containing cerium oxide to planarize the surface of the third insulating film and the amorphous silicon film and transforming the amorphous silicon film into a second insulating film.

The conductive film to be used as a stopper is preferably made of a material selected from polysilicon, amorphous silicon, titanium nitride, a silicide film or carbon.

Since the above described methods do not use a technique of etch back or reflow for planarization, the recesses and projections of the semiconductor device can be planarized regardless of their height.

Additionally, the use of a polishing slurry containing cerium oxide allows the polishing operation to be satisfactorily conducted under an neutral condition. So, no dissolution will occur if the lower wiring layer contains highly materials that can easily be corroded.

Still additionally, since no RIE is used for etch back, there will appear no loading effect on the etching rate and pattern due to the difference in the size and pattern of the openings of the device specific to the technique of anisotropic etching so that consequently the etching operation conducted on the device will be highly controllable.

Thus, with any of the above described methods, the surface of semiconductor devices can be planarized at a high yield regardless of the size of the undulations on the surface so that highly reliable semiconductor devices may be produced.

It is still another object of the present invention to provide a method of manufacturing semiconductor devices that solves the above identified problems of the prior art and makes the control of the extent of polishing the device easy by using a stopper that effectively works regardless of the polishing slurry involved, allowing a wide range of selectable ratios of the rate of polishing the proper object to be polished to that of polishing the stopper.

According to the present invention, the above object is achieved by providing a method of manufacturing semiconductor devices incorporating a process of polishing an layer formed on the substrate of the device and comprising a step of forming a carbon film as a stopper for the polishing operation prior to the process of polishing the layer.

Since a carbon layer is polished at a very low rate, the use of a carbon layer provides a large ratio of the rate of polishing the proper object to be polished to that of polishing the stopper. When a carbon film is formed at least partly under, inside, on and/or adjacent to the target layer of the polishing operation as a stopper allowing a low polishing rate, the extent to which the target layer is polished can be controlled with greater ease. Additionally, since a carbon film is highly resistive to chemicals, it can be used regardless of the type of polishing slurry involved.

It is still another object of the present invention to provide a method of manufacturing semiconductor devices that can easily and accurately control the extent to which the device is polished as well as a polishing apparatus that can be appropriately used with the method.

According to the invention, the above object is achieved by providing a method of manufacturing semiconductor devices incorporating a process of polishing an layer formed on the substrate of the device and comprising steps of measuring the friction caused between the layer being polished and a turntable carrying a polishing slurry during the polishing operation, determining the rate of polishing the layer from the measured friction, determining the extent of polishing of the layer by integrating the polishing rate with time and terminating the polishing operation upon coincidence of the extent of polishing of the layer and a predetermined value.

According to the invention, the above object is also achieved by providing a polishing apparatus comprising means for measuring the friction caused between the layer being polished and a turntable carrying a polishing slurry during the polishing operation, determining the rate of polishing the layer from the measured friction and determining the extent of polishing of the layer by integrating the polishing rate with time.

Upon examining the results of a series of research activities conducted by the inventors of the present invention that provide the basis of the invention, it was found that the friction between the layer being polished and the turntable carrying a polishing slurry and the rate of polishing the layer show a relationship of one-to-one correspondence.

By utilizing this relationship, it is now possible to measure the friction caused between the layer being polished and a turntable carrying a polishing slurry during the polishing operation, determine the rate of polishing the layer from the measured friction, determine the extent of polishing of the layer by integrating the polishing rate with time and terminate the polishing operation upon coincidence of the extent of polishing of the layer and a predetermined value. Therefore, it is possible to provide a method of easily and accurately controlling the extent to which the device is polished.

It is still another object of the present invention to provide an apparatus capable of accurately planarizing the surface of the wiring and the insulating layer of a semiconductor integrated circuit without requiring additional steps.

According to the invention, the above object is achieved by providing a polishing apparatus for chemically and mechanically polishing the wiring and the insulating layer of a semiconductor device to planarize the surface thereof, comprising a system of measuring the distortion of the shaft connected to the polishing turntable to determine the load due to friction caused at the turntable, converting the measured value into an electric signal to control the operation of the electric motor for driving the turntable.

It is still another object of the present invention to provide a polishing apparatus capable of accurately controlling the extent to which the target object is polished as well as a method of controlling the extent of polishing the object.

According to the invention, the above object is achieved by providing a polishing apparatus for polishing semiconductor devices comprising a turntable provided with a polishing plane thereon, a holder device disposed opposite to the polishing plane for holding an target object with the surface to be polished facing the polishing plane, first means for measuring a first level of friction generated between the polishing plane and the surface of said object when the holder device is rotated relative to the turntable under pressure to polish the object and a second level of friction generated between the polishing plane and the surface of the object after a predetermined period of time, an arithmetic unit for calculating the ratio of the first level to the second level of friction and second means for determining the timing for redressing or replacing the polishing plane.

According to the invention the above object is also achieved by providing a method of polishing semiconductor devices comprising steps of providing a turntable equipped with a polishing plane disposed thereon and a holder device disposed opposite to the polishing plane and holding an target object with the surface to be polished facing the polishing plane, rotating the turntable and the holder device, feeding the polishing plane with a polishing slurry to polish the object under a first polishing condition while the polishing plane frictionally and slidingly moves on the surface of the object under pressure, measuring a first level of friction generated between the polishing plane and the surface of the object, measuring a second level of friction generated between the polishing plane and the surface of the object after a predetermined period of time, determining by calculation the ratio of the first level to the second level of friction and determining by calculation a second polishing condition from the ratio to produce an extent of polishing the surface equal to the extent achieved under said first level of friction.

With the above described method of the invention, a first level of friction is measured between the polishing plane and the surface of the object as the turntable and the holder device are rotated relative to each other under pressure and a polishing slurry is fed to the surface of the polishing plane so that the polishing plane frictionally slides on the surface of the object and then, after a predetermined period of time, a second level of friction is measured to determine the ratio of the first level to the second level of friction. A change in the friction between the polishing plane and the surface of the object can be detected from this ratio and the condition of the polishing plane can be appreciated from this change so that the timing for redressing or replacing the polishing plane can be correctly determined.

When a target object is polished under a first polishing condition, a first level of friction is measured between the polishing plane and the surface of the object at a point of time and then a second level of friction is measured also between the polishing plane and the surface of the object after a given period of time since the point of time to calculate the ratio of the first level to the second level of friction, which ratio is then used to determine a second condition under which the rate of polishing the object is made equal to that of polishing the object under the first condition. Thus, the rate of polishing the object can be kept constant by shifting the polishing condition from the first to second condition if the state of the polishing plane has undergone changes.

It is still another object of the present invention to provide a method capable of maintaining the surface condition of the polishing plane of a polishing apparatus for semiconductor devices to a desired constant level by effectively removing particles of the polishing slurry contained in the polishing plane to choke the polishing plane without relying on the experience of a skilled operator.

According to the invention, the above object is achieved by providing a method of using a surface active agent to redress a degraded condition of the polishing plane of a polishing apparatus choked with particles of a polishing slurry in order to consistently maintaining the polishing plane to a desired state, the apparatus comprising the polishing plane disposed on a turntable, a holder device for folding a target object to be polished with its surface facing the polishing plane and means for feeding a polishing slurry between the polishing plane and the surface of the target object, the polishing plane being frictionally rotated relative to the surface of the target object under pressure to polish the surface.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 19A to 19F show cross section views of semiconductor structures at respective steps of a manufacturing method of an embodiment according to the present invention;

FIGS. 20A to 20C show cross section views of semiconductor structures at respective steps of a manufacturing method of another embodiment according to the present invention;

FIGS. 22 to 27 each show characteristic curves between polishing time to distance, obtained by the manufacturing method described with reference to FIGS. 21A to 21E;

FIG. 28 shows a cross sectional view of a semiconductor structure obtained by a still further embodiment according to the present invention;

FIGS. 29A to 29C show cross section views of semiconductor structures at respective steps of a method of manufacturing the semiconductor structure as shown in FIG. 28;

FIGS. 30A to 30C show cross section views of semiconductor structures at respective steps of a manufacturing method of a yet further embodiment according to the present invention;

FIGS. 31A to 31B show cross section views of semiconductor structures at respective steps of a manufacturing method of a further embodiment according to the present invention;

FIGS. 32A to 32C show cross section views of semiconductor structures at respective steps of a manufacturing method of a further embodiment according to the present invention;

FIG. 35 shows a perspective view of a polishing apparatus of an embodiment according to the present invention;

FIG. 36 shows characteristic curves between polishing time and polishing rate, and characteristic curves between polishing time and current through motor;

FIG. 38 shows a characteristic curve between friction between to-be-polished layer and turntable, on one hand, and polishing rate, on the other hand;

FIG. 39 shows a characteristic curve between the number of rotation of turntable and holding device and polishing rate;

FIGS. 42 and 43 show cross section views of semiconductor structures at a step of a manufacturing method;

FIG. 44 shows a perspective view of a polishing apparatus of an embodiment according to the present invention;

FIG. 46 shows characteristic curves between current through motor and polishing rate;

FIG. 49 shows a perspective view of a polishing apparatus of an embodiment according to the present invention;

FIG. 50 shows a perspective view of a polishing apparatus of an embodiment according to the present invention; and FIG. 51 shows a characteristic curve between time of using of polishing cloth and polishing rate.

DETAILED DESCRIPTION OF THE PREFERRED EMBODIMENT

Figure 1A:
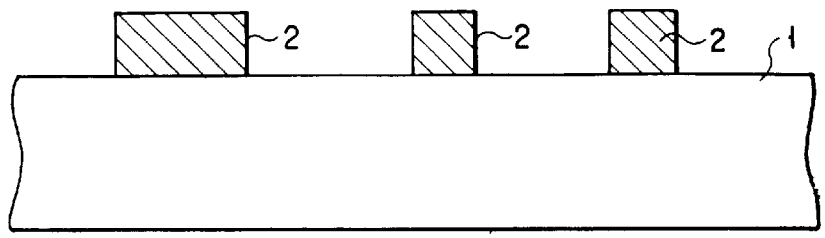
FIGS. 1A to 1E show cross section views of semiconductor structures at respective steps of a conventional manufacturing method.
Figure 1B:
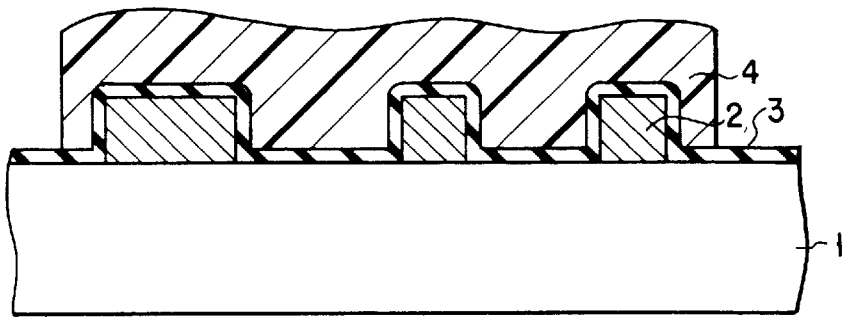
Figure 1C:
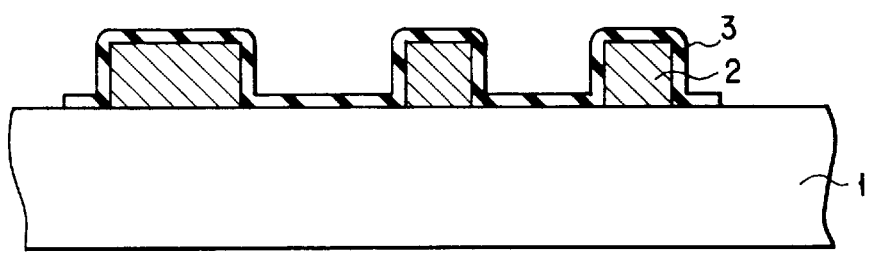
Figure 1D:
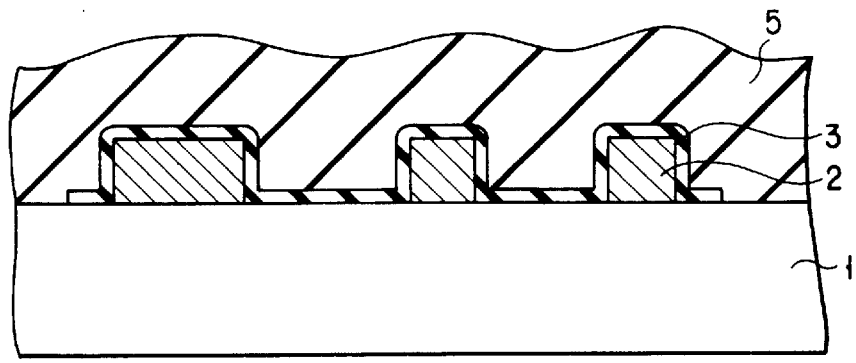
Figure 1E:
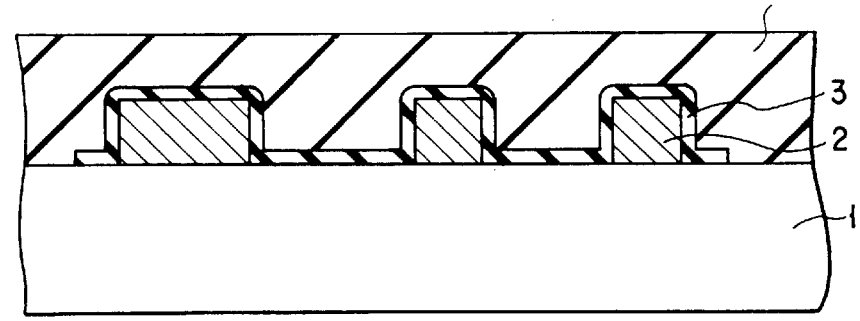
Figure 2A:
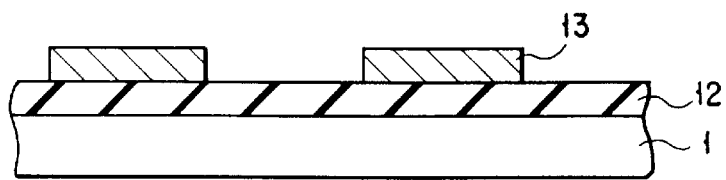
FIGS. 2A to 2C show cross section views of semiconductor structures at respective steps of another conventional manufacturing method.
Figure 2B:
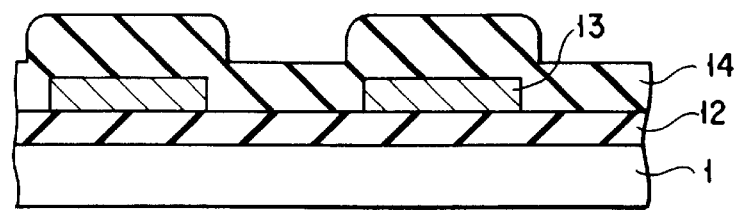
Figure 2C:
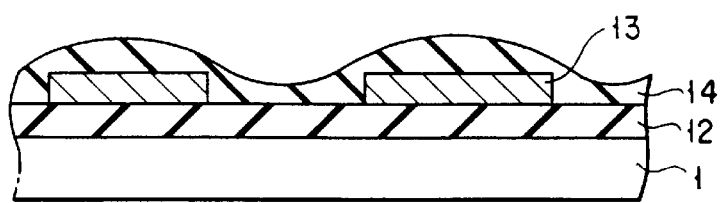

Now, the present invention will be described in greater detail by way of examples and reference will be made to the accompanying drawings that illustrate some of the best modes of carrying out the invention.

FIGS. 19A through 19F schematically illustrate a semiconductor device in cross section in a number of different steps of planarizing its insulating film interlayer in a mode of carrying out the invention.

As shown in FIG. 19A, an $SiO_2$ film 202 is formed to a thickness of 1 μm on an Si substrate 201 carrying certain elements (not shown) on the surface. Thereafter, a 500 μm thick polysilicon film 203 is formed on the $SiO_2$ film 202.

Then, as shown in FIG. 19B, a photoresist (photosensitive resin containing agent) is applied to the polysilicon film 203 to form a layer having a thickness of 1.5 μm and the formed photoresist layer is exposed to light with a mask pattern (not shown) arranged thereon. Then, a photoresist pattern 204 will be produced by developing the layer.

Subsequently, as shown in FIG. 19, the polysilicon film 203 is subjected to a patterning operation, using the photoresist pattern 204 as a mask and also using an RIE technique and $CF_4$ gas.

Thereafter, as illustrated in FIG. 19D, the photoresist pattern 204 is removed and reduced to ash in a down flow type asher, where microwaves are discharged into a gaseous mixture of $CF_4$ and $O_2$ to which the photoresist is exposed. Then, as illustrated in FIG. 19E, an $SiO_2$ film 205 is formed on the entire surface of the processed substrate to a thickness of 1 μm to produce an insulating film interlayer. The $SiO_2$ film 205 showed projections and recesses on the surface reflecting the pattern of the polysilicon wiring 203.

Figure 3:
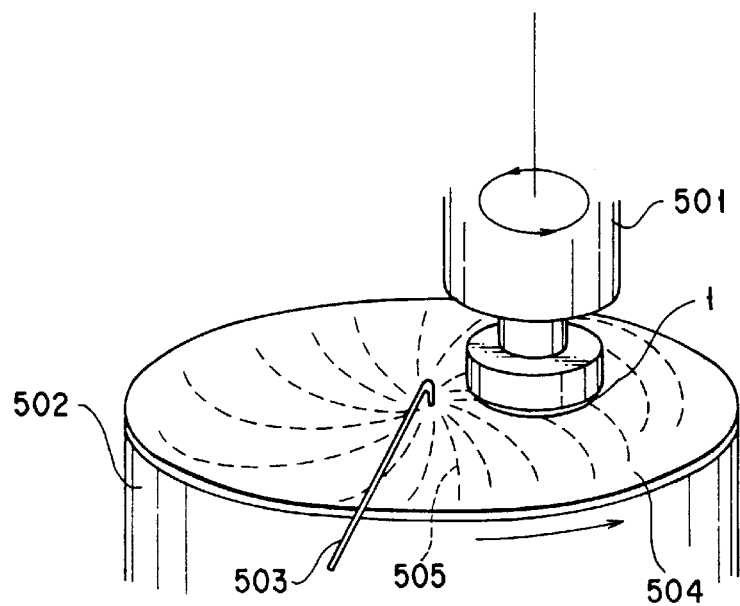
FIG. 3 shows a perspective view of a conventional polishing apparatus.
Figure 4:
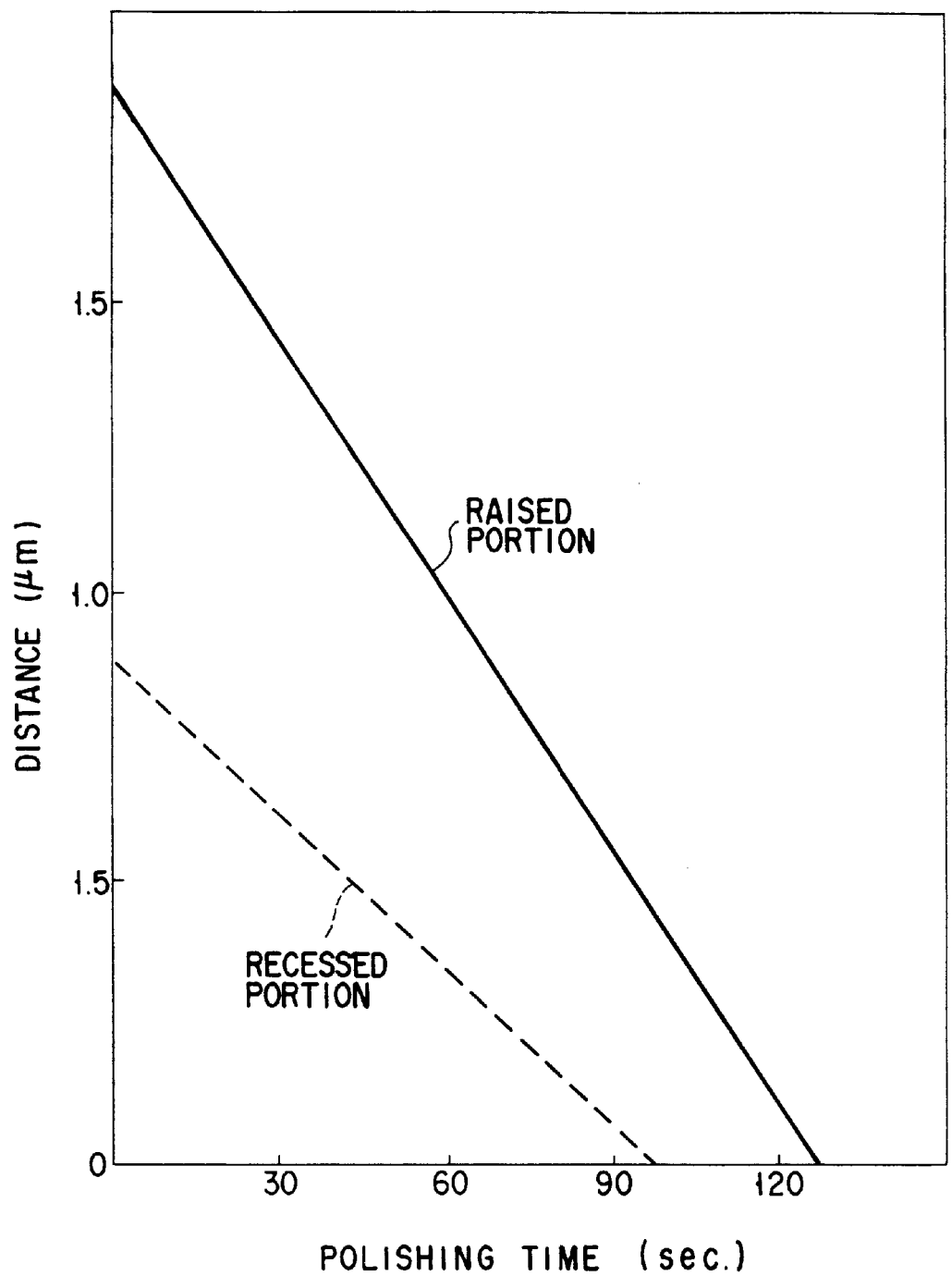
FIG. 4 shows characteristic curves between polishing time to distance, obtained by a conventional method described with reference to 2A to 2C.
Figure 5A:
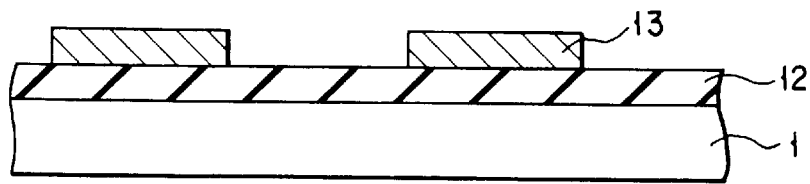
FIGS. 5A to 5D show cross section views of semiconductor structures at respective steps of a further conventional manufacturing method.
Figure 5B:
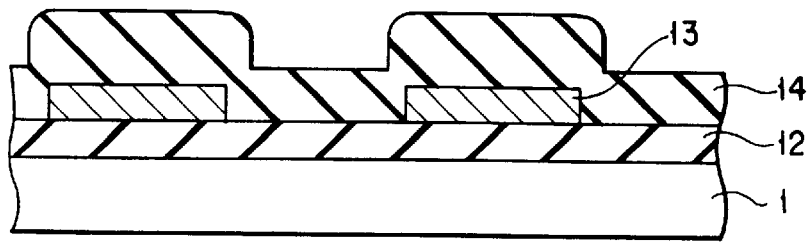
Figure 5C:
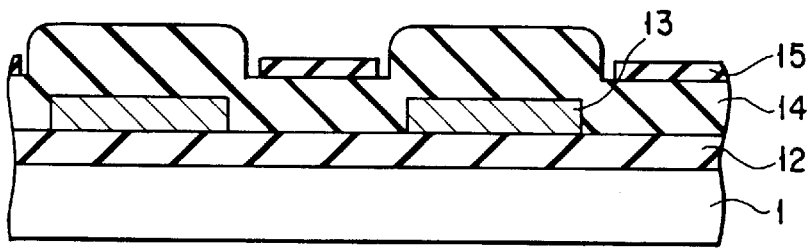
Figure 5D:
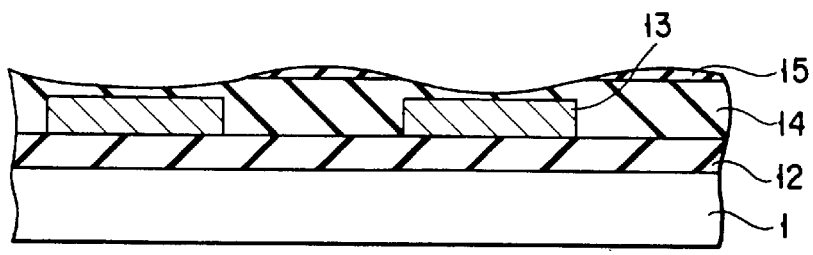
Figure 6:
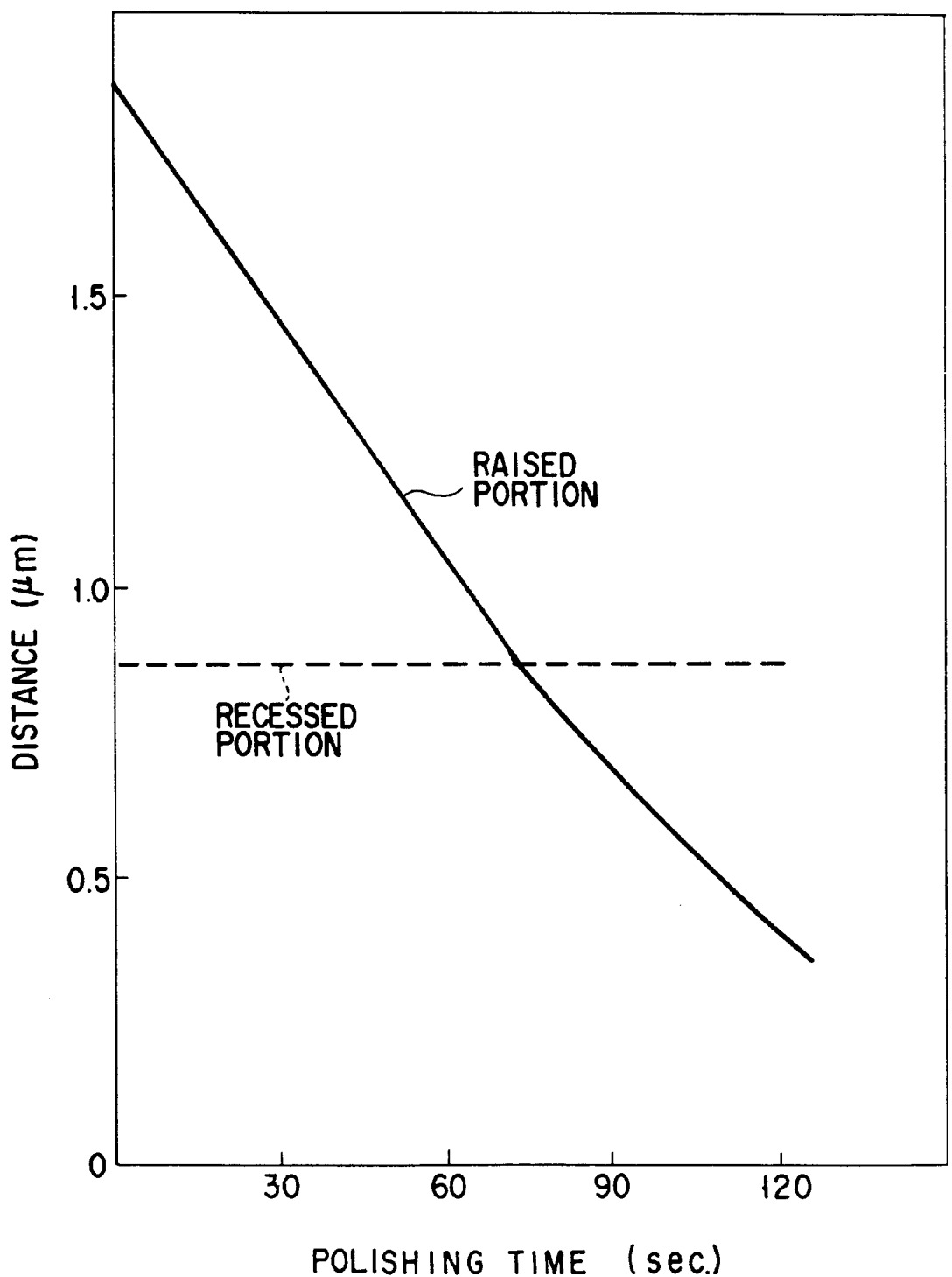
FIG. 6 shows characteristic curves between polishing time to distance, obtained by another conventional method described with reference to FIGS. 5A to 5D.
Figure 7A:
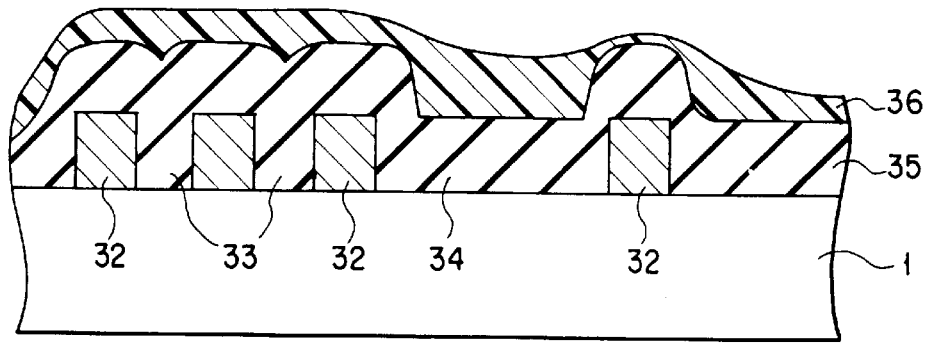
FIGS. 7A to 7B show cross section views of semiconductor structures at respective steps of still another conventional manufacturing method.
Figure 7B:
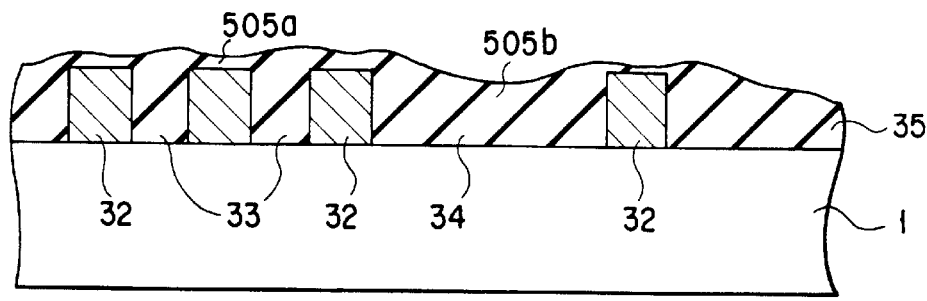
Figure 8A:
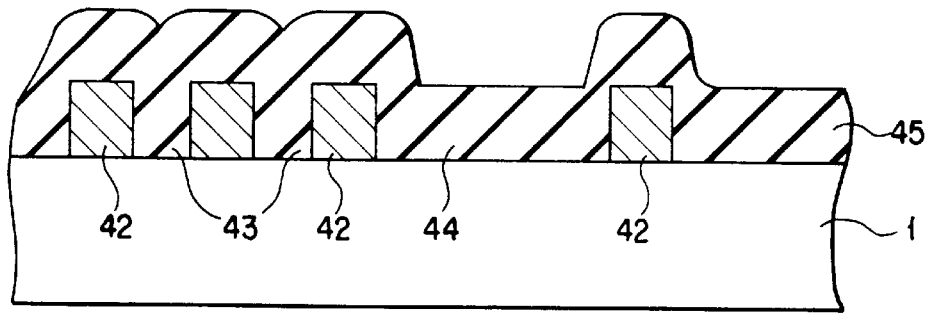
FIGS. 8A to 8B show cross section views of semiconductor structures at respective steps of a still further conventional manufacturing method.
Figure 8B:
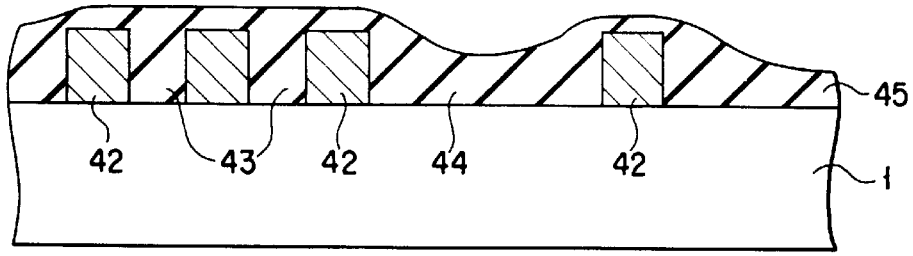

Subsequently, the $SiO_2$ film 205 is polished or scraped until it shows a cross section as illustrated in FIG. 19F. A polishing apparatus as shown in FIG. 3 is normally used for the polishing operation. This apparatus comprises a turntable 502, a polishing cloth 504 and a polishing slurry feeding pipe 503 whose front end is located at the center of the polishing cloth 504. As the turntable 502 is rotated counterclockwise around its axis as indicated by an arrow at a rate of 100 rpm, the polishing slurry is fed onto the polishing cloth 504 from the front end of the pipe 503. A wafer 1 is pressed against the polishing cloth 504 by a load of 40 kgf while it is rotated with the turntable in the sense as indicated by the arrow also at a rate of 100 rpm. The polishing slurry is a suspension prepared by dispersing powder containing particulate cerium oxide into water, the particles having an average diameter of 1.2 μm and a maximum diameter of 4.0 μm and being obtained by crushing and sintering bastnaesite. The powder contains cerium oxide by about 50 wt % and oxides of other rare earth metals by about 37 wt %. Table 1 below lists the contents of the powder used in an example.

TABLE 1

| Particulate $CeO_2$ (ICP Mass/emission spectrochemical analysis) | |
|---|---|
| Impurity concentration | 100,000– | Ce, La |
| | 10,000–100,000 | Pr |
| | 1,000–10,000 | Ca, P, S, Fe, Sr, Nd, Sm, Eu, Gd, Th |
| | 100–1,000 | Al, Si, Mn, Y, Nb, Tb, Dy, Pb |
| | 10–100 | Na, Li, Cr, Zr, Sb, U |
| | 1–10 | Ba, Co, Ni, Mo, W |
| | –1 ppm | B, Ru, Pd, Ag, Cd, In, Sn, Te, I, Cs, Re, Os, Ir, Pt, Au, Hg, Tl, Bi |

After polishing the surface of the insulating film with a polishing slurry containing cerium oxide, it was found to have been completely planarized. When observed through a differential interference type microscope, it showed no scars on the surface.

In another example where a polishing slurry of suspension prepared by dispersing a powdery material into water by 1 wt % was used, the powdery material containing cerium oxide particles with an average diameter of 2.5 μm and a maximum diameter of 12.0 μm by 1 wt % into water, the surface of the insulating film was found to have been completely planarized, although it showed four scars per 10 $cm^3$ when observed through a differential interference type microscope.

In still another example where a polishing slurry of aqueous suspension prepared by dispersing a powdery material into water by 1 wt % was used, the powdery material containing cerium oxide particles having an average diameter of 2.5 μm and a maximum diameter of 12.0 μm and produced by crushing and sintering bastnaesite in a manner as described above, the surface of the insulating film showed a scar per 10 $cm^3$ when observed through a differential interference type microscope.

From the above examples, it will be understood that an insulating film of a semiconductor device can be completely planarized by polishing its surface with a polishing slurry containing cerium oxide and that appearance of scars on the surface can be effectively prevented if the polishing slurry contains only small particles preferably having a maximum diameter of less than 4 μm and by using soft particles obtained by appropriately adjusting the condition where the raw material is sintered.

Table 2 below shows the result of an impurity analysis carried out by using the technique of atomic absorption spectrometry in an example where a silicon oxide film having a film thickness of 1 μm and prepared by oxidizing silicon by heat and a silicon oxide film having a film thickness of 1 μm and containing phosphor and boron to a high concentration (hereinafter referred to as BPSG) were polished to reduce the thickness by 0.5 μm with a polishing slurry of aqueous suspension prepared by dispersing particles into water by 1 wt %, the particles containing cerium oxide and having an average particle diameter of 2.5μ and a maximum particle diameter of 12.0 μm. For reference, the result of a polishing operation using Compol-80 is also shown.

TABLE 2

| Polished film | Polishing slurry | Na | K | Fe | Ce |
|---|---|---|---|---|---|
| Thermally oxidized film | not polished (ref) | 2.0 | 2.0 | 0.5 | — |
| Thermally oxidized film | Compol-80 | 36.0 | 6.0 | 24.5 | — |
| Thermally oxidized film | cerium oxide | 2.0 | 2.0 | 0.5 | 1 or less |
| BPSG | not polished (ref) | 6.5 | 3.0 | 9.0 | — |
| BPSG | Compol-80 | 1000 or above | 9.0 | 35.0 | — |
| BPSG | cerium oxide | 7.0 | 3.0 | 11.0 | 1 or less |

As it is clear from Table 2 above, the thermally oxidized silicon film polished by Compol-80 shows a level of sodium contamination higher than that of the unpolished silicon film tested for reference (or the levels normally quoted in reference books) by an order of magnitude and the BPSG film polished by Compol-80 shows a level of sodium contamination higher than that of unpolished silicon film by two order of magnitude.

To the contrary, both the thermally oxidized silicon film and BPSG film polished by the cerium oxide containing polishing slurry are not contaminated by sodium any more than the unpolished silicon films (showing the levels of contamination normally quoted in reference books). This holds true for the other contaminant elements. As for cerium, the cerium contamination levels of the films treated by the cerium oxide containing polishing slurry were less than $1 \times 10^{10}$ atoms/cm$^2$. Although the cerium oxide containing polishing slurry was prepared by crushing and sintering bastnaesite and not treated to remove alkali metals, the insulating films were not contaminated by alkali metals after having been polished by the slurry, proving that the use of such a polishing slurry does not adversely affect the semiconductor devices polished by such a slurry.

Table 3 below shows the rates of polishing a silicon oxide film obtained by thermally oxidizing silicon, a silicon nitride film and a BPSG film with a polishing slurry of aqueous suspension prepared by dispersing particles into water by 1 wt %, the particles containing cerium oxide and having an average particle diameter of 2.5μ and a maximum particle diameter of 12.0 μm. For reference, the results obtained by polishing identical specimens with Compol-80, a basic polishing slurry of aqueous suspension prepared by dispersing silica particles having a diameter of 12 nm by 5 wt % into water, a slurry obtained by adding ammonia by 10 wt % to the basic polishing slurry and another slurry obtained by adding sodium hydroxide by 0.2 wt % to the basic polishing slurry are also listed in Table 3.

TABLE 3

| Polishing slurry/polished film | SiO$_2$ film | SiN film | BPSG film |
| --- | --- | --- | --- |
| cerium oxide | 1,000 | 300 | 1,200–1,300 |
| Compol-80 | 110 | 40 | 200 |
| φ12 nm SiO$_2$ 5 wt % suspension | 6 | | |
| φ12 nm SiO$_2$ 5 wt % plus NH$_3$ 10 wt % suspension | 18 | | |
| φ12 nm SiO$_2$ 5 wt % plus NaOH 0.2 wt % suspension | 50 | | |

Unit of polishing rate [nm/min]

As listed on Table 3, the rate of polishing with Compol-80 a silicon oxide film obtained by oxidizing silicon by heat was 110 nm/min, whereas that of polishing an identical silicon oxide film with the basic polishing slurry of aqueous suspension containing silica particles having a diameter of 12 nm by 5 wt % was as low as 6 nm/min. The polishing rate of the polishing slurry obtained by adding sodium hydroxide by 0.2 wt % to the basic slurry was as high as 50 nm/min, while that of another polishing slurry obtained by adding ammonia by 10 wt % to the basic slurry was 18 nm/min, showing that the effect of adding ammonia was not as remarkable as that of adding sodium hydroxide. The rates of scraping or polishing a silicon nitride film and a BPSG film with Compol-80 were respectively 40 nm/min and 200 nm/min.

Thus, for instance, it takes approximately 5 minutes to remove a silicon oxide film obtained by thermally oxidizing silicon and having a thickness of 500 nm from the surface of a semiconductor device by polishing with Compol-80 and approximately ten minutes to remove the silicon oxide film with the polishing slurry of aqueous suspension containing silica particles having a diameter of 12 nm by 5 wt % and sodium hydroxide by 0.2 wt %, while it takes approximately 30 minutes to remove the silicon oxide film with the polishing slurry containing ammonia by 10 wt %, proving that the polishing technique involving the use of any of these polishing slurries is a rather time consuming one.

Contrary to this, when a polishing slurry of aqueous suspension containing cerium oxide particles having an average diameter of 2.5 μm and a maximum diameter of 12.0 μm by 1 wt % is used, remarkably high polishing rates of 300 nm/min and 1,200 to 1,300 nm/min are achieved respectively for a silicon nitride film and a BPSG film so that these films can be removed in 0.5 and 2 minutes respectively if they have a thickness of 500 nm. Thus, this polishing slurry is very promising from the view point of industrial applications in terms of film scraping/polishing rate.

While the polishing slurry used in the above examples was prepared for the purpose of the invention by crushing and sintering bastnaesite to produce a powdery material containing cerium oxide and disperse the powdery material in water and contained cerium oxide by 50 wt % and oxides of other alkali metals by 37 wt %, for the purpose of the present invention, a polishing slurry containing cerium oxide may be prepared from any other appropriate materials by using any other appropriate technique and the suspension may contain those ingredients to different concentrations. While the insulating films polished by the above polishing slurry were silicon oxide films obtained by thermally oxidizing silicon, the polishing slurry may also be effectively used for insulating films of other types such as silicon oxide films obtained by chemical vapor phase expitaxy and silicon nitride films as well as insulating films comprising a conductive film as part thereof.

As is obvious from the above examples, insulating films such as silicon oxide films and silicon nitride films can be scraped and polished at an enhanced rate by a cerium oxide containing polishing slurry. Advantageously, the use of such a polishing slurry does not contaminate the inside of the film with alkali metals. Still advantageously, an insulating film having undulations on the surface can be effectively polished to become planar without producing scars on the surface when such a polishing slurry is used. Thus, the use of such a polishing slurry is feasible for practical applications in the field of polishing insulating films in the process of manufacturing semiconductor devices as it solves the problems identified in the above description of this specification.

FIGS. 20A through 20C schematically illustrate a semiconductor device in cross section in different steps of planarizing its insulating film interlayer in a mode of carrying out the present invention which is different from that of FIGS. 19 through 19F. After forming an insulating film 212 on a semiconductor device 210 comprising a semiconductor substrate 201 to cover the entire surface of the substrate, the insulating film is polished or scraped on a polishing apparatus having a configuration as illustrated in FIG. 3 to produce a planar surface as shown in FIG. 20C. The polishing slurry used for this operation in an example contained CeO$_2$ and H$_2$O as major ingredients along with impurities such as Na, Mg, Al, K, Ca, Ti, Cr, Fe, Ni, Zr, W, Pb, Th and U to a concentration less than 100 ppm. The concentration of each ingredient was determined by ICP mass spectroscopy.

It was proved that, by using a highly pure polishing slurry containing impurities only to a negligible extent, the semiconductor device can be effectively prevented from contamination by such impurities if the wafer of the device is brought in touch with the polishing slurry during the polishing operation or the latter is partly left on the surface of the wiring layer after the polishing operation. Table 4 below shows the levels of contamination of a silicon oxide film by impurities determined by atomic absorption spectrometry when it is polished by a method of the invention and a conventional method. As is apparent from Table 3, the concentrations of K, Al, Cr and Ni were below the detectable level and those of Na, Ca and Fe were practically negligible, or 2.3, 0.9 and 3.4×10¹⁰ atoms/cm² respectively which are by far lower than the corresponding levels for the conventional method, to make the semiconductor device practically free from the fear of contamination when the above described polishing mode of the present invention was used. Thus, with such a polishing mode, the semiconductor device does not require a protective film to be formed therein and therefore the overall process of manufacturing semiconductor devices can be simplified to boost the productivity of the process.

TABLE 4

| | Contaminant metal element | | | | | | |
|---|---|---|---|---|---|---|---|
| | Na | K | Ca | Al | Fe | Cr | Ni |
| This invention | 2.3 | — | 0.9 | — | 3.4 | — | — |
| Known method | 60 | 90 | 3.5 | 33 | 45 | 2.7 | | unit: $10^{10}$ atoms/cm²
—: below the detectable level

Still another mode of carrying out the method of polishing and planarizing an insulating film interlayer of a semiconductor device according to the invention will now be described by referring to FIGS. 21A through 21E illustrating schematically a semiconductor device in cross section in different steps of planarization.

Figure 21A:
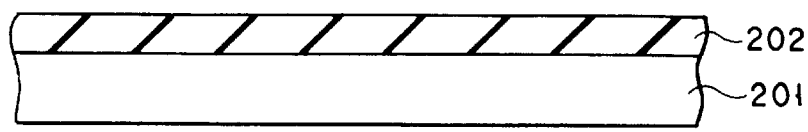
FIGS. 21A to 21E show cross section views of semiconductor structures at respective steps of a manufacturing method of a further embodiment according to the present invention.

Referring firstly to FIG. 21A, an $SiO_2$ film 202 is formed by deposition as a ground coat on an Si substrate 201 carrying required elements (not shown) thereon.

Figure 21B:
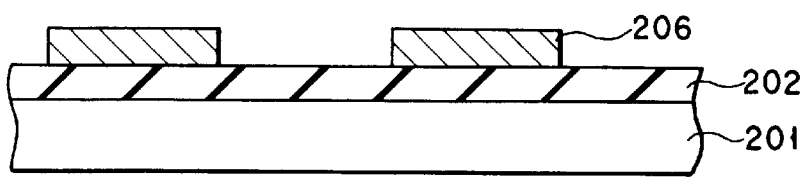

Then, as illustrated in FIG. 21B, an Al wiring layer 206 is selectively formed on the $SiO_2$ film 202 to a thickness X (FIG. 21D) of 1.1 μm.

Figure 21C:
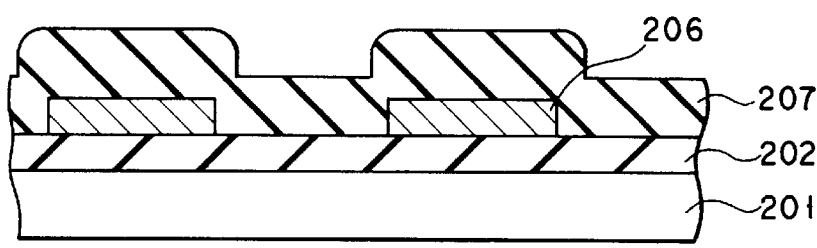

Thereafter, as shown in FIG. 21C, another $SiO_2$ film 207 is formed by deposition to a thickness of about 1.2 μm on the entire surface of the substrate including the areas carrying the Al wiring layer 206.

Figure 21D:
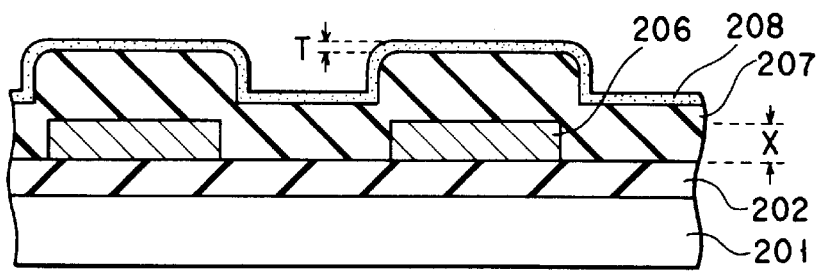

Subsequently, as shown in FIG. 21D, a polysilicon film (a stopper film) 208 which is more resistive than the $SiO_2$ film 207 to polishing is formed by deposition to a thickness T of approximately 0.1 μm on the $SiO_2$ film 207.

Then, the polysilicon film 208 and the $SiO_2$ film 207 are polished or scraped by using a polishing apparatus of the type as illustrated in FIG. 3. A polishing slurry of aqueous suspension containing cerium oxide by 1 wt % will typically be used.

In an example involving an experiment and still another mode of carrying out the polishing method of present invention, an $SiO_2$ film 207 could be completely planarized by using the above described polishing slurry.

Figure 21E:
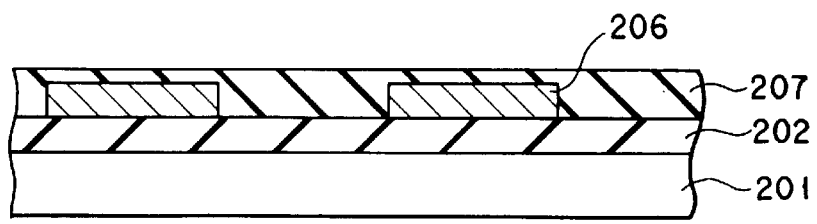
Figure 23:
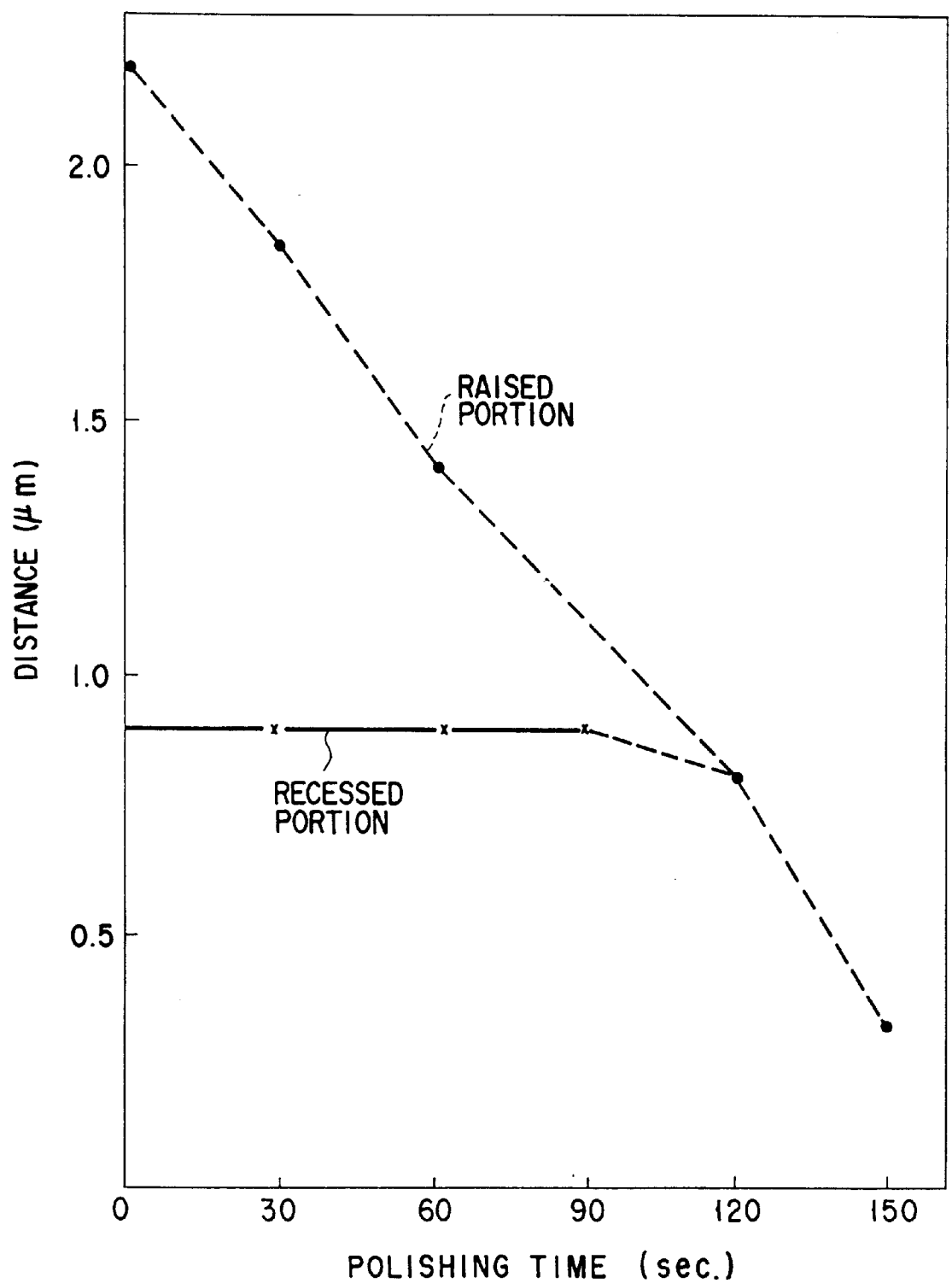

FIG. 22 shows a graph illustrating the result of an experiment carried out for the example. The specimen used for this example comprised 500 μm wide Al wires 206 formed at a pitch of 1,000 μm. In the graph of FIG. 22, the abscissa represents the elapse of time (seconds) after the start of a polishing operation as illustrated in FIG. 21E while the coordinate represents the distance between the surface of the first $SiO_2$ film 202 and that of the second $SiO_2$ film 207.

Before the start of the polishing operation, the distance between the surface of the projected or raised areas of the first $SiO_2$ film 202 where the Al wires 206 were located and that of the second $SiO_2$ film 207 (as indicated by a solid line in FIG. 22) and the distance separating the surface of the recessed areas of the first $SiO_2$ film 202 where there were no Al wires 206 from that of the second $SiO_2$ film 207 (as indicated by a broken line in FIG. 22) were same and equal to 1.1 μm which was also the thickness of the Al wires 206.

As the polishing operation began, the polysilicon film 208 was polished firstly at the projected areas and, after about 30 seconds, its was completely removed at these areas to expose the $SiO_2$ film 207 thereat. The polysilicon film 208 was removed preferentially at the projected areas simply because the load applied to the film 208 was greater at the projected areas than at the recessed areas.

Then, the $SiO_2$ film 207 started to be polished at the areas where there was no polysilicon film 208, while polysilicon film 208 was further polished at the recessed areas. However, the polysilicon film 208 remained at the recessed areas without being completely removed therefrom while the $SiO_2$ film 207 was being polished because the load applied to the recessed areas was smaller than that applied to the projected areas.

As the operation of polishing the $SiO_2$ film 207 proceeded at the projected areas, the undulations on the surface of the $SiO_2$ film 207 became less conspicuous. When about 100 seconds passed since the start of the polishing operation, the recessed areas of the polysilicon film 208 completely disappeared to produce a substantially planar surface for the $SiO_2$ film 207. In other words, the $SiO_2$ film 207 was made planar with a minimum amount of scraping work and without giving rise to a "dishing" phenomenon.

After the $SiO_2$ film 207 was made planar in 100 seconds after the start of the polishing operation, no undulations appeared and the polishing went ever since on smoothly on a planar surface of the $SiO_2$ film 207.

In the above described example, the use of a polysilicon film 208 which was formed on the $SiO_2$ film and more resistive to scraping than the $SiO_2$ film made it possible to planarize the surface of the $SiO_2$ film with minimum amount of polishing work. Additionally, once the $SiO_2$ film 207 was planarized, it remained the planar surface condition if the polishing operation continued thereat.

While a polysilicon film 208 having a thickness of 0.1 μm was used in this example, a wide margin of thickness may be afforded to such a polysilicon film because it is polished at recessed areas at a rate corresponding to the polishing rate for projected areas. As a matter of fact, a similar effect of planarization was obtained in a supplementary experiment using polysilicon films that were 0.08 μm and 0.15 μm thick.

The above describe mode of carrying out the method of the present invention is highly feasible for practical applications since it affords a wide margin of film thickness for the polysilicon film 208 and does not require the formation of a stopper film such as a silicon nitride film normally which is used for known conventional methods to make them complicated and costly.

Additionally, as a result of a series of research studies carried out by the inventors of the present invention, it was found that any $SiO_2$ films to be polished show a performance similar to the one illustrated in FIG. 22 regardless of the width and the pitch of arrangement of the wires.

FIGS. 23 through 27 are graphs that are similar to the graph of FIG. 22 and illustrate the changes with polishing time of the distance between the surface of the projected areas of the ground layer of a $SiO_2$ film and the surface of the other $SiO_2$ film to be treated and the distance separating the surface of the recessed areas of the ground layer of the $SiO_2$ film from that of the $SiO_2$ film to be treated for the wire width/the wiring pitch of 2, 50, 100, 200 and 500 respectively.

It is understood from FIGS. 23 through 27 that the SiO$_2$ film to be treated is not polished at the recessed areas of the surface in the initial stages of the polishing operation and then begins to be polished at a rate equal to that at which the film is polished at the projected areas of the surface when a certain period of time has passed since the start of the operation.

It should be noted that various modifications can be made to the above described mode of carrying out the invention. For instance, while the target film to be treated is an SiO$_2$ film and the stopper film was a polysilicon film in the above description, they may be films made of materials other than those described above. An appropriate polishing slurry other than the one containing cerium oxide may be used.

Table 5 below shows a list of various polishing slurries (a 1 wt % suspension of cerium oxide and colloidal silica containing dispersed SiO$_2$ particles) and target films (an undoped SiO$_2$ film, an SiN film, a polysilicon film, a carbon film and an SiO$_2$ film containing B and P) as well as their possible combinations and corresponding rates of polishing the target film.

TABLE 5

| Target film polishing slurry | Polishing Rate (nm/min) | | | | |
|---|---|---|---|---|---|
| | SiO$_2$ film (undoped) | SiN film | Poly-silicon film | carbon film | SiO$_2$ film (con. B&P) |
| Cerium oxide suspension (1 wt %) | 700 | 300 | 120 | <50 | 930 |
| Colloidal silica | 160 | 500 | 330 | <50 | 550 |

From Table 5 above, it will be understood that, when a cerium oxide suspension and an undoped SiO$_2$ film are used respectively for the polishing slurry and the target film, the stopper film showing a low polishing rate can be selected from a polysilicon film, a silicon nitride film and a carbon film.

While an insulating film was the target film to be treated in the above description, the method of the present invention can also be applied to a metal film. If such is the case, a W film and a Cu film will be formed sequentially on the entire surface of an SiO$_2$ film carrying grooves thereon by deposition as a film to be polished and a film resistive to polishing respectively. With such an arrangement, the polishing slurry to be used can have a wide choice because the Cu film is polished at a rate sufficiently lower than the rate at which the W film is polished. Likewise, the method of the present invention can be applied to devices comprising but a semiconductor substrate other than an Si substrate or a semi-insulating substrate.

As described heretofore in detail, the above mode of carrying out the method of the present invention is not accompanied by the problem of dishing nor any additional processing steps to planarize a film because the film to be polished is planarized by polishing the film to be planarized simultaneously with a stopper film that has been formed on the film to be planarized.

FIG. 28 shows a cross sectional view of a semiconductor device which is manufactured by a further manufacturing method according to the present invention. A method of manufacturing the semiconductor device shown in FIG. 28 is described hereinafter with reference to FIGS. 29A to 29C.

FIGS. 29A to 29C show semiconductor structures at respective steps of manufacturing the semiconductor device shown in FIG. 28. The finished semiconductor structure shown in FIG. 29C is the same as that as shown in FIG. 28.

Referring firstly to FIG. 29A, a thermally oxidized film 202 is formed by oxidizing the surface of a substrate 201 which is normally a semiconductor substrate. Then, a conductive layer 203 typically made of polysilicon is formed on the thermally oxidized film 202. Subsequently, a resist layer 204 is selectively formed on the conductive layer 203 and the thermally oxidized film 202, the conductive layer 203 and the semiconductor substrate 201, if required, are selectively removed by using said resist layer 204 as a mask to produce recesses or recessed portions 215 and 216 in the form of trenches. The recess 216 is a trench wider than the recesses 215.

Thereafter, as illustrated in FIG. 29B, an insulating film 217 is formed by a known CVD technique on the entire surface of the device including the recesses 215 and 216. Note that, in FIG. 29B, the semiconductor substrate 201 is also selectively removed so that the recesses 215 and 216 extend deep into the substrate 201. The insulating film 217 has a thickness greater than the height of the recesses 215 and 216.

Then, a polishing or scraping operation is started from the surface of the insulating film 217 by a chemical mechanical polishing technique. More specifically, the wafer is held upside down by a holder and pressed against a polishing cloth rotating on a turntable, to which a polishing slurry containing fine particles of cerium oxide is constantly fed, so that the insulating film 217 may be polished off first. Alternatively, the wafer may be held in an upright position or housed in a wafer carrier so that it may be polished at the top and bottom simultaneously. Since the conductive film 203 which is a polysilicon film operates as a stopper that retards the rate at which it is polished, the polishing operation needs to be stopped at this stage to see that the entire surface of the device has been completely planarized and the recesses 215 and 216 have disappeared as shown in FIG. 29C.

The material to be used for the conductive film 203 may not necessarily be polysilicon and may alternatively be selected from a group of materials including silicide, carbon, amorphous silicon, titanium nitride and multilayer structures of any of these substances if the surface of the formed film operates as a stopper for the polishing operation.

Colloidal silica is most popularly used for the polishing slurry. This is mainly because any commercially available colloidal silica is maintained to a weak alkaline condition to show a pH value of around 10. With any conventional polishing methods, no satisfactory polishing rate will be achieved for the insulating film if the pH value is significantly shifted from that level. With the above described mode of carrying out the invention, on the other hand, a satisfactory polishing rate is ensured for the insulating film when the polishing slurry shows a neutral pH level of around 7 only if the slurry contains fine cerium oxide particles. One of the advantages of using a polishing slurry showing a neutral pH level is that, if the conductive fiim that operates as a stopper has one or more than one tiny holes and an easily corrodible layer such as an aluminum wiring layer is disposed thereunder, a neutral polishing slurry would not dissolve, if partly, the under layer to cause it to flow out.

Table 6 below lists different conductive films that may be used for the purpose of the present invention and the rates at which they are polished as expressed in absolute and relative terms.

TABLE 6

| Type of film | Polishing rate (A/min) | Rate selectivity heat-oxidized film = 1) |
|---|---|---|
| BPSG | 9,300 | 0.68 |
| Polysilicon | 1,100 | 5.7 |
| SiN | 2,400 | 2.6 |
| Heat-oxidized film | 6,300 | 1 |

From the above table, it will be found that, when the insulating film is an oxide film in particular, a polysilicon film having a rate selectivity of 5.7 may suitably be used as a conductive film that operates as a stopper when the oxide film is polished. If a non conductive film is required as a polishing stopper, then a silicon nitride film having a rate selectivity of 2.6 will provide a good choice, although the use of a polishing slurry having a rate selectivity of greater than 5 is more preferable.

When a silicon nitride film is used for the insulating film, in particular, the use of a polishing slurry as a polishing stopper will be a good choice because the rate selectivity of a polysilicon film is approximately 2.2 if that of a silicon nitride film is 1.

If a conductive film is used as a polishing stopper, it preferably shows a large rate selectivity, most preferably greater than 5, relative to that of the target layer to be polished.

Thus, the insulating film of a semiconductor device of the type under consideration can suitably be polished by chemical mechanical polishing using a polishing slurry containing cerium oxide if a thermally oxidized film is laid under the conductive film.

Now, still another mode of carrying out the present invention will be described by referring to FIGS. 30A through 30C, which illustrate different steps of planarizing a semiconductor device.

Referring firstly to FIG. 30A, a wiring layer 222 is formed on a supporting substrate 201 which is normally a semiconductor substrate and a conductive film 203 typically made of polysilicon is formed on the wiring layer 222. Subsequently, a resist layer 204 is selectively formed on the conductive layer 203 and the thermally oxidized film 202 and the conductive layer 203 are selectively removed by using the resist layer 204 as a mask to produce recesses 215 and 216. The recess 216 is a trench wider than the recesses 215. Thereafter, as illustrated in FIG. 30B, an insulating film 217 is formed by a known CVD technique on the entire surface of the device including the recesses 215 and 216. The insulating film 217 has a thickness greater than the height of the recesses 215 and 216. Then, a polishing or scraping operation is started from the surface of the insulating film 217 by a chemical mechanical polishing technique. More specifically, the wafer is held upside down by a holder and pressed against a polishing cloth rotating on a turntable, to which a polishing slurry containing fine particles of cerium oxide is constantly fed, so that the insulating film 217 may be polished first. Alternatively, the wafer may be held in an upright position or housed in a wafer carrier so that it may be polished at the top and bottom simultaneously. Since the conductive film 203 which is a polysilicon film operates as a stopper layer that retards the rate at which it is scraped, the polishing operation needs to be stopped at this stage to see that the entire surface of the device has been completely planarized and the recesses 215 and 216 have disappeared as shown in FIG. 30C.

Thus, the insulating film of a semiconductor device of the type under consideration can suitably be polished by chemical mechanical polishing using a polishing slurry containing cerium oxide if a thermally oxidized film is laid under the conductive film.

Now, still another mode of carrying out the present invention will be described by referring to FIGS. 31A and 31B, which illustrate different steps of planarizing a semiconductor device.

Referring firstly to FIG. 31A, a wiring layer 222 comprising a number of wire sections is selectively formed on a supporting substrate 201 which is normally a semiconductor substrate and an insulating film 223 and a conductive film 224 are sequentially formed on the wiring layer 222. subsequently, the insulating film 223 and the conductive layer 224 are selectively removed to produce recesses 225, where the wiring layer 222 is exposed. Then, an aluminum wiring layer 225 is formed on the conductive film 224 and the exposed wiring layer 222 to a thickness greater than the depth of the recesses 222. Then, a polishing or scraping operation is started from the surface of the wiring layer 226 by using a chemical mechanical polishing technique. More specifically, the wafer is held upside down by a holder and pressed against a polishing cloth rotating on a turntable, to which a polishing slurry containing fine particles of cerium oxide is constantly fed, so that the wiring layer 226 may be polished first. Alternatively, the wafer may be held in an upright position or housed in a wafer carrier so that the wafer may be polished at the top and bottom simultaneously. Since the conductive film 224 operates as a stopper layer that retards the rate at which it is polished, the polishing operation needs to be stopped at this stage to see that the entire surface of the device has been completely planarized and the recesses have disappeared or the wiring layer 226 remains only in the recesses 225 as shown in FIG. 31B.

The conductive layer 224 is preferably made of polysilicon as it effectively operates as a stopper.

While a conductive layer 224 is formed on an insulating film 223 so that the former may operates as a stopper layer when the device is polished in the above mode, the use of such a conductive layer 224 may be omitted if the surface of the insulating film 222 subjected to a polishing operation functions as a stopper.

Note that the wiring layer can be chemically and mechanically polished in the above described mode.

Now, still another mode of carrying out the present invention will be described by referring to FIGS. 32A through 32C, which illustrate different steps of planarizing a semiconductor device.

Referring firstly to FIG. 32A, a number of projections 231 including a number of elements such as a semiconductor polycrystalline layer, capacitors and electrodes are formed on a substrate 201 which is normally a semiconductor substrate and then a first insulating film 232 is formed on the entire surface of the semiconductor substrate 201 carrying the patterned projections 231 to produce a flat surface. Thereafter, a wiring layer 234 is selectively formed on the first insulating film 232 and then an amorphous silicon layer 233A which is to be transformed to a second insulating film is formed by deposition on the entire surface of the first insulating film 232 including the areas where the wiring layer 234 is formed. Subsequently, a third insulating film 235 is formed on the amorphous silicon layer 233A to a height at least greater than that of the wiring layer 234. Then, the device is chemically and mechanically polished or scraped, starting from the surface of the third insulating film 235. More specifically, the wafer is held upside down by a holder and pressed against a polishing cloth rotating on a turntable, to which a polishing slurry containing fine particles of cerium oxide is constantly fed, so that the third insulating film 235 may be polished first. Alternatively, the wafer may be held in an upright position or housed in a wafer carrier so that the wafer may be polished at the top and bottom simultaneously. As illustrated in FIG. 32B, the amorphous silicon film 233A which is to be transformed to a second insulating film operates as a stopper layer that retards the rate at which it is polished so that the layer 233A and the third insulating film 235 are completely planarized. Since the amorphous silicon layer 233A is conductive, it is oxidized and transformed to a second insulating film 233 after the polishing operation as illustrated in FIG. 32C.

Amorphous silicon can be made to take the form of a film at temperature below 400° C. This means that the amorphous silicon film can maintain its form even when an aluminum wiring layer 234 is laid under the second insulating film 233 in the above mode of operation. Thus, this mode of carrying out the invention is particularly suited to produce a multilayer structure in a situation where polysilicon films that need to be formed at high temperature around 800° C. may not be used. The second insulating film 233 can be formed as a stopper layer on the wiring layer 234 without any technical difficulties.

The above described mode of operation may also be advantageously used in other than a multilayer environment where polysilicon wires and/or electrodes are used in place of a wiring layer 234 particularly when an insulating film that covers the polysilicon wires and/or the electrodes needs to be planarized because, if such is a case, the polysilicon wires and/or the electrodes themselves operate as a stopper to allow simplification of the entire manufacturing process.

Since any of the modes of operation of planarizing a semiconductor device described above do not involve etching or reflow, the device can be completely planarized regardless of the size of the recesses and projections it carries on the surface. Additionally, since a neutral polishing slurry containing cerium oxide is used, the layer underlying the one being polished is free from the fear of corrosion if touched by the slurry so the device can be safely polished from its projected areas until it is completely planarized.

Additionally, with the method of the present invention, semiconductor devices can be accurately polished to planarize the surface by forming a stopper layer typically made of an insulating film at any level at which the polishing operation desirably needs to be stopped in a controlled manner. Thus, the device will be completely planarized even if it originally carries a number of projections and recess on the surface so that a subsequently patterning operation will be advantageously carried out. Specifically, when the device is subjected to a patterning operation for wiring in a subsequent step, it will be completely free from any possibility of producing thinned wires as a result of differences in the focal depths of the optical system for optically exposing the device attributable to the undulations on the surface of the device. By, in particular, laying an insulating film directly on the electrodes of the device as a stopper layer, the device will not be protected against any possible adverse effects that the subsequent processing operations may exert on the device if the electrodes are surrounded by an even more complicated structure than those we see today as expected in the future. Then, consequently interlayer wiring operations as well as operations of forming interlayer insulating films may be carried out in an appropriately and accurately manner than ever to accommodate any requirements for higher integration and down-sizing in the future.

Additionally, since the method of the present invention is applicable to the operation of not only polishing insulating films but also wiring materials to expand the scope of applicability of the present invention.

Consequently, the method of the present invention can reduce the cost and raise the yield of manufacturing semiconductor devices.

The method of the present invention is also advantageous in that the stopper layer of the semiconductor device can be selected from conductive polysilicon films, high resistive amorphous silicon films and various silicide material films.

As understood from the foregoing, the method of the present invention enables planarization of a semiconductor device in a neutral environment regardless of the size of the projections i.e. raised portions and recesses i.e. recessed portions to ensure a high yield and an enhanced reliability in the field of manufacturing semiconductor devices.

Now, a still another mode of carrying out the present invention will be described by referring to FIGS. 33A through 33J which illustrate different steps of planarizing an insulating film interlayer of a semiconductor device.

Figure 33A:
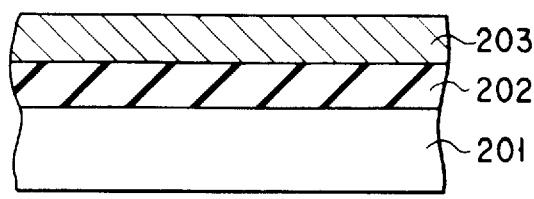
FIGS. 33A to 33J show cross section views of semiconductor structures at respective steps of a manufacturing method of a still further embodiment according to the present invention.

Referring firstly to FIG. 33A, an $SiO_2$ film 202 is formed to a thickness of 1 $\mu$m on the surface of a semiconductor substrate 201 on which semiconductor elements (not shown) are formed. Then, a 500 nm thick polysilicon film 203 is formed on the $SiO_2$ film 202.

Figure 33B:
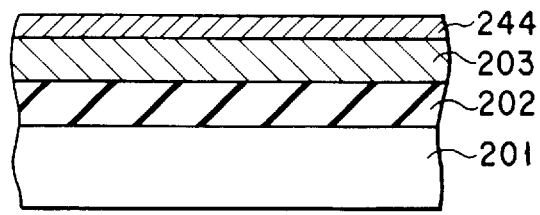

Thereafter, as illustrated in FIG. 33B, a 100 nm thick carbon film 244 is formed as a stopper layer on the polysilicon wiring film 203 in an Ar atmosphere by DC magnetron spattering, using a graphite plate as target. The conditions under which the carbon film 244 is formed include a pressure of 4 mTorr, a power supply rate of 3.5 W/cm$^2$ and an Ar flow rate of 40 SCCM. In an experiment conducted to examine the structure of a specimen of the carbon film 244 by X-ray diffraction, it was found that the film was amorphous or finely crystalline. The specific resistance of the film was 0.75 $\Omega$cm when measured by a four-probe method.

Figure 33C:
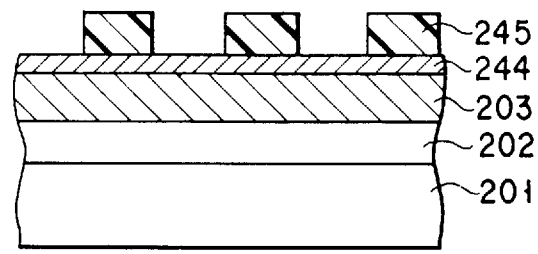

Then, as shown in FIG. 33C, photo resist is applied to the carbon film 244 to a thickness of 1.5 $\mu$m to form a photo resist (photo-sensitive resin) layer 245. Subsequently the photo resist 245 is exposed to light with a mask pattern (not shown) placed thereon and then subjected to a development operation to remove the exposed areas of the carbon film 244 and produce a photo resist pattern 245.

Figure 33D:
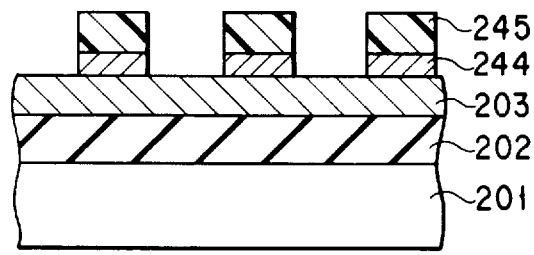
Figure 33E:
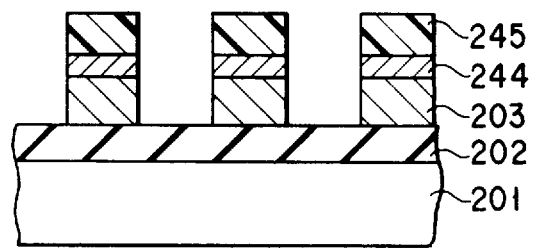

A patterning operation is then carried out on the carbon film 244 by means of RIE using $O_2$ gas and also using the photo resist pattern 245 as a mask as illustrated in FIG. 33D. Then, as shown in FIG. 33E, another patterning operation is carried out on the polysilicon wiring film 203 also by means of RIE but using $CF_4$ gas this time.

Figure 33F:
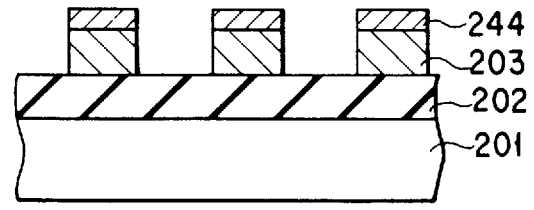
Figure 33G:
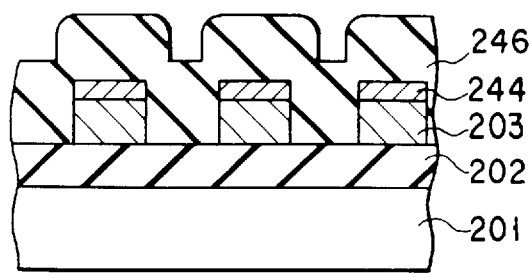

Then, as shown in FIG. 33F, the photo resist pattern 245 is removed by a down flow type asher in which microwaves are discharged in the gaseous mixture of $CF_4$ and $O_2$. Thereafter, as shown in FIG. 33G, a 1 $\mu$m thick $SiO_2$ film 246 is formed on the entire surface of the device as an insulating film interlayer. It would be understood that the surface of the $SiO_2$ film 246 is or uneven undulated to reflect the profile of the polysilicon wiring film 203. In other words, a groove is formed between any two adjacent areas of the $SiO_2$ film 246 located above the corresponding wire elements of the polysilicon wiring film 203. The undulations on the surface of the device need to be removed to planarize the surface of the device in the next step of the polishing operation.

Figure 33H:
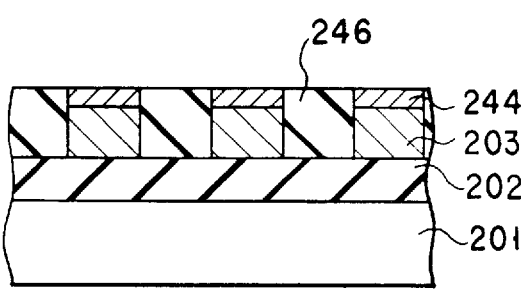

Now, the SiO$_2$ film 246 is polished or scraped to planarize the SiO$_2$ film 246. FIG. 33H illustrates how the device appears in cross section when it is planarized. The polishing and planarizing operation is carried out typically by using an apparatus as schematically illustrated in FIG. 3.

Referring to FIG. 3, a polishing slurry is fed to the center of the top surface of the turntable 502 by way of a polishing slurry feed pipe 503. The turntable is rotated at a rate of about 100 rpm. A polishing cloth 504 is fitted to the top surface of the turntable 502 and brought to contact with a wafer 1, which is pressed downward with a load of 40 kgf applied thereto by a holding device 501 rotating also at a rate of about 100 rpm.

The polishing slurry is an aqueous suspension prepared by dispersing SiO$_2$ particles having a diameter of 80 nm in water. The suspension contains SiO$_2$ particles by 20 wt % and its hydrogen ion concentration is constantly maintained to pH12.0 by appropriately adding sodium hydroxide whenever necessary.

In an experiment conducted on a sample wafer with the above identified parameters, it was proved that the surface of the SiO$_2$ film 246 and that of the carbon film 244 had been almost completely planarized as illustrated in FIG. 33H after a prescribed polishing operation. It was also proved, as illustrated in FIG. 33H, that the polysilicon wiring layer 203 underlying the carbon layer 244 had not been polished off at any spots on the 6-inch wafer and was completely covered by the carbon film 244. The carbon film 244 was found at least partly remaining on the wiring layer 203 when the polishing operation was over.

Figure 9A:
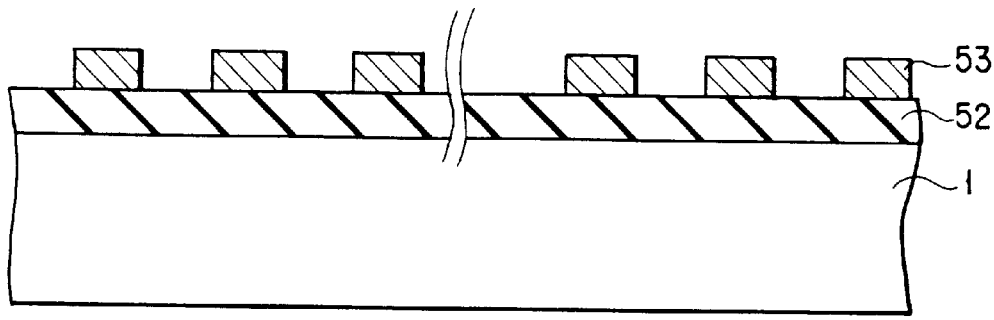
FIGS. 9A to 9C show cross section views of semiconductor structures at respective steps of a further conventional manufacturing method.
Figure 9B:
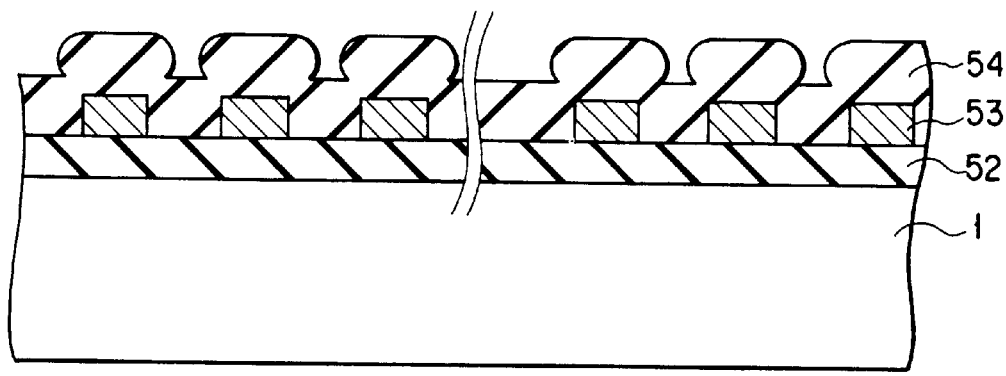
Figure 9C:
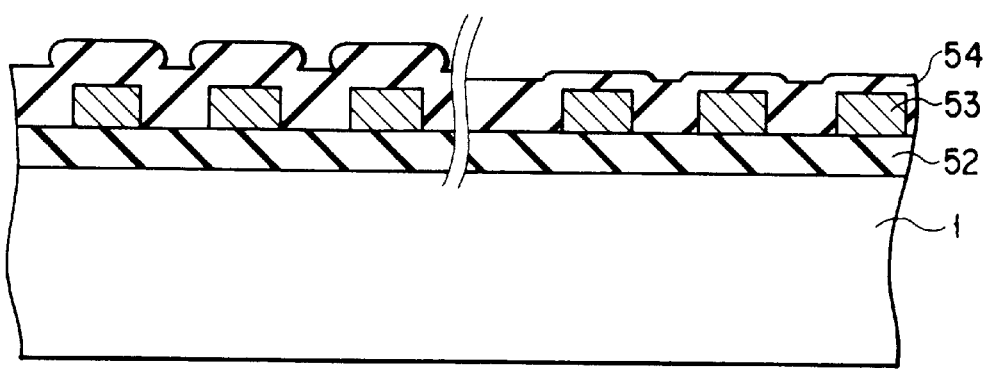
Figure 10A:
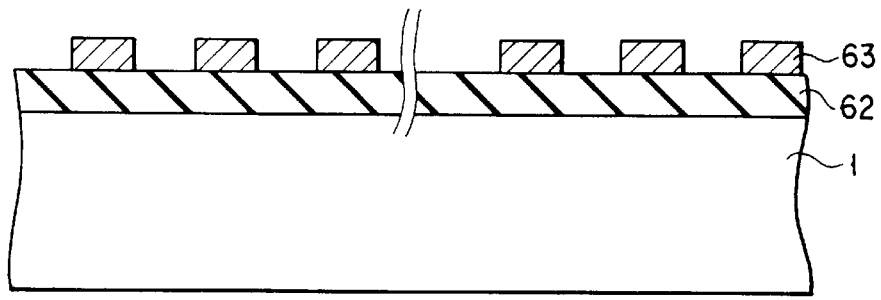
FIGS. 10A to 10D show cross section views of semiconductor structures at respective steps of a yet further conventional manufacturing method.
Figure 10B:
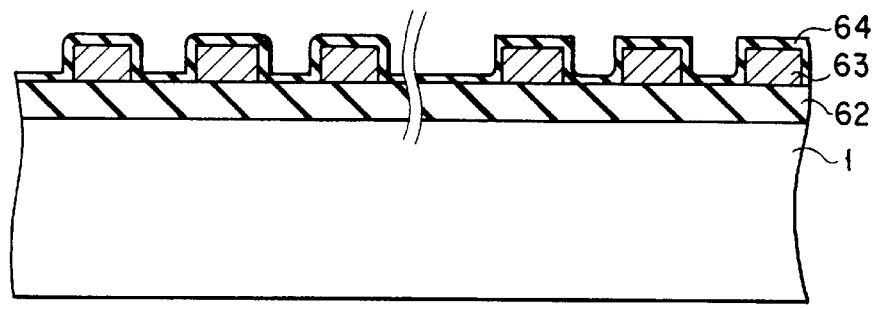
Figure 10C:
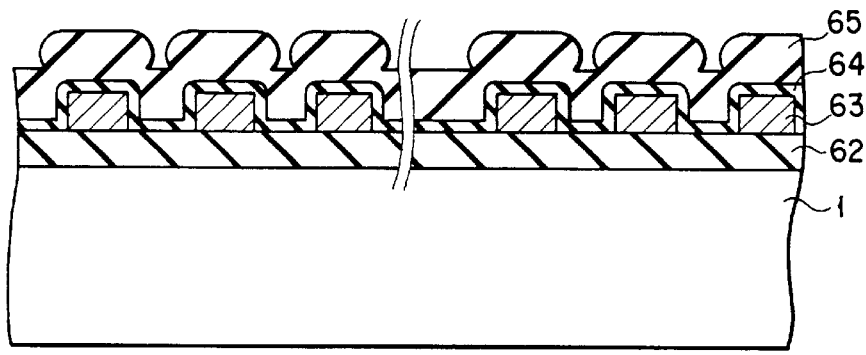
Figure 10D:
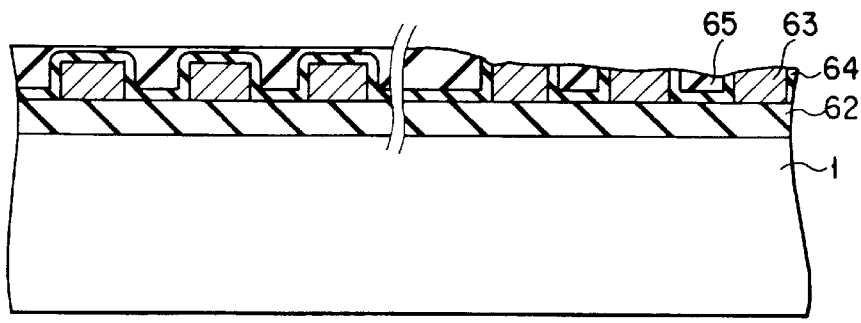
Figure 11A:
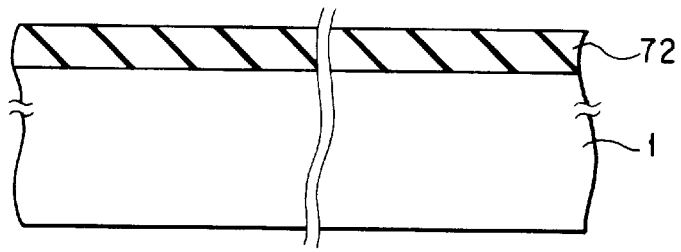
FIGS. 11A to 11C show cross section views of semiconductor structures at respective steps of a further conventional manufacturing method.
Figure 11B:
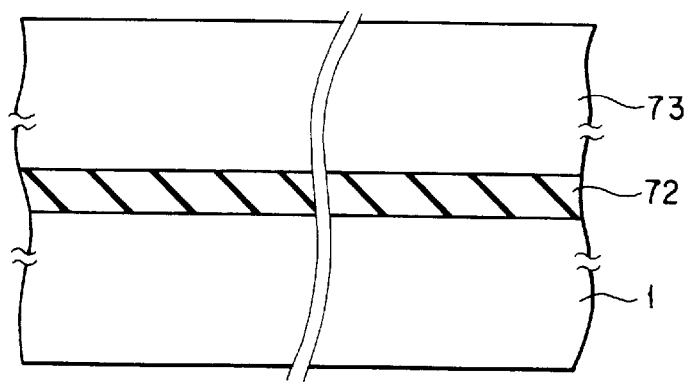
Figure 11C:
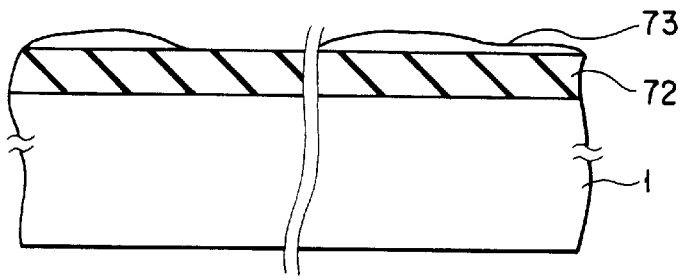
Figure 12A:
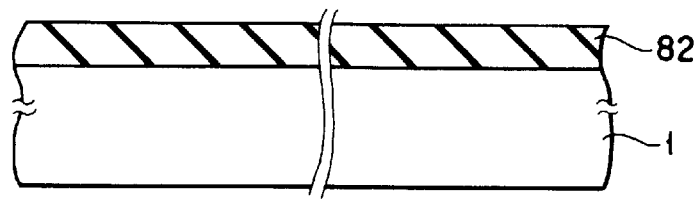
FIGS. 12A to 12E show cross section views of semiconductor structures at respective steps of a still conventional manufacturing method.
Figure 12B:
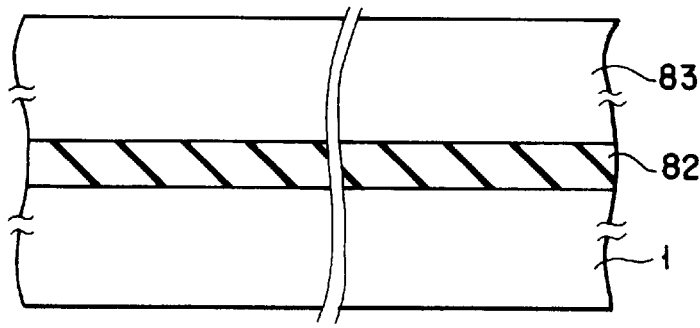
Figure 12C:
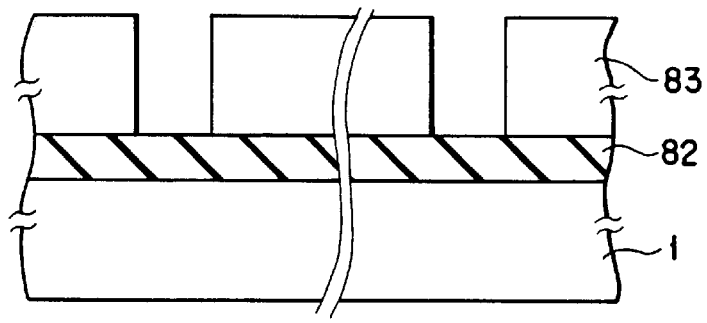
Figure 12D:
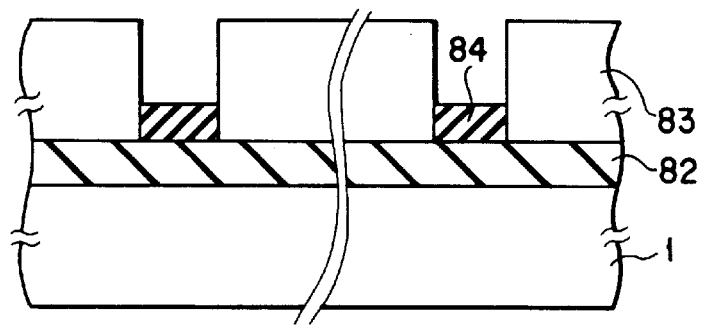
Figure 12E:
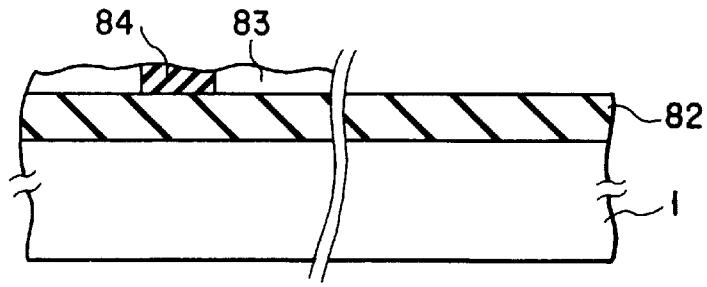
Figure 13:
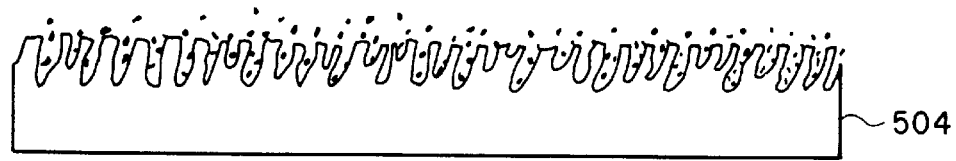
FIG. 13 shows enlarged schematic sectional view of a polishing cloth.
Figure 14:
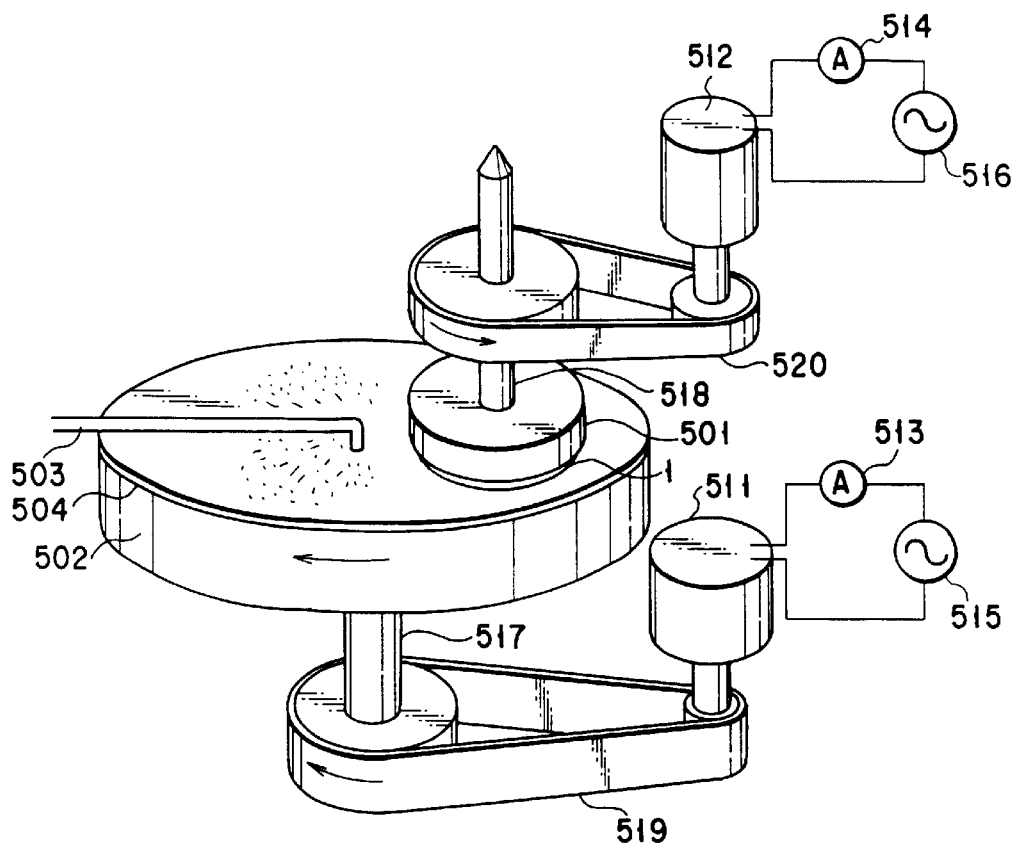
FIG. 14 shows a perspective view of a conventional polishing apparatus.
Figure 15:
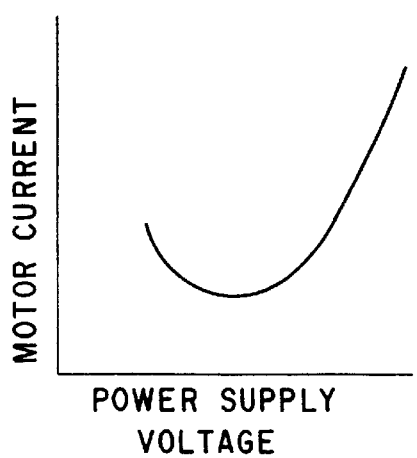
FIG. 15 shows a characteristic curve between power supply voltage and current through motor, of the polishing apparatus of FIG. 14.
Figure 16:
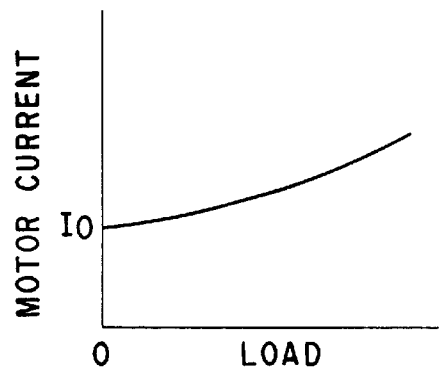
FIG. 16 shows a characteristic curve between load and current through motor, of the polishing apparatus of FIG. 14.
Figure 17:
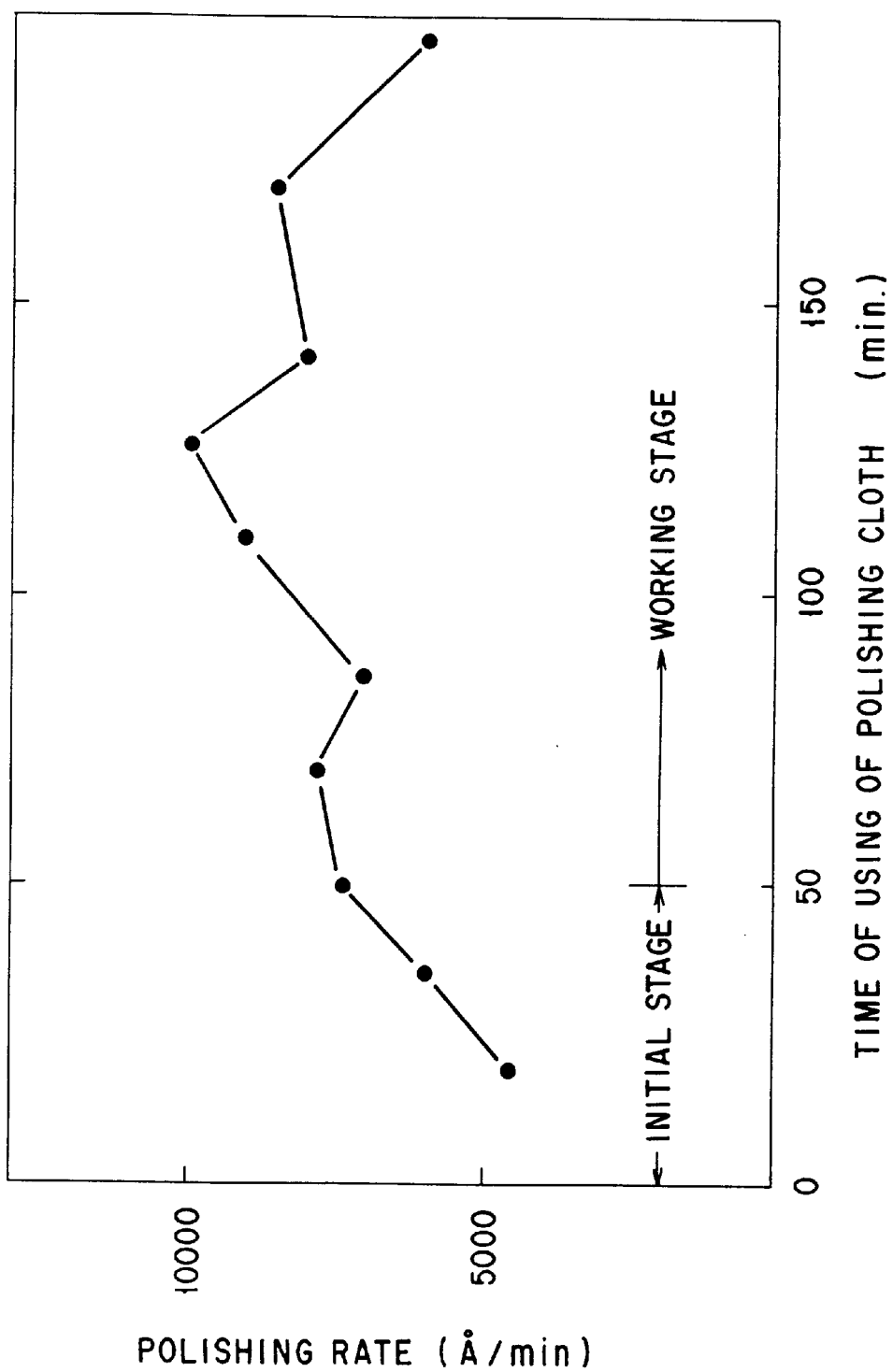
FIG. 17 shows a characteristic curve between time of using of polishing cloth and polishing rate.
Figure 33I:
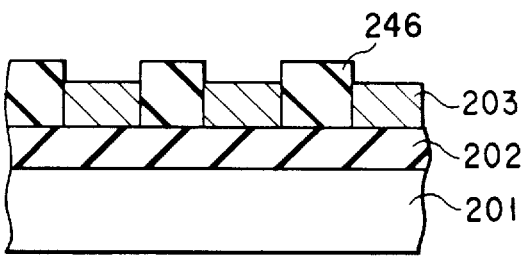
Figure 33J:
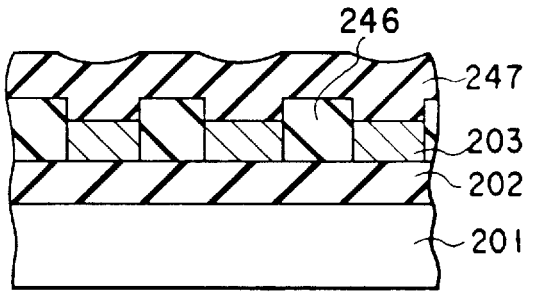

Thereafter, the carbon film 244 was removed in a barrel type O$_2$ plasma asher to show a cross section as shown in FIG. 33I. Subsequently, a 1 μm thick planar SiO$_2$ film 247 was formed as an insulating film interlayer as shown in FIG. 33J. It will be appreciated from FIG. 33J that unlike a conventional insulating film interlayer illustrated in FIG. 9C, the surface of the SiO$_2$ insulating film interlayer 247 is substantially flat over the entire area of the wafer, though it shows slight recesses of a height corresponding to the thickness of the carbon film 244 removed in the step of FIG. 33I.

The fact that the above described mode of carrying out the method of the invention comprises a step of forming a carbon film 244 on the polysilicon film 203 as a stopper layer prior to the start of polishing operation makes it possible to provide large polishing rates for the polysilicon film 203 and the SiO$_2$ film 246 which are the targets to be polished, on one hand, and the carbon film 244 functioning as a stopper layer, on the other hand, so that the operation of polishing these films may be terminated when the carbon film 244 is still partly remaining in position. Thus, the SiO$_2$ insulating film interlayer 247 can be made substantially flat over the entire surface area of the wafer.

Now, a still another mode of carrying out the present invention will be described by referring to FIGS. 34A through 34I which illustrate different steps of thinning and planarizing a silicon film of a thin film semiconductor device.

Figure 34A:
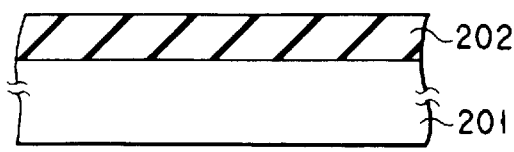
FIGS. 34A to 34I show cross section views of semiconductor structures at respective steps of a manufacturing method of a yet further embodiment according to the present invention.

Referring firstly to FIG. 34A, an 800 nm thick SiO$_2$ film 202 is formed on an Si substrate 201.

Figure 34B:
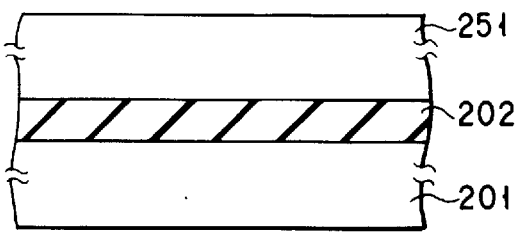

Then, as shown in FIG. 34B, another Si substrate 251 is heated to 800° C. and bonded to the first Si substrate 201 with the SiO$_2$ film 202 interposed therebetween.

Figure 34C:
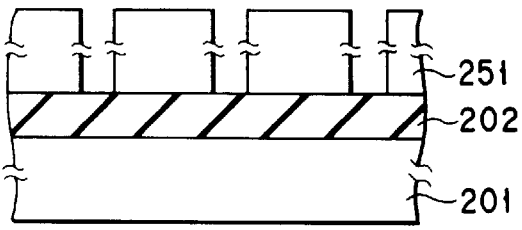

Thereafter, as shown in FIG. 34C, openings are formed through the second Si substrate 251 until the openings get to the surface of the SiO$_2$ film 202.

Figure 34D:
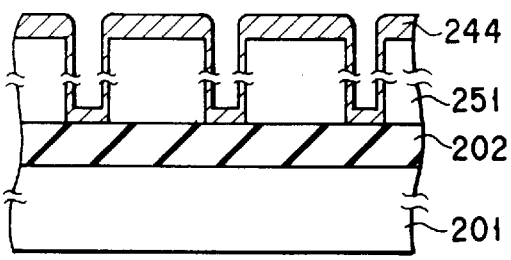

Subsequently, as shown in FIG. 34D, a carbon film 244 is formed on the entire surface of the Si substrate 251 to a thickness of 100 nm as a stopper layer in an Ar atmosphere by DC magnetron spattering, using a graphite plate as target.

Figure 34E:
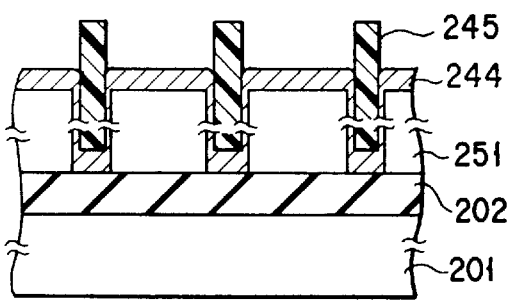

Then, as shown in FIG. 34E, photo resist is applied to the surface of the carbon film 244 to form a 1.5 μm thick photo resist (photo-sensitive resin) layer 245, which is then exposed to light with a mask pattern (not shown) placed thereon and thereafter subjected to a development operation to remove the exposed areas of the carbon film 244 and produce a photo resist pattern 245 defined by the opening formed through the Si substrate 251.

Figure 34F:
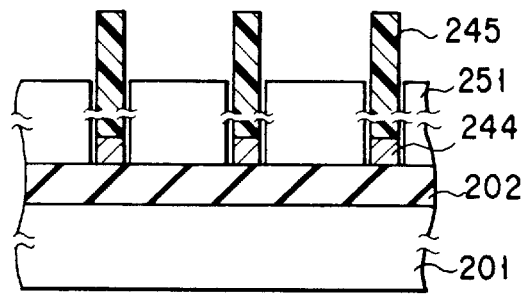
Figure 34G:
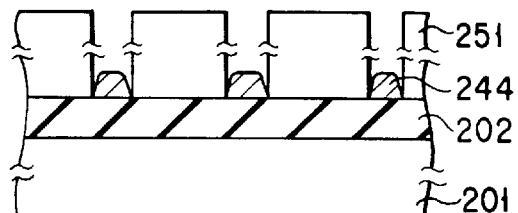
Figure 34H:
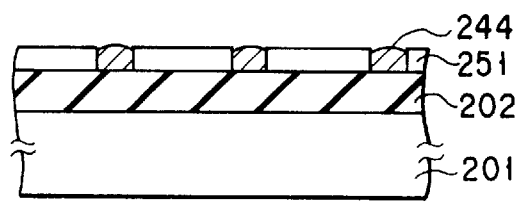
Figure 34I:
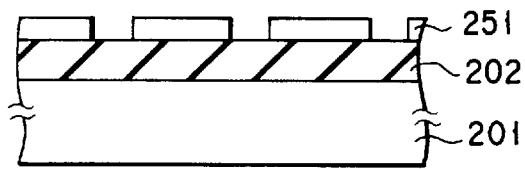

A patterning operation is then carried out on the carbon film 244 by means of RIE using O$_2$ gas and also using the photo resist pattern 245 as a mask as illustrated in FIG. 34F. Then, as shown in FIG. 34G, the photo resist pattern 245 is removed by a down flow type asher in which microwaves are discharged in the gaseous mixture of CF$_4$ and O$_2$.

Subsequently, the Si substrate 251 is polished or scraped to planarize the substrate. FIG. 35H illustrates how the device appears in cross section when it is planarized. The polishing and planarizing operation is carried out typically by using an apparatus as schematically illustrated in FIG. 3. The polishing slurry is an aqueous suspension prepared by dispersing SiO$_2$ particles having a diameter of 80 nm in water. The suspension contains SiO$_2$ particles by 20 wt % and its hydrogen ion concentration is constantly maintained to pH12.0 by appropriately adding sodium hydroxide whenever necessary.

In an experiment conducted on a sample device, it was proved that the surface of the Si substrate 251 had been completely planarized as illustrated in FIG. 35H after a prescribed polishing operation. It was also proved that the SiO$_2$ film 202 underlying the carbon layer 244 had not been polished at any spots on the 6-inch wafer and was completely covered by the carbon film 244. The carbon film was found at least partly remaining on the SiO$_2$ film 202 when the operation of polishing the Si substrate 23 was over.

Thereafter, the carbon film 244 was removed in a barrel type O$_2$ plasma asher to complete the silicon thinning operation and produce a thin semiconductor device.

The fact that the above described mode of carrying out the method of the invention comprises a step of forming a carbon film 244 on the Si substrate 251 and the SiO$_2$ film 202 as a stopper layer prior to the start of polishing operation makes it possible to provide a large polishing rate for the Si substrate 251 which is the target to be polished, and the carbon film 244 functioning as a stopper layer, so that the operation of polishing these films may be terminated when the carbon film 244 is still partly remaining in position. Thus, the silicon thinning operation in the process of manufacturing thin film semiconductor devices can be carried out with an enhance level of precision.

Table 7 below shows the rates of polishing target films or to-be-polished layers when different polishing slurries are used.

TABLE 7

| Polishing slurry | SiO$_2$ film (heat-oxidized) | SiN film | carbon film |
|---|---|---|---|
| Aqueous suspension containing SiO$_2$-80 nm dia. 20 wt % NaOH-0.2 wt % | 1,600 | 500 | 50 or less |

TABLE 7-continued

| Polishing slurry | SiO$_2$ film (heat-oxidized) | SiN film | carbon film |
|---|---|---|---|
| Aqueous suspension containing SiO$_2$-80 nm dia. 20 wt % | 750 | 450 | 50 or less |
| Aqueous suspension containing CeO$_2$-100 nm dia. 1 wt % | 7,000 | 3,000 | 100 or less |

Å/min

While an SiO$_2$ film and an Si film are respectively used as the not-to-be polished film for the first and second modes of carrying out the method of the invention and the polishing slurry involved is an aqueous suspension prepared by dispersing SiO$_2$ particles having an average diameter of 80 nm and maintained to pHl2.0 by adding, if required, sodium hydroxide, it should be noted that the present invention is by no means limited thereto and any other materials may be used for the target film if the forget film has a sufficiently large selectivity in terms of the polishing ratio with regard to a carbon film. Additionally, the polishing slurry to be used may be of any other type that contains particles of other appropriate materials and shows an appropriate pH level other than 12.0. For instance, a CeO$_2$ suspension may be appropriately used for the polishing slurry.

As described above in detail, the fact that the method of polishing a semiconductor device according to the invention comprises a step of forming as a stopper layer a carbon film which is resistive against polishing prior to the start of polishing operation makes it possible to provide a large selectivity in terms of the polishing rate for the target film to be polished and the stopper layer, so that the polishing operation may be held under accurate control. Additionally, since a carbon film is resistive against various chemicals, it can be used practically regardless of the type of polishing slurry involved.

Thus, with the method of the present invention, the operation of polishing a semiconductor device can be carried out under strict control with a large selectivity in terms of the polishing rate for the target film to be polished and a stopper layer by forming a carbon film as the stopper layer on at least part of the layer underlying the target film, the inside of the target, the layer on the target film of the areas adjacent to the target. Therefore, with such an arrangement, chemical instability and other known obstacles in manufacturing semiconductor devices will be effectively eliminated.

Now, a preferable embodiment of polishing apparatus according to the invention will be described by referring to FIG. 35 along with a mode of carrying out the method of the invention suited for use with the embodiment.

FIG. 35 is a schematic illustration of the embodiment of polishing apparatus.

A polishing cloth 504 is bonded to the top surface of turntable 502 and a polishing slurry is fed to the center of the polishing cloth 504 by way of a polishing slurry feed pipe 503.

The polishing slurry is an aqueous suspension containing dispersed cerium oxide particles by 1 wt %.

Wafer 201 to be polished has a diameter of 15 mm and is held by a holding device 501. The wafer 201 carries on the surface a 1 μm thick SiO$_2$ film (not shown) formed by chemical vapor deposition (CVD).

The turntable 502 is driven to rotate by an electric motor 511, to which an ampere-meter 513 is connected to measure the current flowing through the motor 511. The electric current measured by the ampere-meter 513 is transformed into the amount of work in an arithmetic unit 541, which generates a signal that terminates the polishing operation when the accumulated amount of work has reached a given value.

Figure 18:
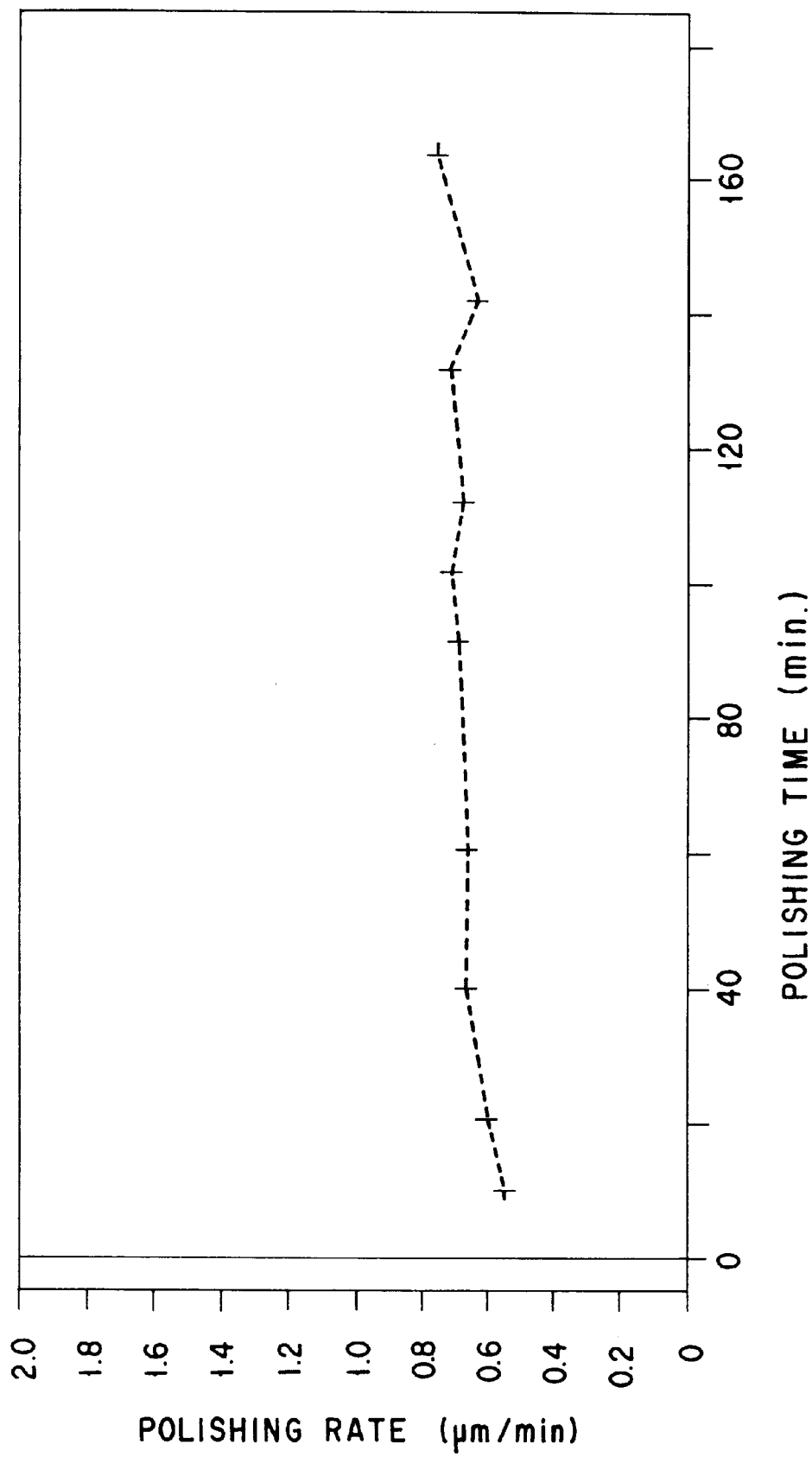
FIG. 18 shows characteristic curves between polishing time and polishing rate.

FIG. 36 is a graph showing a relationship between the change in the rate of polishing a wafer with polishing time and a relationship between the electric current flowing through the motor with polishing time, and FIG. 18 is a graph showing only a characteristic cause between the polishing rate with the polishing time.

As shown in FIG. 36, the rate of polishing a wafer generally tends to increase with time but also shows ups and downs such that a change up to 30% is observed in the polishing rate. It is seen that the electric current flowing through the electric motor changes as a function of the polishing rate.

Figure 37:
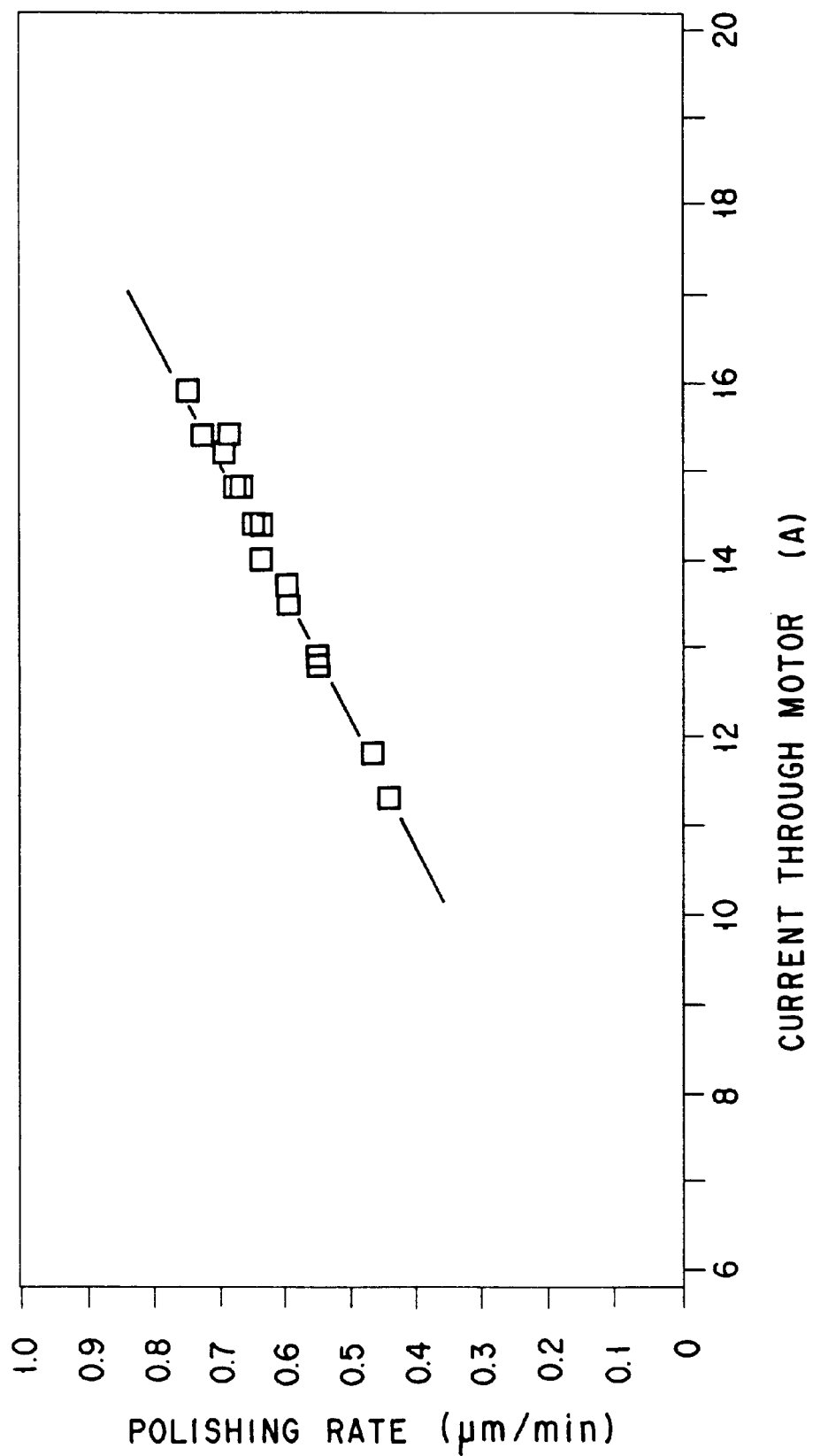
FIG. 37 shows a characteristic curve between current through motor and polishing rate.

FIG. 37 is a graph showing the relationship between the electric current flowing through the electric motor and the rate at which the wafer is polished.

From FIG. 37, it is clear that the electric current flowing through the electric motor is directly proportional to the rate of polishing the wafer. Thus, the polishing rate at any moment can be determined by reading the electric current flowing through the electric motor and the amount of polishing work done by that moment can be obtained by integrating the polishing rate with time.

FIG. 38 is a graph obtained by transforming the current flowing through the electric motor into the friction between the target layer to be polished and the surface plate carrying the polishing slurry.

As FIG. 38 clearly shows, the friction between the target layer to be polished and the surface plate carrying the polishing slurry is proportional to the rate of polishing the target layer.

FIG. 39 is A graph showing the relationship between the rate of polishing the target layer and the rate of rotation of the turntable 502 and the holding device 501.

From FIG. 39, it is clear that the rate of polishing the target layer is proportional to the rate of rotation of the turntable 502 and the holding device 501.

As may be easily anticipated, it has been proved in an experiment conducted by the inventors of the present invention that the extent to which the target layer is polished is proportional to the time consumed for the polishing operation.

Then, it can be said that the amount of work that has been performed between the target layer and the surface plate carrying the polishing slurry is proportional to the amount to which the target layer has been polished, which can be obtained by integrating the rate of polishing the target layer with time the amount of work can be obtained by multiplaying the value of friction of FIG. 38 by the relative rotation speed of the turntable 502 and the holding device 501 and integrating the product with time.

As a matter of fact, in an experiment where the amount of work to be performed between the target layer which was a 0.60 μm thick SiO$_2$ film and the turntable carrying the polishing slurry was set to 45,000 J and a total of 120 wafers were polished, the wafers were polished to an amount between 0.59 μm and 0.62 μm, showing a dispersion less than 5%.

In another experiment where SiO$_2$ films containing fluorine and those containing boron and phosphor were polished, a result similar to the above experiment was obtained. What was remarkable with this experiment was that the $SiO_2$ films containing boron and phosphor showed a polishing rate higher than that of the above experiment by about 30%.

In the above experiments, the extent to which the $SiO_2$ film was polished could be accurately controlled by calculating the amount of work to be performed between the target layer, or the $SiO_2$ film, and the surface plate carrying the polishing slurry which was cerium oxide and terminating the polishing operation when the amount of work that has been done became equal to a pre-determined value.

While the target film was an $SiO_2$ film and the polishing slurry was cerium oxide in the above experiments, they may be replaced by any other appropriate film and polishing slurry respectively.

Additionally, a polishing apparatus having a configuration other than the one illustrated in FIG. 35 may be used.

While a proportional relationship was observed between the work performed by an $SiO_2$ film that constitutes the target layer and the surface plate carrying a polishing slurry of cerium oxide and the rate of polishing the target layer in the above experiments, such a directly proportional relationship is not necessarily be required to calculate the amount of the performed work during a polishing operation so long as the friction between the target layer and the surface plate carrying a polishing slurry holds a one-to-one correspondence to the rate of polishing the target layer.

As described above, if the friction between the target layer and the surface plate carrying a polishing slurry is not proportional to the rate of polishing the target layer, the rate of polishing the target layer can be determined by reading the friction or the electric current flowing through the motor so long as a one-to-one correspondence is observed between the friction between the target layer and the surface plate carrying a polishing slurry or the electric current flowing through the electric motor and the rate of polishing the target layer.

Thus, according to a polishing apparatus for planarizing and polishing a target layer formed on a semiconductor substrate according to the invention, the extent to which the target layer is polished can be accurately controlled on the basis of the amount of the polishing work that has been done determined by measuring the friction between the target layer and the surface table carrying the polishing slurry during the polishing operation, calculating the rate of polishing the target layer from the measured friction and integrating the polishing rate with time.

Now, another embodiment of polishing apparatus according to the invention will be described by referring to FIGS. 40 through 43.

Figure 40:
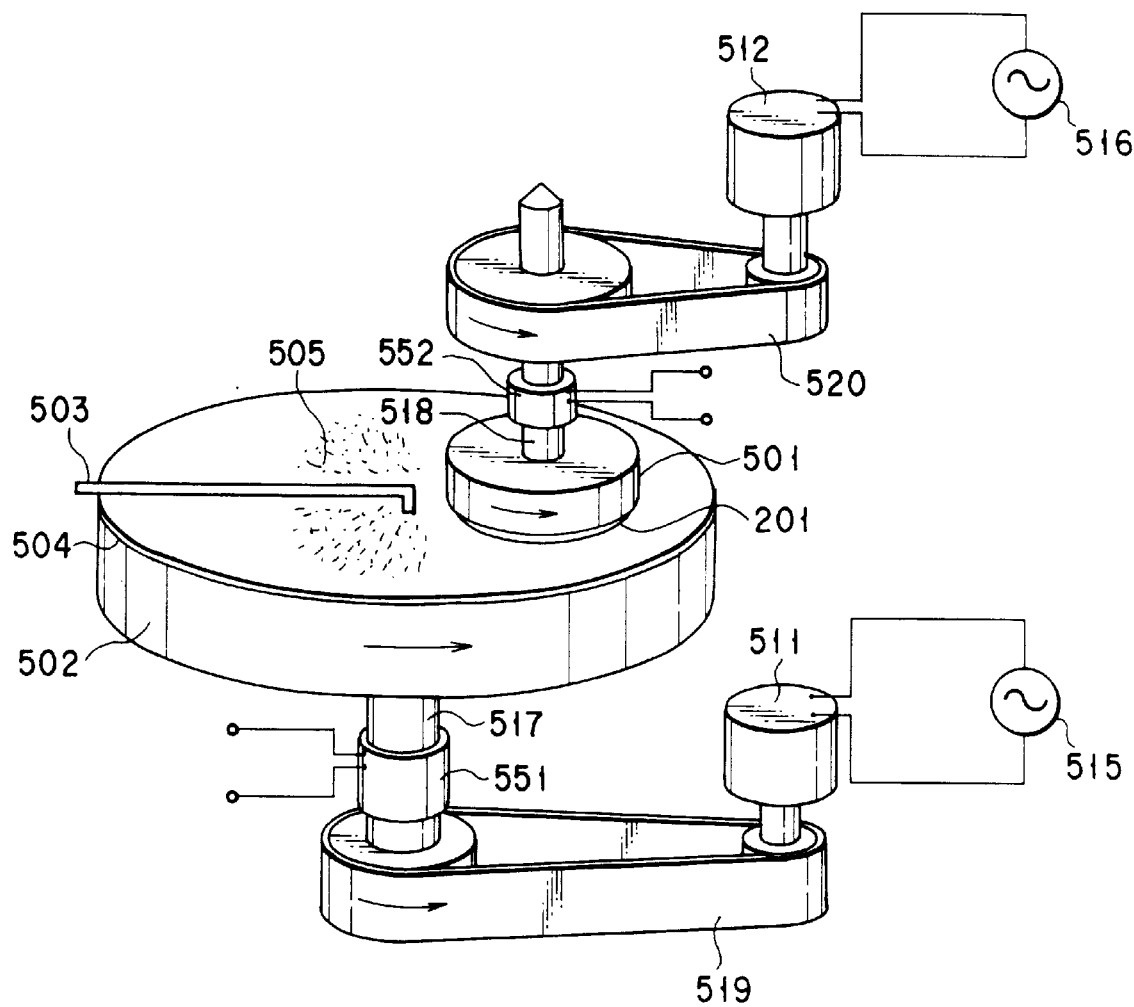
FIG. 40 shows a perspective view of a polishing apparatus of an embodiment according to the present invention.
Figure 41:
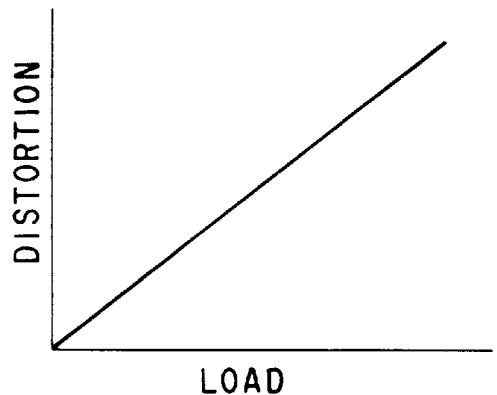
FIG. 41 shows a characteristic curve between load and distortion.

FIG. 40 is a schematic perspective view of the embodiment of polishing apparatus of the invention comprising a turntable 502 provided with a polishing cloth or a polishing plane 504 on the top thereof, which polishes a semiconductor device 201 disposed thereon, using a polishing slurry 505. The shafts 517 and 518 for rotating the turntable 502 and the wafer holding device 501 are equipped with distortion sensors 551 and 552, or distortion gauges, respectively, for detecting the distortions of the shafts for which the shafts are responsible. The shafts 517 and 518 are also connected to respective drive motors 511 and 512 by way of respective belts 519 and 520. The drive forces generated by the drive motors 522 and 512 give rise to friction between the polishing plane 504 and the wafer 201. The friction generates distortion in each of the shafts 517 and 518, which is detected and converted into an electric signal by the related distortion sensor. As shown in the graph of FIG. 41, the relationship between the load of the polishing operation and the distortion of the shaft or the electric signal representing the distortion is linearly expressed. In other words, the electric signal transformed from the distortion sensor accurately shows the condition of the polishing plane 504 and that of the surface of the wafer 201.

Thus, as shown in FIG. 42, when the undulations or unevenness on the surface of a wafer comprising an insulating film 212 and a wiring layer 210 formed on a semiconductor substrate 201 is planarized by the above embodiment, it accurately detects the size of the surface area of the insulating film 212 to be polished and also shows the instant when the surface of the insulating film 14 being polished has been almost completely planarized.

The above described embodiment may be so modified that only a single distortion sensor is disposed on the side of either the turntable 502 or the wafer holding device 501. The layer to be polished does not necessarily need to be an insulating film and may be a wiring layer.

The above described embodiment has advantages as listed below by simply providing the shafts 551 and 552 for rotating the turntable 502 and the wafer holding device 501 of the embodiment with respective distortion sensors.

1) The target layer can be completely planarized with an enhanced level of precision that any conventional polishing apparatuses can never achieve.

2) Since the fact that the insulating film has been completely planarized is instantly detected by the apparatus, the polishing operation can be terminated before the underlying wiring layer is affected so that the reliability of the wiring layer is always guaranteed.

3) From the same reason as 2) above, the wiring layer is protected against breaking accidents to enhance the yield of manufacturing semiconductor devices.

4) Provision of a hard layer under the target layer to stop the polishing operation is not required so that the process of manufacturing semiconductor devices by using an apparatus according to the invention can eliminate any additional steps to raise the productivity and lower the cost of manufacturing. The fact that no hard stopper layer is required also entails an advantage that no additional insulating layer needs to be formed after the completion of the planarizing operation.

A still another embodiment of polishing apparatus of the invention will be described by referring to FIGS. 44 and 45.

FIG. 44 schematically illustrates the polishing section of the embodiment of polishing apparatus. It comprises a turntable 502 which is rotated by a first drive motor (not shown). A polishing unwoven cloth 504 is attached on the turntable 502 and a polishing slurry feeding nozzle (not shown) is disposed on the polishing cloth. A wafer holding device 501 is disposed above the polishing cloth and a sample wafer 601 on which friction is measured is held on the lower surface of the holding device 501. The lower surface of the holding device 501 faces the top surface of the turntable 502. The lower end of rotary shaft 518 is fitted to the top surface of said holding device 501 so that the holding device 501 may be rotated by a second drive motor (not shown) that transmits the rotation force to the holding device 501 by way of the rotation shaft 518. The rotation motion of the turntable 502 and that of the holding device 501 are controlled by a controller 611 by way of the first and second motors respectively. As illustrated in FIG. 45, the controller 611 performs setting polishing conditions, calculating a F/Fo (as defined hereinafter) and re-setting a polishing condition.

Firstly, an object which is polished and on which friction is provisionally measured, typically a semiconductor sample wafer 601, is fitted to the lower surface of the holding device 501. The wafer 601 comprises a silicon substrate and a silicon oxide film formed on the surface of the silicon substrate. The silicon oxide film has not been subjected to a patterning operation and has a sufficiently large thickness. Then, the turntable 502 is rotated by the first drive motor while the holding device 501 is rotated by the second drive motor at a first rate of rotation, which is defined as the relative rate of rotation of the polishing unwoven cloth rotating with the turntable 502 relative to the wafer 601 on which friction is measured.

Thereafter, a polishing slurry 505 such as an aqueous suspension of cerium oxide is fed onto the polishing unwoven cloth via the polishing slurry feeding nozzle. The polishing unwoven cloth can retain the aqueous suspension of cerium oxide 15 to a large extent and smoothly discharge it. Then, as the holding device 501 by a movement control section (not shown), the sample wafer 601 on which friction is provisionally measured is brought to contact with the polishing unwoven cloth disposed on the turntable 502. At this stage, the wafer 601 on which friction is provisionally measured is subjected to a first load. Thereafter, the holding device 501 is horizontally moved along the top surface of the turntable 502 to polish the wafer 601 on which friction is measured for a first polishing period. In short, the wafer 601 on which friction is provisionally measured is polished under a first set of polishing conditions of the first load, the first polishing period and the first rate of rotation.

As the polishing operation goes on, the electric current flowing through the first and second drive motors are measured by the polishing condition setting section of the controller 611. The measurement of the current is in fact carried out in the working stage, which is defined as a stage where the polishing unwoven cloth has already left the initial stage, in which the polishing unwoven cloth might become quickly choked with the polishing slurry to rapidly raise the friction between the polishing unwoven cloth and the target of the polishing operation, and entered into a stabilized state, showing little changes in the friction between the polishing unwoven cloth and the target.

Then, there is a given relationship between the electric current and the friction Of between the polishing unwoven cloth and the sample wafer 601 or the target of polishing and therefore the friction Of can be determined by carrying out a given set of arithmetic operations. Then, there is another given relationship between the friction Of and the rate at which the sample wafer 601 is polished and therefore the polishing rate can be determined by carrying out another given set of arithmetic operations. In other words, since there is a relationship as shown in FIG. 46 between the electric current and the polishing rate, the polishing rate can be determined from the electric current.

FIG. 46 is a graph showing, as described above, the relationship between the electric current of the drive motor and the polishing rate. A wafer 601 comprising a silicon oxide film formed on the surface is set in position on the embodiment and polished in a manner as described above. Then, the electric current flowing through the first and second drive motors and the rate of polishing the wafer for this current are determined. FIG. 46 denotes the characteristic curve representing the relationship between the electric current and the rate at which the wafer is polished. The graph shows that the relationship between the current and the polishing rate is a one-to-one correspondence.

Subsequently, the rotation of the turntable 502 and holding device 501 are stopped and the sample wafer 601 on which friction has been provisionally measured and which has been held by the holding device 501 is replaced by a wafer 602 for producing a semiconductor device. Then, a second set of polishing conditions including a second load, a second polishing period and a second rate of rotation under which the silicon oxide film of the wafer 602 is polished are established from the polishing rate. Thereafter, the turntable 502 and the holding device 501 are driven to rotate by the first and second drive motors at the second rate of rotation to apply the second load to the wafer 602, which is polished for the second polishing period.

After the operation of polishing the wafer 602 is completed, it is replaced by another wafer 601 for producing a semiconductor device, which is polished under the same second set of polishing conditions. When the polishing unwoven cloth has been used for a given period of time to polish a plurality of identical wafers 602 for producing semiconductor devices under the second set of polishing conditions, turntable 502 and the holding device 501 are stopped to rotate. At this stage, the last wafer 602 polished by the embodiment is replaced back to the wafer 601 on which friction is provisionally measured. Then, the turntable 502 and the holding device 501 are rotated respectively by the first and second drive motors at the first rate of rotation and the first load is applied to the wafer 601 on which friction is measured, which is then polished for the first polishing period.

Figure 45:
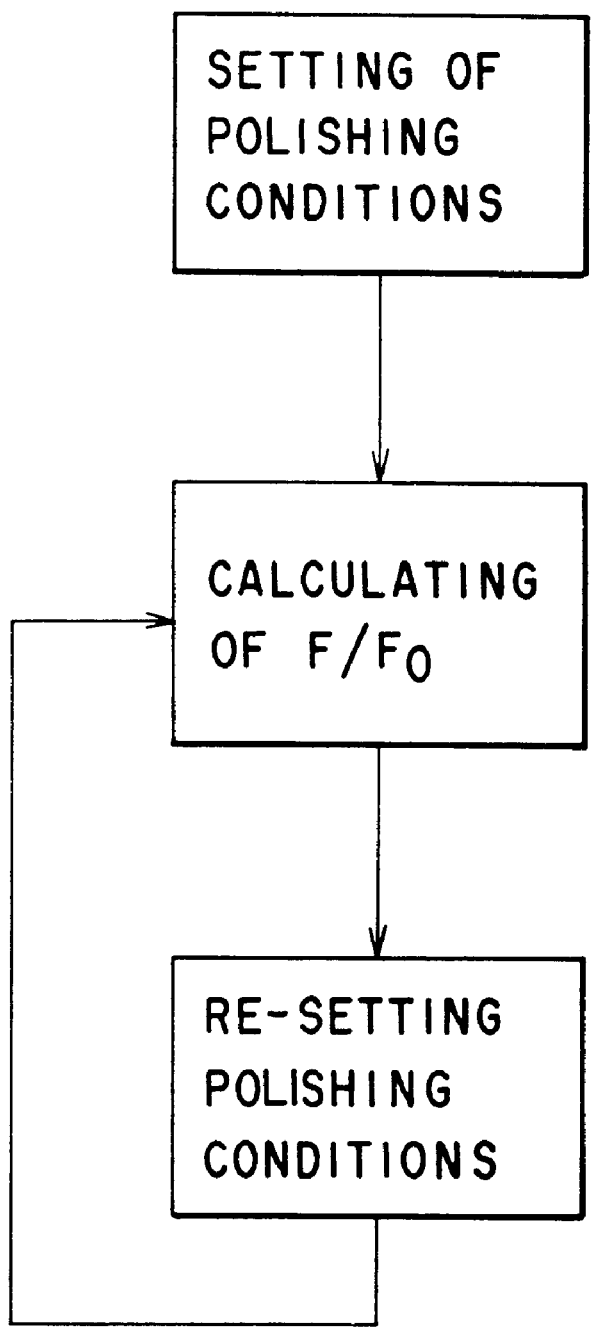
FIG. 45 shows a flow chart performed in the controller of the polishing apparatus as shown in FIG. 44.

While the wafer 601 on which friction is measured is being polished, the electric current flowing through the first and second drive motors is measured by the F/Fo calculating arithmetic flow of FIG. 45, which then calculates the friction F between the wafer 601 on which friction is measured and the polishing unwoven cloth and determines the value of F/Fo.

When the value of F/Fo is greater than 0.9 and smaller than 1.1, the polishing condition re-setting or reestablishing section of the controller 611 as shown in FIG. 45 calculates a third set of polishing conditions including a third load, a third polishing period and a third rate of rotation from the value of F/Fo in order to regain the polishing rate under the second set of polishing conditions so that wafers may be polished to a same extent regardless of the changes in the polishing conditions. Then, the turntable 502 and holding device 501 stop to rotate and the wafer 601 on which friction was provisionally measured is replaced by a wafer 602 for producing a semiconductor device. Now, the polishing apparatus is operated under the third set of polishing conditions. That is, the turntable 502 and the holding device 501 are rotated respectively by the first and second drive motors at the third rate of rotation and the third load is applied to the wafer 602 for producing a semiconductor device, which is polished for the third polishing period.

When the value of F/Fo is smaller than 0.9 or greater than 1.1, the degraded polishing cloth is redressed by seasoning, cleansing and/or other appropriate measures, in which the polishing unwoven cloth may be brushed to remove the polishing slurry 505 remaining thereat to choke the polishing cloth. The polishing unwoven cloth can be restored to a good condition by redressing. Thereafter, the wafer 601 on which friction is measured is polished under the first set of polishing conditions and the F/Fo calculating arithmetic unit in FIG. 45 calculates the value of F/Fo once again.

If F/Fo is found to be either smaller than 0.9 or greater than 1.1, then the polishing unwoven cloth is subjected to another redressing operation. If, on the other hand, F/Fo is between 0.9 and 1.1, a third set of polishing conditions are reestablished from the value of F/Fo above in the polishing condition reestablishing section of FIG. 45 in order to regain the polishing rate under the second set of polishing conditions so that the extent to which the wafer 601 is polished is kept constant. Then, the turntable 502 and the holding device 501 stop to rotate and the wafer 601 on which friction was measured is replaced by a wafer 602 for producing a semiconductor device, which is then polished under the third set of polishing conditions.

After the operation of polishing the wafer 602 is completed, it is replaced by another wafer 601 for producing a semiconductor device, which is polished under the same second set of polishing conditions. When the polishing unwoven cloth has been used for a given period of time to polish a plurality of identical wafers 602 for producing semiconductor devices under the second set of polishing conditions, the turntable 502 and the holding device 501 stop to rotate. At this stage, the last wafer 602 polished by the embodiment is replaced back to the wafer 601 on which friction is provisionally measured. Then, the wafer 601 on which friction is measured is polished under the first set of polishing conditions.

While the wafer 601 on which friction is measured is being polished, the electric current flowing through the first and second drive motors is measured by the F/Fo calculating arithmetic unit of FIG. 45, which then determines if the polishing unwoven cloth has been degraded and requires a redressing operation or the polishing operation can be carried on under a new set of polishing conditions.

Thereafter, the above described procedures are repeated. If F/Fo is found to be less than 0.9 or greater than 1.1 after the degraded polishing unwoven cloth has been redressed, it is determined that the polishing unwoven cloth has gone out of its service life and therefore should be replaced.

Figure 47:
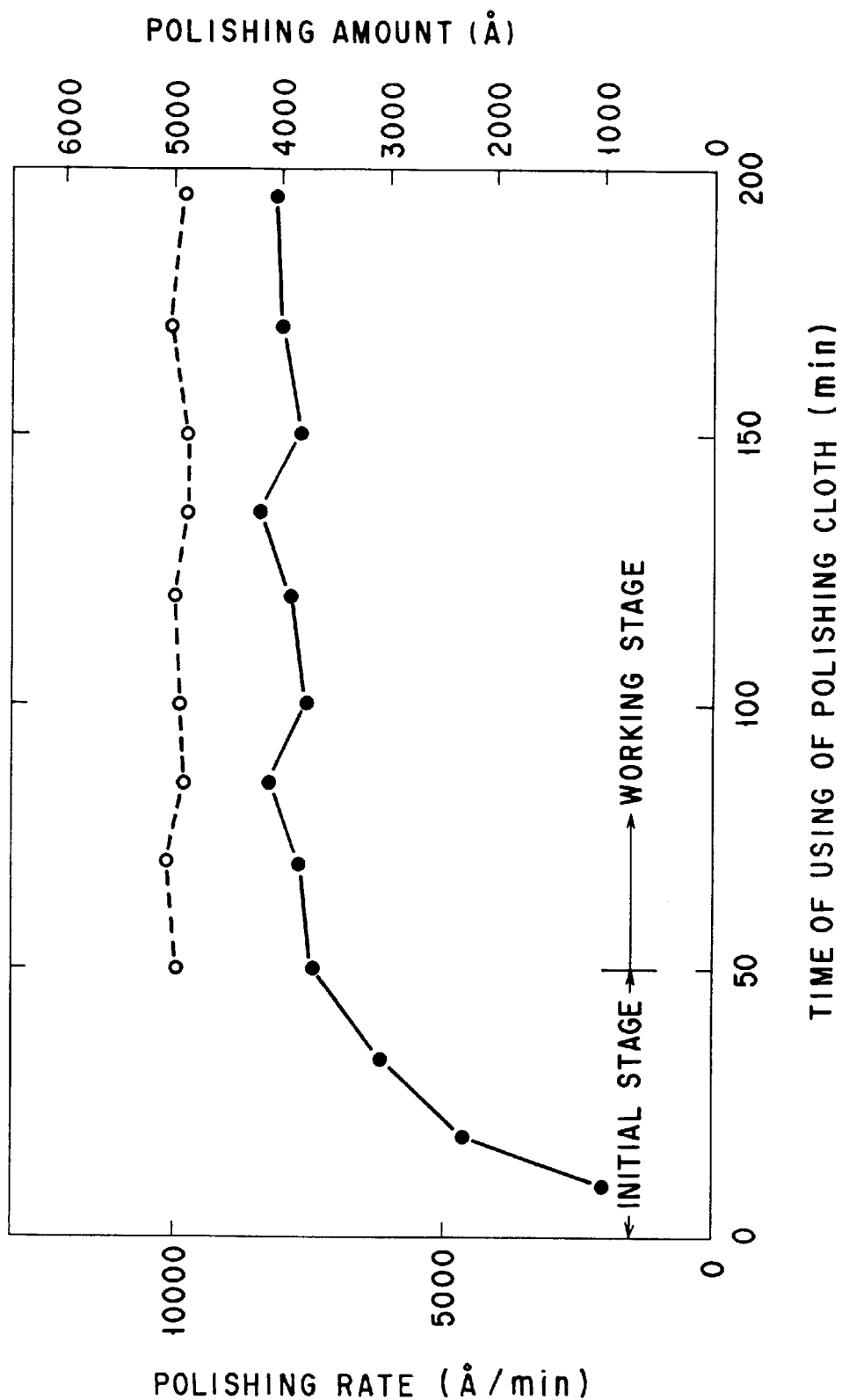
FIG. 47 shows a characteristic curve between time of using of polishing cloth and polishing rate, and a characteristic curve between time of using of polishing cloth and polishing amount.

FIG. 47 is a graph showing the relationship between the accumulated service time of the polishing unwoven cloth and the polishing rate and the extent to which the wafer is polished obtained by monitoring the friction between the wafer 601 on which friction is measured and the polishing unwoven cloth as a function of the electric current flowing through the first and second drive motors. In other words, the current flowing through the drive motors is measured against the accumulated service time of the polishing unwoven cloth, the friction between the wafer 601 on which friction is measured and the polishing unwoven cloth is determined from the measured current and the rate of polishing the wafer 601 is calculated from the friction. In the graph of FIG. 47, the solid line curve represents the relationship between the accumulated service time of the polishing unwoven cloth and the polishing rate, whereas the broken line curve represents the relationship between the accumulated service time of the polishing unwoven cloth and the extent to which the wafer is polished. The first 50 minutes of the accumulated service time is defined as the initial stage in the use of the polishing unwoven cloth, whereas all the remaining period after the first 50 minutes is defined as the working stage of the polishing unwoven cloth.

Figure 48:
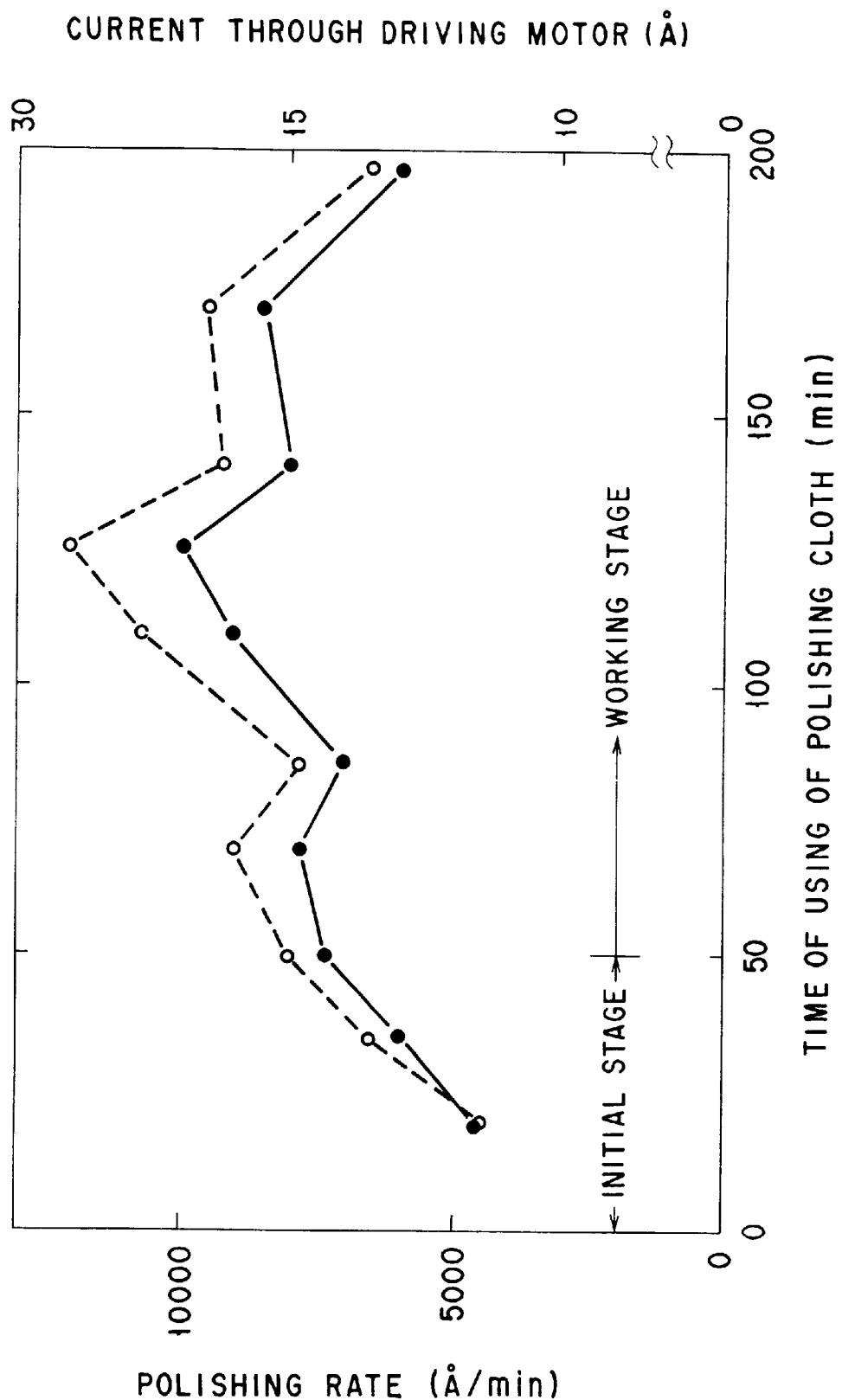
FIG. 48 shows a characteristic curve between time of using of polishing cloth and polishing rate, and a characteristic curve between time of using of polishing cloth and current through motor.

FIG. 48 is a graph showing the relationship between the accumulated service time of a polishing unwoven cloth used with a conventional polishing method and the electric current flowing through the drive motors and the polishing rate of the polishing unwoven cloth. In FIG. 48, the broken line curve represents the relationship between the accumulated service time of the polishing unwoven cloth and the current flowing through the drive motors, whereas the solid line curve denotes the relationship between the accumulated service time and the polishing rate.

From FIGS. 47 and 48 it will be appreciated that the polishing rate cannot be maintained to be constant with the conventional polishing method even when the polishing unwoven cloth is in the working stage, whereas, with the method of the present invention, it can be held to be constant once the polishing unwoven cloth enters the working stage and consequently the extent to which each wafer is polished can also be maintained to be constant.

The F/Fo calculating arithmetic unit of the control section 611 of the above embodiment periodically detects the current flowing through the first and second electric motor, carries out a set of predetermined arithmetic operations to calculate the friction between the wafer 601 on which friction is measured and the polishing unwoven cloth from the detected electric current and determines the value of Fo in F/Fo. Thus, the condition of the surface of the polishing unwoven cloth can be appreciated from the obtained value of F/Fo. When the surface condition of the polishing unwoven cloth is not favorable for polishing operation or the value of F/Fo is found to be less than 0.9 or greater than 1.1, the degraded polishing unwoven cloth is redressed by removing the polishing slurry 505 unnecessarily choking the polishing unwoven cloth by means of seasoning, cleansing and/or other appropriate measures. Then, after a while, the value of F/Fo is determined again to see the effect of redressing and a set of new operating conditions will be established to meet the new surface condition. If, on the other hand, the surface condition of the polishing unwoven cloth is favorable or the value of F/Fo is found to be between 0.9 and 1.1, a set of new operating conditions will be established directly from that value of F/Fo. Finally, if the surface condition of the polishing unwoven cloth is not improved by the redressing operation, the cloth needs to be replaced because it is so judged that its service life is over. Thus, it is always possible to exactly know the timing for redressing or replacing the polishing unwoven cloth and keep the rate of polishing the target object from the value of F/Fo. In other words, with the method of the present invention, the extent to which each semiconductor device is polished by a polishing apparatus according to the invention can always be maintained to be constant.

It should be appreciated that the polishing method of the present invention is particularly advantageous when the operation of polishing a semiconductor device needs to be terminated before the layer underlying the one being polished of the device is exposed.

It should be noted that the present invention is not limited to the above described modes of carrying out the method of the invention and embodiments. Additionally, polishing slurries and the target layers other than the above described types may be used with an apparatus and the method according to the invention by knowing the relationship between the electric current flowing through the drive motors and the polishing rate. For instance, the polishing slurry may be colloidal silica and the target layer may be a polysilicon film.

The friction between the target and the polishing unwoven cloth may be determined by means other than the current flowing through the drive motors.

While a polishing unwoven cloth is used to polish the target and held on the turntable 502 in the above embodiment, it may be replaced by any other appropriate material if it can effectively hold the polishing slurry.

While the electric current flowing through the first and second drive motors is periodically detected as a wafer 601 on which friction is measured is being polished determine the timing for redressing or replacing the degraded polishing unwoven cloth in the above embodiment, the use of such a wafer 601 is not necessarily required for the purpose of the present invention and the timing for redressing or replacing the degraded polishing unwoven cloth can be determined by constantly monitoring the current flowing through the first and second drive motors when wafers 602 for producing semiconductor devices are being sequentially polished.

Thus, the above described embodiment that detects a first level of the friction between the polishing plane and the target for polishing and then a second level of the friction after a predetermined period of time to determine the ratio of the first to second friction levels can accurately control the extent to which each target object is polished.

Finally, still another embodiment of the invention will be described by referring to FIGS. 49 through 51.

FIG. 49 shows a schematic illustration of the embodiment of polishing apparatus. A polishing cloth 504 having a polishing plane is disposed on a turntable 502 and a holding device 501 for holding a target 201 of polishing positioned opposite to the polishing plane is disposed above the polishing cloth 504. A liquid feed nozzle 503 is arranged in the vicinity of the holding device 501 and a polishing slurry 505 is fed through the liquid feed nozzle 503.

In a polishing apparatus having a configuration as described above, a target 201 of polishing, typically a semiconductor wafer carrying a silicon oxide film on the surface is held to the lower surface of the holding device 501 in such a manner that the surface to be polished is disposed opposite to the upper surface of the polishing cloth 504. Then, a polishing slurry 505, e.g. an aqueous suspension of cerium oxide is fed onto the polishing cloth 504 through the liquid feed nozzle 503. Subsequently, polishing plane is pressed against the wafer and frictionally moved on the wafer to polish and wafer.

FIG. 50 schematically illustrates how the polishing plane of the embodiment is redressed when it is degraded after a long use. When the polishing cloth 504 is used for polishing wafers for a predetermined period of time, a surface active agent 701, e.g. a polycarboxylic acid type negative ion surface active agent, fed onto the polishing cloth 504 by way of the liquid feed nozzle 503 and the polishing slurry 505 remaining on the polishing plane to choke the polishing plane is removed by rubbing the surface of the polishing cloth with a brush 702. Thereafter, pure water 704 is fed onto the polishing cloth 504 through the liquid feed nozzle 503 to wash away the surface active agent 701.

The above procedures are repeated thereafter whenever necessary.

FIG. 51 is a graph showing the change with time in the polishing rate of the embodiment. As the degraded polishing plane is redressed by a surface active agent 701 fed onto the polishing cloth 504 in addition to a conventional method of using a brush, a remarkable effect of removing the remaining polishing slurry 505 is achieved. Thus, the surface condition of the polishing plane can be held under a good condition for a prolonged period of time by removing the polishing slurry 505 remaining on the polishing cloth 504 to choke the the polishing cloth to an enhanced degree that cannot be achieved by any conventional method of cleansing a polishing cloth.

It should be noted that the method of redressing a degraded polishing cloth used for the above embodiment is subject to various modifications and/or alterations so long as it comprises means for using a surface active agent 701. In other words, the method does not limit nor restrict the use of any other means other than a surface active agent 701, leaving the use of pure water 704 for removing the surface active agent 701 as a matter of choice. The timing for redressing a degraded polishing plane is also not specifically defined. So, the degraded polishing plane may be redressed while a target of polishing is being polished on the apparatus.

The surface active agent 701 to be used for the purpose of the present invention is also not limited to polycarboxylic acid type negative ion surface active agents and the components of the surface active agent 701 including hydrophilic groups, oleophilic groups and counter ions may be selectively replaced whenever appropriate. The polishing slurry 505 and the target object 201 are also not specifically defined.

As described above, with the polishing method and a polishing apparatus according to the invention, the polishing slurry choking the polishing plane of the apparatus can be removed effectively and efficiently without posing any difficulties. Consequently, the polishing plane can be maintained under a good condition and prevented from degradation due to a choked condition caused by the polishing slurry and reduce the possibility of producing scars on the surface of the target of polishing. Thus, the quality of target objects treated by the apparatus can be strictly controlled and, at the same time, a prolonged service life can be assured for the polishing pad. Additionally, the timing for replacing a degraded polishing pad can be detected without relying on the effort of a skilled operator to constantly observe the surface condition of the polishing cloth.

What is claimed is:

1. An apparatus for chemically and mechanically planarizing a target object by a polishing plane, comprising:

holding means for holding the target object;

polishing means having the polishing plane for polishing being rotated relative to the target object held by rotation means;

driving means for driving the polishing means to rotate the polishing plane of the polishing means to cause friction between the target object held by the holding means and the polishing plane of the polishing means; and load detecting means for detecting a load resulting from friction between the target object and the polishing plane, with the load substantially corresponding to the friction between the target object and the polishing plane, said load detecting means comprising distortion detecting means for detecting distortion of a rotating shaft of the polishing means, with said distortion resulting from the friction.

2. The planarizing apparatus according to claim 1, wherein said distortion detection means comprises a distortion sensor for detecting said distortion and transforming the detected distortion to an electric signal.

3. A polishing apparatus comprising:

a table provided with a polishing plane disposed thereon;

a holder means disposed opposite to the table for holding a target object having a surface to be polished so as to keep said surface of the target object to face the polishing plane;

first means for detecting a first level of friction generated between said polishing plane and said surface of the target object when the holding means and said table are held under pressure and said polishing plane and said surface of the target object are slidingly moved relative to each other to polish said target object and a second level of friction between said polishing plane and said surface after a period of time;

an arithmetic unit for calculating the ratio of said first to second friction levels; and second means for determining the timing for carrying out an operation of redressing the degraded polishing plane from said ratio.

4. A polishing apparatus comprising:

a table provided with a polishing plane disposed thereon;

a holder means disposed opposite to the table for holding a target object having a surface to be polished so as to keep said surface of the target object to face the polishing plane;

first means for detecting a first level of friction generated between said polishing plane and said surface of the target object when the holding means and said table are held under pressure and said polishing plane and said surface of the target object are slidingly moved relative to each other to polish said target object and a second level of friction between said polishing plane and said surface after a period of time;

an arithmetic unit for calculating the ratio of said first to second friction levels; and second means for determining the timing for replacing said polishing plane with a new one from said ratio.

5. A polishing apparatus comprising:

a table provided with a polishing plane disposed thereon;

a holder means disposed opposite to the table for holding a target object having a surface to be polished so as to keep said surface of the target object to face the polishing plane;

first means for detecting a first level of friction generated between said polishing plane and said surface of the target object when the holding section and said table are held under pressure and said polishing plane and said surface of the target object are slidingly moved relative to each other to polish said target object and a second level of friction between said polishing plane and said surface after a period of time;

an arithmetic unit for calculating the ratio of said first to second friction levels;

second means for determining the timing for carrying out an operation of redressing the degraded polishing plane from said ratio; and third means for determining the timing for replacing said polishing plane with a new one from said ratio.

6. A polishing apparatus comprising a surface plate provided with a polishing plane disposed thereon;

holder means for holding a target object having a surface to be polished so as to keep said surface of the target object to face the polishing plane;

driving means for driving the surface plate to slidingly move the polishing plane and the surface to be polished of the target object held by the holding means relative to each other to polish the surface of the target object;

slurry supplying means for supplying a polishing slurry onto the polishing plane, while the surface of the target object is polished; and surface active agent supplying means for supplying, only after the polishing of the surface of the target object is ended, a surface active agent to the polishing plane to redress the polishing plane; and means for operating said surface active agent supplying means only after the polishing of the surface of the target object is ended.

7. A polishing apparatus for a semiconductor device comprising the steps of:

means for detecting the friction between (a target layer) and a surface plate carrying a polishing slurry thereon during the polishing operation;

means for calculating the rate of polishing the target layer from the friction;

means for determining the extent to which the target layer has been polished by integrating the polishing rate with time; and means for terminating the polishing operation when the extent to which the target layer has been polished reaches a given value as well as means for detecting said friction to determine the extent to which the target layer has been polished.

8. A polishing apparatus for a semiconductor device comprising the steps of:

means for calculating the accumulated amount of the work performed between (a target layer) and a surface plate carrying a polishing slurry thereon during the polishing operation; and means for terminating the polishing operation when the accumulated amount of work reaches a given value as well as means for detecting the amount of the work performed per unit time and accumulating the work amount with time.

9. A polishing apparatus for a semiconductor device according to claim 7, wherein said friction is determined by detecting the amount of work performed by a drive motor for driving said surface plate.

10. A polishing apparatus for a semiconductor device according to claim 8, wherein said the amount of the work performed per unit time is determined by detecting the amount of work performed by a drive motor for driving said surface plate.

11. A polishing apparatus for a semiconductor device according to claim 10, wherein said drive motor is an electric motor and the amount of the work performed by the drive motor is determined by detecting the electric current flowing through the electric motor.

12. A polishing apparatus according to claim 6, further comprising an activating means for activating the surface active agent fed to the polishing plane to remove the polishing slurry remaining on the polishing plane therefrom.

13. A polishing apparatus according to claim 12, wherein the activating means comprises brushing means.

14. A polishing apparatus according to claim 12, further comprising water supplying means for supplying water, after the polishing slurry remaining on the polishing plane is removed therefrom, onto the polishing plane to wash away the removed polishing slurry.

15. An apparatus for chemically and mechanically planarizing a target object by a polishing plane, comprising:

holding means for holding the target object;

polishing means having the polishing plane for polishing being rotated relative to the target object held by rotation means;

driving means for driving the polishing means to rotate the polishing plane of the polishing means to cause friction between the target object held by the holding means and the polishing plane of the polishing means; and load detecting means for detecting a load resulting from friction between the target object and the polishing plane, with the load substantially corresponding to the friction between the target object and the polishing plane, said load detecting means comprising a drive current detecting means for detecting a drive current flowing through said driving means for driving the polishing means, the load detecting means comprising a distortion detecting means for detecting distortion of a rotation mechanism of said driving means, with said distortion resulting from the friction.

16. The planarizing apparatus according to claim 15, wherein said distortion detecting means detects the distortion of a rotation shaft of the rotation mechanism, and said distortion detecting means detects the distortion of the rotation shaft of the rotation mechanism.

17. The planarizing apparatus according to claim 16, wherein said distortion detecting means comprises a distortion sensor provided on the rotation shaft of the rotation mechanism.

\* \* \* \* \*

UNITED STATES PATENT AND TRADEMARK OFFICE
CERTIFICATE OF CORRECTION

PATENT NO.    : 5,948,205
DATED         : September 7, 1999
INVENTOR(S)   : Masako KODERA et al.

It is certified that error appears in the above-identified patent and that said Letters Patent is hereby corrected as shown below:

Title page, Item [30], "May 26, 1993" should read --May 26, 1992--.

Claim 2, Col. 42, line 49, "distortion detection" should read --distortion detecting--.

Claim 7, Col. 43, line 65, "(a target layer)" should read --a target layer--.

Claim 8, Col. 44, line 15, "(a target layer)" should read --a target layer--.

Signed and Sealed this

Ninth Day of May, 2000

*Attest:*

Q. TODD DICKINSON

*Attesting Officer*       *Director of Patents and Trademarks*